United States Patent
Qian et al.

(12) 
(10) Patent No.: US 6,697,766 B2
(45) Date of Patent: Feb. 24, 2004

(54) SYSTEM AND METHOD FOR DETECTING AND CHARACTERIZING GAUSSIAN PULSES

(75) Inventors: Shie Qian, Austin, TX (US); Nanxiong Zhang, Shanghai (CN)

(73) Assignee: National Instruments Corporation, Austin, TX (US)

( * ) Notice: Subject to any disclaimer, the term of this patent is extended or adjusted under 35 U.S.C. 154(b) by 669 days.

(21) Appl. No.: 09/832,508

(22) Filed: Apr. 10, 2001

(65) Prior Publication Data

US 2002/0171409 A1 Nov. 21, 2002

(51) Int. Cl.[7] .............................................. G06F 19/00
(52) U.S. Cl. ......................... 702/189; 324/534; 702/74
(58) Field of Search ........................ 356/73.1; 324/532, 324/533, 534, 535; 702/189, 64, 65, 57, 60, 73, 74, 76, 77, 78, 79; 708/710

(56) References Cited

U.S. PATENT DOCUMENTS

| | | | |
|---|---|---|---|
| 5,343,405 A | * | 8/1994 | Kucera et al. ................. 702/73 |
| 5,532,944 A | * | 7/1996 | Battista .......................... 708/3 |
| 5,751,149 A | | 5/1998 | Oberg et al. |
| 6,263,290 B1 | * | 7/2001 | Williams et al. ............... 702/71 |
| 6,507,796 B2 | * | 1/2003 | Alexander .................... 702/70 |
| 2002/0180954 A1 | * | 12/2002 | Qian et al. .................. 356/73.1 |

OTHER PUBLICATIONS

Agilent Technologies application Note 1304–2: Time domain Reflectometry Theory, dated Nov. 2000, 17 pages.
Shie Qian and Dapang Chen, Joint Time–Frequency Analysis Methods and Applications, Chapter 8, 1996, pp. 181–198.

* cited by examiner

*Primary Examiner*—Patrick Assouad
(74) *Attorney, Agent, or Firm*—Meyertons Hood Kivlin Kowert & Goetzel, P.C.; Jeffrey C. Hood

(57) ABSTRACT

System and method for characterizing a Gaussian pulse in a signal. The system includes a computer operable to receive the signal, determine a set of estimated parameters for the Gaussian pulse using a "zoom-in" approach, permute the estimated parameter set to generate one or more permuted parameter sets, where the estimated and permuted parameter sets each represent a corresponding waveform, generate closed form inner products between the received signal and each waveform, generate linear equations from the inner products, each linear equation being a function of a respective one of the parameter sets and corresponding parameter variables for the Gaussian pulse, and determine values for the parameter variables by solving the linear equations. The determined parameters characterize the Gaussian pulse. If there are N parameters to determine and M permutations generated, where M is greater than or equal to N, M+1 linear equations are solved to overdetermine the N parameters.

48 Claims, 61 Drawing Sheets

Original Signal 506B

Estimated Signal 508B

Figure 33

SYSTEM AND METHOD FOR DETECTING AND CHARACTERIZING GAUSSIAN PULSES

FIELD OF THE INVENTION

The present invention relates generally to the field of digital signal processing, and more particularly to the detection and characterization of Gaussian pulses.

DESCRIPTION OF THE RELATED ART

In the field of digital signal processing there is often a need to detect a signal pulse in a transmission medium, such as an electrical cable or optical fiber, or an electronic or optical device. For example, in electronic or optical systems, when a signal encounters a change in impedance in the transmission medium, a partial reflectance of the signal occurs, decreasing the amplitude of the propagated signal. These impedance changes can substantially degrade the performance of a device or transmission medium, and so a great deal of effort has been spent detecting and analyzing such interconnect discontinuities.

One technique which has been used to great effect in this area is Time Domain Reflectometry (TDR). TDR involves measuring reflection in an unknown device or medium in comparison to reflection due to a standard impedance. In other words, TDR compares reflected energy to incident energy on a single-line transmission system. Known incident stimulus is applied to the standard impedance and intentionally propagated toward the unknown device or medium. Reflections from the unknown device or medium then propagate back to the source, and amplitude and time of the reflected signal(s) is compared to the incident stimulus. The reflected signal magnitude (and possibly the waveform) is a function of the incident signal magnitude and the nature of the impedance change. The time elapsed between the detection of the incident and the reflected signal is a function of the overall distance traveled and the velocity of propagation of the signal. Thus, by detecting and timing the reflected pulse with respect to the original pulse, the distance to an interconnect discontinuity may be determined. In this way, for example, a flaw, such as a kink, may be located precisely in the device or medium.

Fast sampling systems with TDR capability can be very useful for studying interconnect discontinuities. In a typical TDR system, a step generator, such as a switched current source, is used to generate a step pulse, which is propagated through a T-connector to a digitizer and the device under test (DUT) respectively. The reflected signal (from the DUT) is received by the digitizer and the superpositioned waveforms analyzed to determine the elapsed time, and to compare amplitude and waveform of the pulses.

However, there are a number of drawbacks to this approach. The use of a step function or signal is problematic because the steep rise of the leading edge of the step entails many high frequency signal components. In other words, the step signal is a wide bandwidth pulse. Transmission media and electronic and optical components behave differently for different frequencies, leading to such distorting effects as dispersion and dissipation of the pulse energy. The effect of dispersion is particularly troublesome for step pulses in TDR applications because the leading edge of the step is used to determine the timing of the pulse. The dispersion of high frequency components in the edge can smooth the edge to such a degree that precise timing of the reflected pulse may be difficult or even impossible.

Current systems developed to perform TDR with step pulses involve extremely high speed sampling and tend to be very expensive, costing on the order of one hundred thousand dollars each. The use of modulated Gaussian pulses could avoid many of the problems associated with step pulses in that Gaussian pulses are extremely smooth, have low bandwidth, and are particularly suitable for closed form analytic operations and representations. However, there are currently no known systems or methods to perform TDR with Gaussian pulses, due to difficulties in accurately detecting, timing, and characterizing Gaussian pulses in a noisy medium.

Therefore, systems and methods are desired to detect and characterize modulated Gaussian pulses in a noisy medium.

SUMMARY OF THE INVENTION

A system and method for detecting and characterizing Gaussian pulses is presented. A system and method for performing Time Domain Reflectometry (TDR) using Gaussian pulses is also described. The system may include a computer, comprising a CPU and a memory, wherein the memory is operable to store one or more software programs for performing TDR, and wherein the CPU is operable to execute the software programs. The system may also include an arbitrary waveform generator (AWG) coupled to the computer, and a digitizer coupled to the computer and the AWG. The system may be coupled to a Device or Medium, hereafter referred to as a Device Under Test (DUT). It should be noted that the DUT may be any kind of device, including a stand alone device, a PC board, an instrument, an electric or optical circuit, or an electronic or optical transmission medium, among others.

In the preferred embodiment, the computer system comprises a PCI eXtensions for Instrumentation (PXI) system which includes one or more PXI computer boards or cards plugged into a PXI backplane, such as a "PC on a card", housed in a PXI chassis. In other words, the PXI cards may comprise the memory and CPU which are operable to respectively store and execute one or more computer software programs implementing the present invention. The PXI system may also include or couple to a display, such as a monitor, for displaying visual information, such as results, to a user, as well as an I/O interface for receiving input and sending output to external systems or components. In one embodiment, the display may be comprised in the PXI chassis. In another embodiment, the display may be external to the PXI chassis. In one embodiment, the I/O interface may also be comprised on a PXI card.

The AWG may be operable to generate a Gaussian pulse and transmit the Gaussian pulse to the digitizer and to the Device Under Test (DUT). The DUT may be further operable to reflect at least a portion of the transmitted Gaussian pulse in the form of one or more reflected pulses to the digitizer. A digital signal containing a modulated Gaussian pulse and signal noise may be received, such as from the digitizer, from some other external system, or from the memory medium of the computer system. The signal may also include one or more reflected pulses. For example, in the TDR system described above, the AWG may generate a Gaussian pulse and transmit the Gaussian pulse to the digitizer and the Device Under Test (DUT). The DUT may reflect at least a portion of the transmitted Gaussian pulse to the digitizer, comprising the one or more reflected Gaussian pulses. The digitizer may receive and digitize the signal comprising the transmitted Gaussian pulse and the one or more reflected Gaussian pulses, and store the digitized signal in the memory.

An estimation of N Gaussian pulse parameters may be determined for a Gaussian pulse comprised in the signal, where N is greater than or equal to one. The Gaussian pulse parameters may include $\alpha_p$ (the inverse of the Gaussian pulse variance), $t_p$ (the Gaussian pulse time shift), and $\omega_p$ (the Gaussian pulse carrier frequency or base frequency). The pulse variance is related to the width of the Gaussian pulse. The pulse time shift is a measure of the time interval from some arbitrary origin to the peak of the Gaussian pulse. The pulse carrier frequency refers to the frequency of the modulation of the Gaussian pulse. In one embodiment, the estimation of Gaussian pulse parameters may be determined using any of various prior art techniques, such as the zoom-in approach, for example, which is well known in the art.

Once the estimation of the Gaussian pulse parameters is determined, a plurality of permutations of the estimated Gaussian Pulse parameters may be generated by adding or subtracting a small delta amount to or from each parameter value, producing a plurality of parameter sets representing a corresponding plurality of permuted Gaussian pulses or waveforms. If there are N estimated parameters, then M permutations of the N parameters may be generated, where M is greater than or equal to N−1. The original coarse estimated parameters and the M permutations comprise M+1 sets of parameters, such that for M=N−1, the minimal number of parameter sets (M+1)=N may be used to determine refined values for N parameter variables, described below. It should be noted that in some embodiments, the coarse estimation may not be used in determining the refined values.

In the preferred embodiment, M is greater than or equal to N so as to allow overdetermination of the N parameters. For example, where the pulse parameters are $\alpha_p$, $t_p$, and $\omega_p$, N=3, and so M=3 permutation sets may be generated. It has been determined that, due to diminishing returns of increased overdetermination, in the preferred embodiment, letting M=N provides for the greatest benefit in refining the N estimated parameters.

In one embodiment, an inner or dot product, $Q_i$, may be calculated between the received signal and each of the M permutations of the estimated Gaussian Pulse parameters, i.e., between the received signal and each of the M permuted Gaussian pulses or waveforms. This calculation is facilitated by the fact that for Gaussian pulses there is a closed form, or analytic, solution for the inner product. Said another way, each of the plurality of parameter sets may be used in the equation for Q, providing a corresponding plurality of inner product equations. The closed form equation of the inner product includes terms for the estimation parameters, as well as variables for the as yet undetermined parameters of the received Gaussian pulse.

The plurality of M inner products, Q, may be used to generate a corresponding plurality of M linear equations, each of which is a function of a respective one of the M estimation permutations and corresponding N parameter variables of the Gaussian pulse.

The plurality of linear equations may then be solved to overdetermine the parameters of the Gaussian pulse. It should be noted that in the case of three parameters or variables, a minimum of three linear equations could be solved to determine the variable values. However, by over-determining the variable values through the use of more than the minimum number of linear equations, an "averaging" effect results, providing more accurate values for the parameters. Using the (over) determined parameters of the received Gaussian pulse, various analyses may be performed. For example, in the TDR system, a transmitted Gaussian pulse and one or more reflected pulses (from the DUT) may each be analyzed to characterize an interconnect discontinuity in the DUT. In one embodiment, the parameters may be used to determine the nature and magnitude of the discontinuity or the location of the discontinuity. For example, the characterized Gaussian pulses may be used to determine the transfer function of the discontinuity, or to calculate the impedance. As another example, the value of the time shift parameter $t_p$ for each pulse may be used to locate the interconnect discontinuity or flaw in the device or transmission medium.

In one embodiment, the method described above may be applied iteratively to a signal containing multiple Gaussian pulses, such as may be produced by the TDR system. In this embodiment, each time a pulse is detected and characterized, the characterized pulse may be subtracted from the signal, leaving a residue containing any remaining pulses. This residue may then be used as the input signal, and the next pulse detected and characterized. Again, the characterized pulse may be subtracted from the signal, leaving another residual signal, and so on, until all pulses of interested have been detected and characterized. Useful analyses may then be conducted on the resulting characterized pulses to extract useful information regarding the DUT, such as the number and nature of connection discontinuities therein.

Thus, by using various embodiments of the above-described method, a Gaussian pulse in a noisy signal may be detected and characterized. In one embodiment, the method may be used to distinguish between an original pulse and a plurality of reflected pulses in a TDR system, and to characterize connection discontinuities in the DUT or medium.

BRIEF DESCRIPTION OF THE DRAWINGS

A better understanding of the present invention can be obtained when the following detailed description of the preferred embodiment is considered in conjunction with the following drawings, in which:

FIG. 33 illustrates a hierarchy of VIs included in an Adaptive Gabor Transform VI of the system implementation of FIGS. 6A–31B.

Figure 1:
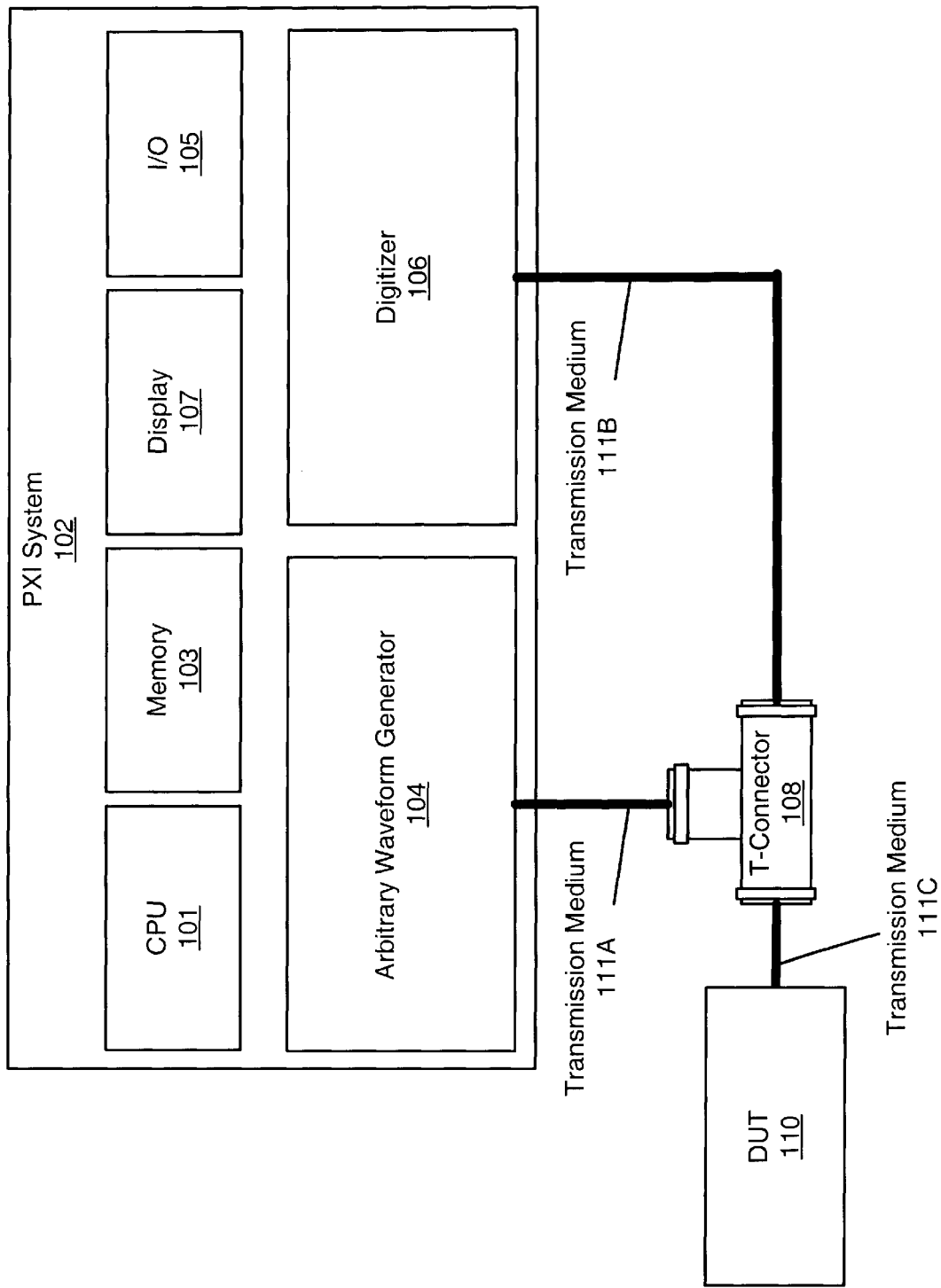
FIG. 1 illustrates one embodiment of a system suitable for performing TDR with Gaussian pulses.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1—A Gaussian Pulse TDR System

FIG. 1 is a block diagram of a Gaussian pulse TDR system, according to one embodiment. As FIG. 1 shows, a computer system 102 may comprise a CPU 101, a memory 103, a display 107, and an I/O interface 105. In the preferred embodiment, the computer system 102 comprises a PCI eXtensions for Instrumentation (PXI) system which includes one or more PXI computer boards or cards plugged into a PXI backplane, such as a "PC on a card", housed in a PXI chassis. In other words, the PXI cards may comprise the memory 103 and CPU 101 which are operable to respectively store and execute one or more computer software programs implementing the present invention. As FIG. 1 also shows, in one embodiment, the PXI system 102 may also include display 107, such as a monitor, for displaying visual information, such as results, to a user, as well as I/O interface 105 for receiving input and sending output to external systems or components. In one embodiment, the display 107 may be comprised in the PXI chassis. In another embodiment, the display may be external to the PXI chassis. In one embodiment, the I/O interface 105 may be comprised on a PXI card.

As FIG. 1 shows, the PXI cards may also include a waveform generator, e.g., an arbitrary waveform generator (AWG) 104, and a digitizer 106 which may be coupled to a device under test (DUT) 110. As used herein the term "DUT" includes any of various devices that may be tested. The "DUT" also includes any of various types of transmission mediums that may be tested, such as electrical or optical transmission mediums. Thus, the DUT 110 may be any kind of device, including a stand alone device, a PC board, an instrument, an electric or optical circuit, or an electronic or optical transmission medium, among others. For example, in one embodiment, the AWG 104 and the digitizer 106 may couple via transmission media 111A and 111B respectively to a T-Connector 108, as shown. The T-Connector may be operable to further couple to the device under test (DUT) 110 via transmission medium 111C. The AWG 104 may be operable to generate a signal pulse which may be transmitted to the digitizer 106 and the DUT 110. The signal pulse may be at least partially reflected by the DUT 110 and both the original signal pulse and the reflected pulse received and digitized by the digitizer 106 for analysis.

Further details of the analysis and characterization of the signal pulses are presented below with reference to FIGS. 2 and 3.

Figure 2:
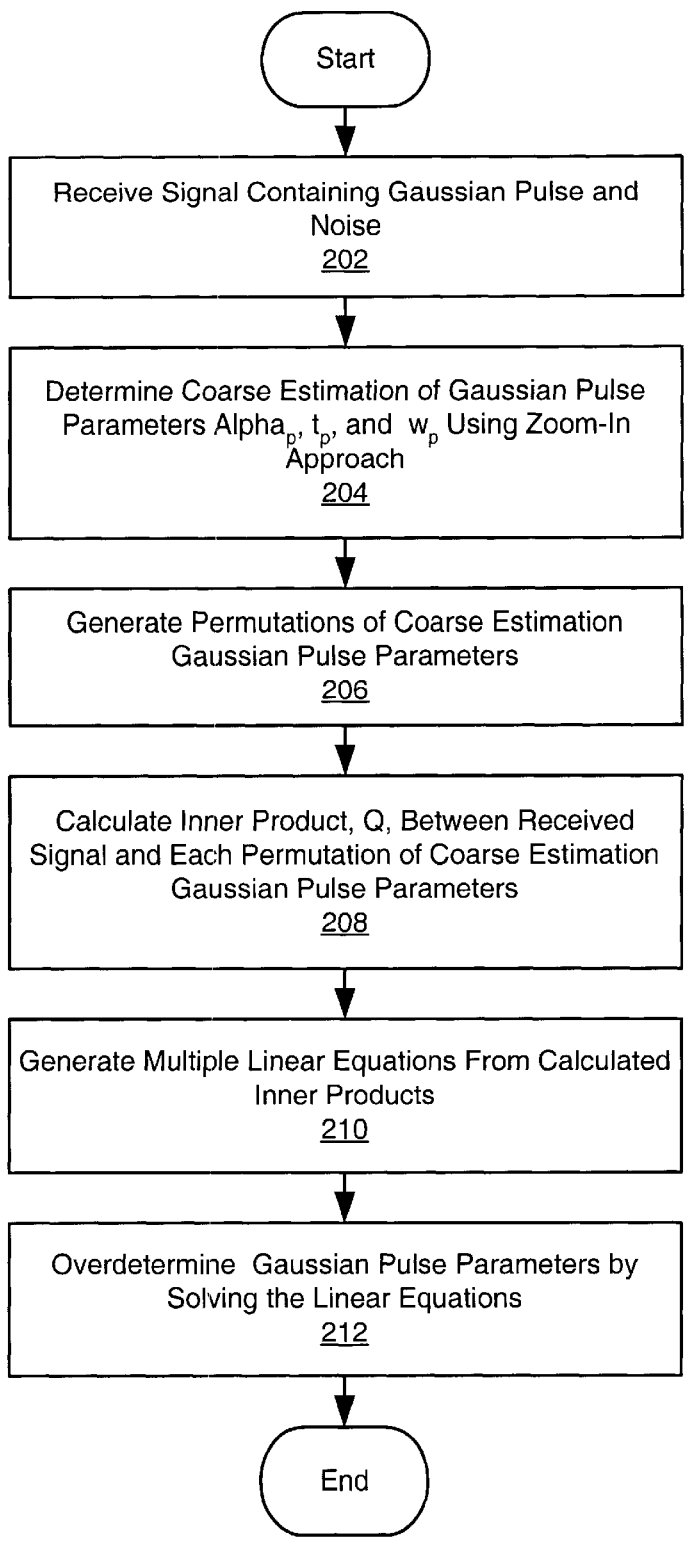
FIG. 2 is a flowchart of a method for detecting and characterizing a Gaussian pulse, according to one embodiment.

FIG. 2—Flowchart of a Method for Gaussian Pulse Detection and Characterization FIG. 2 is a flowchart of one embodiment of a method for detection and characterization of a modulated Gaussian pulse. It should be noted that in various embodiments, various of the steps presented below may occur in a different order than shown, or may be omitted, as desired. In other embodiments, additional steps may be included, as well.

As FIG. 2 shows, in 202 a digital signal containing a modulated Gaussian pulse and signal noise may be received. The signal may be received from the digitizer 106 of FIG. 1, or, alternatively, may be received from some other external system, or from the memory medium 103 of the computer system 102. When the signal is received from the memory medium 103, the signal is presumed to have been previously captured and stored in the memory medium.

In one embodiment, the signal may also include one or more reflected pulses. For example, in the TDR system described above with reference to FIG. 1, the AWG 104 may generate a Gaussian pulse and transmit the Gaussian pulse to the digitizer 106 and the Device Under Test (DUT) 110. The DUT 110 may reflect at least a portion of the transmitted Gaussian pulse to the digitizer 106, comprising the one or more reflected Gaussian pulses. The digitizer 106 may receive and digitize the signal comprising the transmitted Gaussian pulse and the one or more reflected Gaussian pulses, and store the digitized signal in the memory 103.

According to one embodiment, a coarse estimation may be determined for at least one Gaussian pulse, as described in 204, then a refined estimate may be determined using the coarse estimate, described in 206–212, below.

In 204, an estimation of N Gaussian pulse parameters may be determined for at least one Gaussian pulse comprised in the signal, where N is greater than or equal to one. In the preferred embodiment, the Gaussian pulse parameters may include $\alpha_p$ (the inverse of the Gaussian pulse variance), $t_p$ (the Gaussian pulse time shift), and $\omega_p$ (the Gaussian pulse carrier frequency or base frequency). In one embodiment, the Gaussian pulse parameters may further include other parameters, such as the pulse amplitude or phase, for example. The pulse variance is related to the width of the Gaussian pulse. The pulse time shift is a measure of the time interval from some arbitrary origin to the peak of the Gaussian pulse. The pulse carrier frequency refers to the frequency of the modulation of the Gaussian pulse. In one embodiment, the estimation of Gaussian pulse parameters may be determined using the zoom-in approach, which is well known in the art. Further details of this approach are presented below with reference to FIG. 3.

Once the estimation of the Gaussian pulse parameters is determined for the Gaussian pulse, then in 206 a plurality of permutations of the estimated Gaussian Pulse parameters may be generated. In other words, for each parameter value, corresponding additional values may be generated by adding or subtracting a small delta amount to or from the value, producing a plurality of parameter sets representing a corresponding plurality of permuted Gaussian pulses. Details of this process are described below in the Theory section. In one embodiment, if there are N estimated parameters, then M permutations of the N parameters may be generated, where M is greater than or equal to N−1. In one embodiment, the original coarse estimated parameters and the M permutations comprise M+1 sets of parameters, such that for M=N−1, the minimal number of parameter sets (M+1)=N may be used to determine refined values for N parameter variables, described below. In another embodiment, the coarse estimate may not be used, and instead, only the permutation parameter sets used to determined the refined values for the parameter variables. In yet another embodiment, a subset of the permutation parameter sets may be used to determined refined values for a subset of the N parameters. Thus, in various embodiments, at least a subset of the parameter sets comprising the coarse estimation and the permuted parameter sets may be used to determine at least a subset of the N parameter variable values, i.e., the refined variable values.

In the preferred embodiment, if there are N parameters estimated, then M permutations of the N parameters may be generated, where M is greater than or equal to N. As described below in more detail, M is greater than N so as to allow overdetermination of the N parameters. Each of the M permutations comprises a representation of a corresponding permutation waveform. In the preferred embodiment, where the pulse parameters are $\alpha_p$, $t_p$, and $\omega_p$, N=3. It has been determined that, due to diminishing returns of increased overdetermination, in the preferred embodiment, letting M=N+1 provides for the greatest benefit in refining the N estimated parameters.

In 208, in one embodiment, an inner or dot product, $Q_i$, may be calculated between the received signal and the coarse estimate, as well as between the received signal and each of the M permutations of the estimated Gaussian Pulse parameters, i.e., between the received signal and each of the coarse estimate waveform and the M permuted Gaussian pulses or waveforms, generating M+1 inner products. This calculation is facilitated by the fact that for Gaussian pulses there is a closed form, or analytic, solution for the inner product, as described below in the section titled Theory. Said another way, each of the plurality of parameter sets may be used in the equation for Q, providing a corresponding plurality of inner product equations. It should be noted that, as shown in the Theory section below, the closed form equation of the inner product includes terms for the estimation parameters, as well as variables for the as yet undetermined parameters of the received Gaussian pulse. In other embodiments, the coarse estimate may not be used to generate an inner product, and instead, the inner products may be generated from at least a subset of the permuted waveforms, or, alternately, the coarse estimate and a subset of the permuted waveforms may be used to generate the inner products.

In 210, in one embodiment, the plurality of inner products, $Q_i$, may be used to generate a corresponding plurality of linear equations. In other words, the linear equations may be derived from the inner product equations. Each of the linear equations may be a function of a respective one of the estimation parameter sets and corresponding N parameter variables of the Gaussian pulse. Details of this process are described in greater detail below in the Theory section. In a preferred embodiment the plurality of inner products comprises M+1 inner products, which may be used to generate a corresponding plurality of M+1 linear equations. In other words, the M+1 linear equations may be derived from the M+1 inner product equations. Thus, where there are three Gaussian parameters ($\alpha_p$, $t_p$, and $\omega_p$) to be determined for the received Gaussian pulse, there are three or more permutations for each estimate, giving four or more inner products, and therefore, four or more linear equations in the parameter variables. As mentioned above, in the preferred embodiment, when N=3, then M=3, and so there are M+1=4 linear equations to solve the N=3 variables.

Finally, in 212, the plurality of linear equations derived in 210 may be solved to determine the parameters of the Gaussian pulse. It should be noted that in the case of three parameters or variables, a minimum of three linear equations may be solved to determine the variable values. However, by overdetermining the variable values through the use of more than the minimum number of linear equations, an "averaging" effect results, providing more accurate values for the parameters. In the preferred embodiment, the overdetermination may be accomplished by simply using one more linear equation than the number of variables. As mentioned above, the benefits of using even more linear equations for even greater overdetermination are marginal, providing diminishing returns for the number of calculations involved. Using the (over) determined parameters of the received Gaussian pulse, various analyses may be performed. For example, in the TDR system of FIG. 1, a transmitted Gaussian pulse and one or more reflected pulses (from the DUT 110) may each be analyzed to characterize an interconnect discontinuity in the DUT 110. In one embodiment, the parameters may be used to determine the nature and magnitude of the discontinuity. For example, the characterized Gaussian pulses may be used to determine the transfer function of the discontinuity, or to calculate the impedance. As another example, the value of the time shift parameter $t_p$ for each pulse may be used to locate the interconnect discontinuity or flaw in the device or transmission medium.

In one embodiment, the CPU 101 of the TDR system of FIG. 1 may execute the one or more software programs to detect and characterize the transmitted Gaussian pulse according to the method described above. In the embodiment where the signal also includes the one or more reflected pulses, the CPU 101 may execute the one or more software programs to detect and characterize the reflected pulses, as well, wherein the detection and characterization of the transmitted Gaussian pulse and the one or more reflected Gaussian pulses may be useable to perform TDR analysis on the DUT 110.

Thus, by using various embodiments of the above-described method, a Gaussian pulse in a noisy signal may be detected and characterized. In one embodiment, the method may be used to distinguish between an original pulse and a plurality of reflected pulses in a Gaussian TDR system, and to characterize connection discontinuities in the DUT 110, as described above with reference to FIG. 1.

Figure 3:
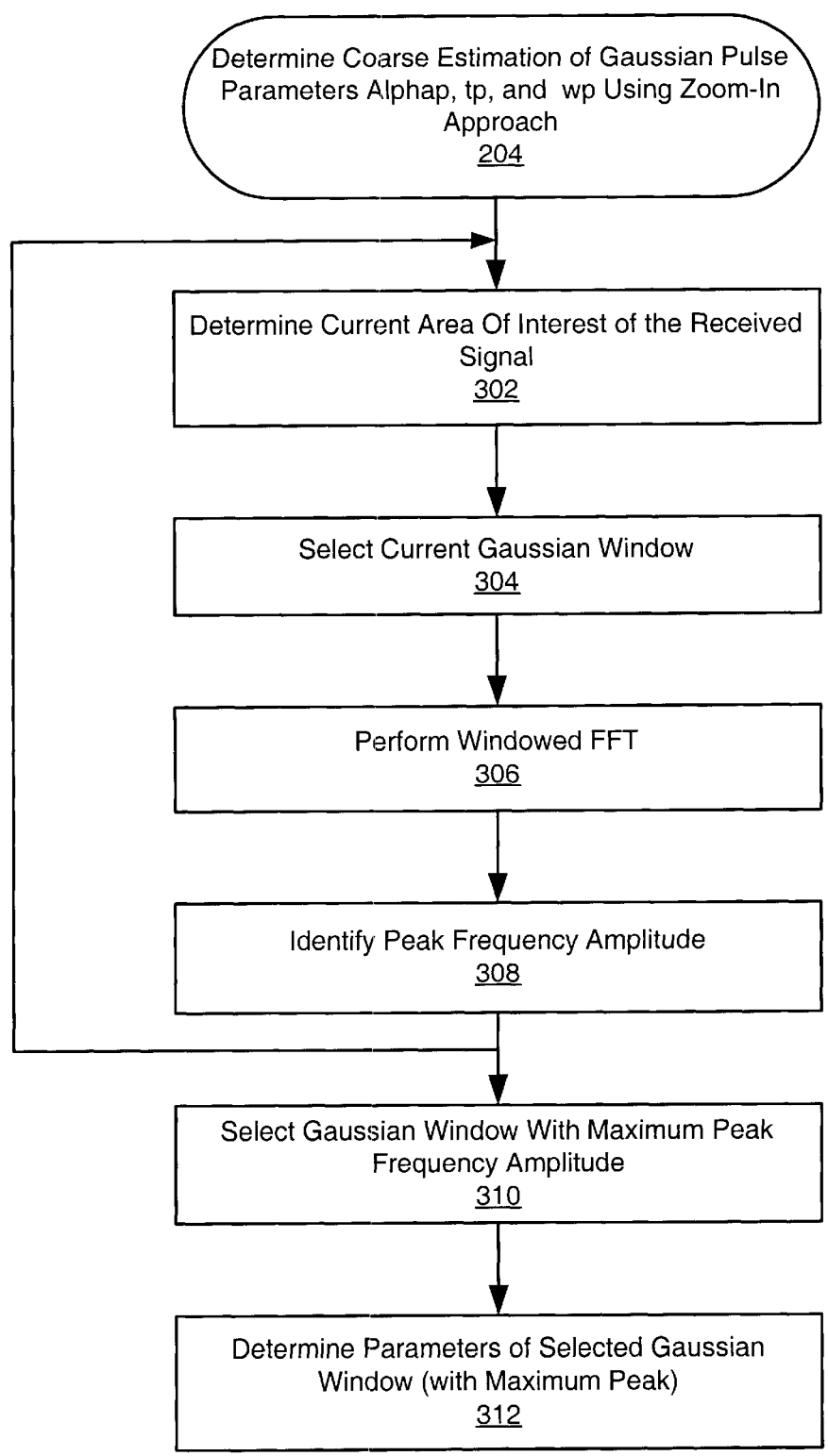
FIG. 3 is a flowchart of a method for determining an estimation of Gaussian pulse parameters, according to one embodiment.

FIG. 3—Flowchart of a Method for Making an Estimation of a Gaussian Pulse

FIG. 3 is a flowchart of one embodiment of a method for making the estimation of parameters for the Gaussian pulse comprised in the received digital signal, as described above in 202 with reference to FIG. 2. It should be noted that in various embodiments, various of the steps presented below may occur in a different order than shown, or may be omitted, as desired. In other embodiments, additional steps may be included, as well. In the preferred embodiment, the estimation may be made using the "zoom-in" approach, as is well known in the art, and which is described in detail below. At a high level, the zoom-in approach involves determining which of a predetermined set of Gaussian waveforms, also termed "Gaussian windows", most closely matches the Gaussian pulse in the received signal. Once the closest match is made, that Gaussian waveform's characteristic parameters may be used as the estimation of the Gaussian pulse. It should be noted that in the TDR system described above with reference to FIG. 1, the method described may also be used to generate estimations of parameters for the one or more reflected Gaussian pulses.

The received signal may comprise a first sequence of values, as may be produced by the digitizer 106. As FIG. 3 shows, in 302 a current area of interest of the received signal may be determined, i.e., a start position and a stop position in the first sequence of values comprised in the signal may be determined. The current area of interest may comprise a second sequence of values which includes at least a portion of the first sequence of values.

In one embodiment, the initial current area of interest may comprise most or all of the received signal. In the preferred embodiment, the number of data points or values in the area of interest (second sequence of values) is a power of two, such as 256, 512, 1024, etc. The determined area of interest is the part of the received signal to be compared against a given Gaussian window. In the preferred embodiment, each determined area of interest (but the first) may be centered at the optimal position of the previous Gaussian window's peak.

In 304, a current Gaussian window corresponding to the determined area of interest may be selected. In one embodiment, a Gaussian window may be a synthesized Gaussian waveform whose parameters are known, and which includes a number of data points which corresponds to, or is proportional to, the length of the determined area of interest described in 302. In other words, the Gaussian window may comprise a third sequence of values representing an elementary Gaussian function. In the preferred embodiment, the number of data points or values comprised in the selected Gaussian window is also a power of two, and is half that of the determined area of interest, such that if the initial area of interest has a length of 2048, then a Gaussian window of length 1024 is selected. In other embodiments, the ratio of the lengths of the area of interest and the Gaussian window may be greater or less than two.

In 306, a windowed FFT may be performed with the selected Gaussian window over the determined area of interest to generate a corresponding power spectrum. In one embodiment, the windowed FFT may be performed by logically aligning the Gaussian window at the start position of the area of interest such that each data point or value in the Gaussian window corresponds to a particular value in a portion of the area of interest, i.e., wherein a sub-sequence of the values comprised in the area of interest aligns with the third sequence of values comprised in the Gaussian window.

An element-wise product may be calculated between the Gaussian window (the third sequence of values) and the aligned portion of the area of interest (the sub-sequence of values), generating a product waveform. A Discrete Fourier Transform (DFT) may then be applied to the product waveform to determine a power spectrum of the product waveform. A peak frequency amplitude may be identified from the power spectrum. Once the power spectrum of the product waveform is determined, the Gaussian window may be shifted with respect to the area of interest, and the process repeated, generating another product waveform, and another power spectrum. In one embodiment, the Gaussian window may be shifted by one or more data points or values with respect to the area of interest data. The Gaussian window may then be shifted again, and so on, until the entire area of interest has been compared (via inner product and FFT) to the Gaussian window waveform. Thus, a peak frequency amplitude may be determined for each of the plurality of generated power spectra. The peak frequency amplitude for each generated power spectrum is a measure of the degree to which the Gaussian window/waveform at that position correlates with the waveform of the area of interest. It should be noted that the element-wise multiplication of the Gaussian window with the portion of the area of interest of the received signal, followed by the FFT of the resulting product is functionally equivalent to performing an inner product of the portion of the area of interest of the received signal with a modulated ideal Gaussian waveform (window).

In 308, a maximum peak frequency amplitude may be determined from the plurality of power spectra generated in 306. In other words, the greatest peak value from all of the selected Gaussian window's power spectra may be determined, indicating maximal correlation of the waveform at the corresponding position.

As FIG. 3 shows, the process described in 302–308 may be repeated for each of the other Gaussian windows, generating corresponding maximum peak frequency amplitudes for each. In the preferred embodiment, at each iteration the length of both the area of interest and the Gaussian window is decreased by a factor of two.

Finally, in 310, the maximum peak frequency amplitudes determined in each iteration may be compared, the greatest maximum peak frequency amplitude determined from them, and the corresponding Gaussian window or waveform and corresponding position selected as the estimation of the Gaussian pulse.

Thus, with each iteration the method "zooms in" by a factor of two, measuring the correlation between each Gaussian window or waveform at a multitude of relative positions with the area of interest waveform. The Gaussian waveform at the position with the highest correlation may be selected as the estimation of the Gaussian pulse, and its N parameters used in the permutation step described above in 206.

As mentioned, in one embodiment, the method described above with reference to FIGS. 2 and 3 may be applied iteratively to a signal containing multiple Gaussian pulses, such as may be produced by the TDR system of FIG. 1. Such as method is described below with reference to FIG. 4. In this embodiment, each time a pulse is detected and characterized, the characterized pulse may be subtracted from the signal, leaving a residue containing any remaining pulses. This residue may then be used as the input signal, and the next pulse detected and characterized. Again, the characterized pulse may be subtracted from the signal, leaving another residual signal, and so on, until all pulses of interested have been detected and characterized. Useful analyses may then be conducted on the resulting characterized pulses to extract useful information regarding the DUT, such as the number, nature, and location of connection discontinuities therein.

Figure 4:
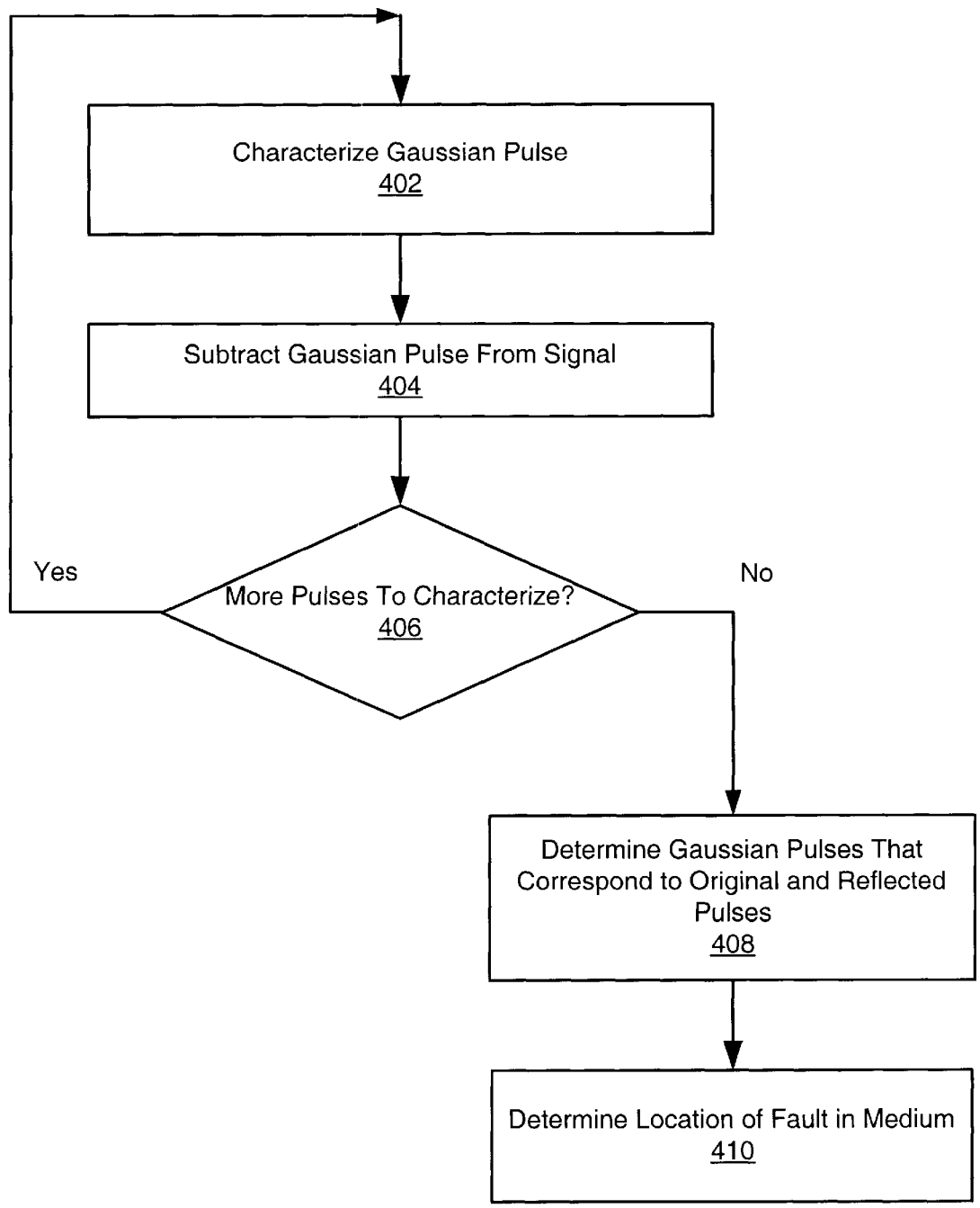
FIG. 4 is a flowchart of a method for performing Time Domain Reflectometry using Gaussian pulses, according to one embodiment.

FIG. 4—A Method for Performing Time Domain Reflectometry Using Gaussian Pulses

FIG. 4 is a flowchart of one embodiment of a method for performing Time Domain Reflectometry (TDR) using Gaussian pulses. This particular embodiment relates to using TDR to locate a fault, such as in a transmission medium. The signal may comprise a sequence of values which includes a plurality of Gaussian pulses, as well as noise. It is assumed that a signal has been received, for example, from a memory medium, a digitizer, or any other source, and is in a form suitable for analysis.

As FIG. 4 shows, in 402 a Gaussian pulse comprised in the signal may be characterized, such as by applying the methods described above with reference to FIG. 2 and FIG. 3. In one embodiment, the characterization of the Gaussian pulse may include producing a set of parameter values which characterize the pulse, and from which an approximation of the Gaussian pulse may be generated. In one embodiment, the parameter values may be stored for later use. In another embodiment, the parameter values may be used to produce an approximation or construction of the Gaussian pulse, which itself may be stored.

In 404, the Gaussian pulse may be subtracted from the signal. In one embodiment, subtracting the Gaussian pulse from the signal may include generating the approximation or reconstruction of the Gaussian pulse from the parameters of 402, then subtracting the approximated Gaussian pulse from the signal, i.e., numerically subtracting a sequence of values comprised in the approximated or reconstructed Gaussian pulse from the sequence of values comprised in the signal, resulting in a remainder signal, or residual.

In 406, a determination may be made as to whether there are more pulses of interest in the residual. If there are more pulses in the residual, then steps 402 and 404 are performed again, this time using the residual signal, and thereby producing a second residual. Again, a determination may be made as to whether there are more pulses of interest in the residual, and so on, repeating steps 402 and 404 until it is determined that there are no more pulses of interest in the final remainder or residual signal.

Once it has been determined in 406 that there are no more pulses of interest in the residual, then in 408 the characterized pulses that correspond to an original pulse and one or more reflected pulses may be determined. In one embodiment, the plurality of parameter sets which correspond to each of the characterized Gaussian pulses may be sorted by one or more parameter values, such as by time shift, in order to clarify the nature and relationships of the characterized pulses. In one embodiment, the parameters may be used to calculate other parameters, such as amplitude, upon which the parameter sets may be sorted. The order of the sorted parameters may be used to ascertain which of the pulses is the original pulse, and which are reflected pulses. For example, if the pulses are sorted by ascending time shift, then the top most pulse is the earliest received pulse, and thus may be assumed to be the original pulse. This conclusion may be confirmed by checking whether the top most pulse also has the greatest amplitude, as would be expected. Similar types of analyses may be performed on the remaining signals to determine a primary reflected pulse, and any other reflected pulses, as desired.

Finally, in 410 the location of the fault in the medium may be determined. In the preferred embodiment, the location may be determined by comparing the time shift values of the original pulse and the primary, or first, reflected pulse, producing a time difference $\Delta t$. The time difference $\Delta t$ combined with the known speed of the signal in the medium may be used to calculate the distance from the signal source to the fault, thereby locating the fault. It should be noted that the fault location is but one of a variety of features of the medium which may be investigated using the above method, such as the magnitude and/or nature of interconnect discontinuities, impedance, etc. It should also be noted that the TDR process described above is applicable not only to transmission media, but to any DUT. For example, the above method or similar methods may be used to analyze characteristics, e.g., analyze interconnect discontinuities, of signal traces or vias in a printed circuit board (PCB) or a printed wiring board (PWB).

FIGS. 5A–5E—Example Signals with Gaussian Pulses

FIGS. 5A–5E illustrate example signal traces which include one or more Gaussian pulses, including reflected pulses. In one embodiment, these signal traces may be produced by a system such as the TDR system described above with reference to FIG. 1, using the methods described above with reference to FIGS. 2–4.

Figure 5A:
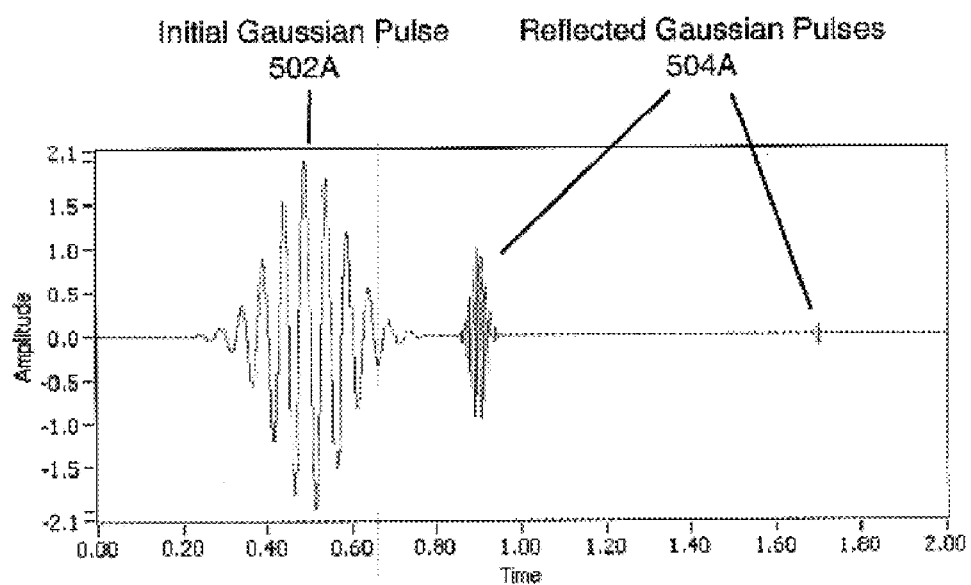
FIGS. 5A–5E illustrate example signals with Gaussian pulses, according to one embodiment.

FIG. 5A—Gaussian Pulse and Reflection Pulses

FIG. 5A is an example of a signal which contains a Gaussian pulse and two reflection pulses. The largest pulse (left) 502A is the initial or original Gaussian pulse. The middle pulse and rightmost smallest pulse are reflected pulses 504B, where the middle pulse is a primary reflected pulse, and the smallest is a secondary reflected pulse. As FIG. 5A shows, the signal is extremely clean, i.e., signal noise is neglibible. This example is not representative of typical real world signals, where the presence of noise is almost inevitable.

Figure 5B:
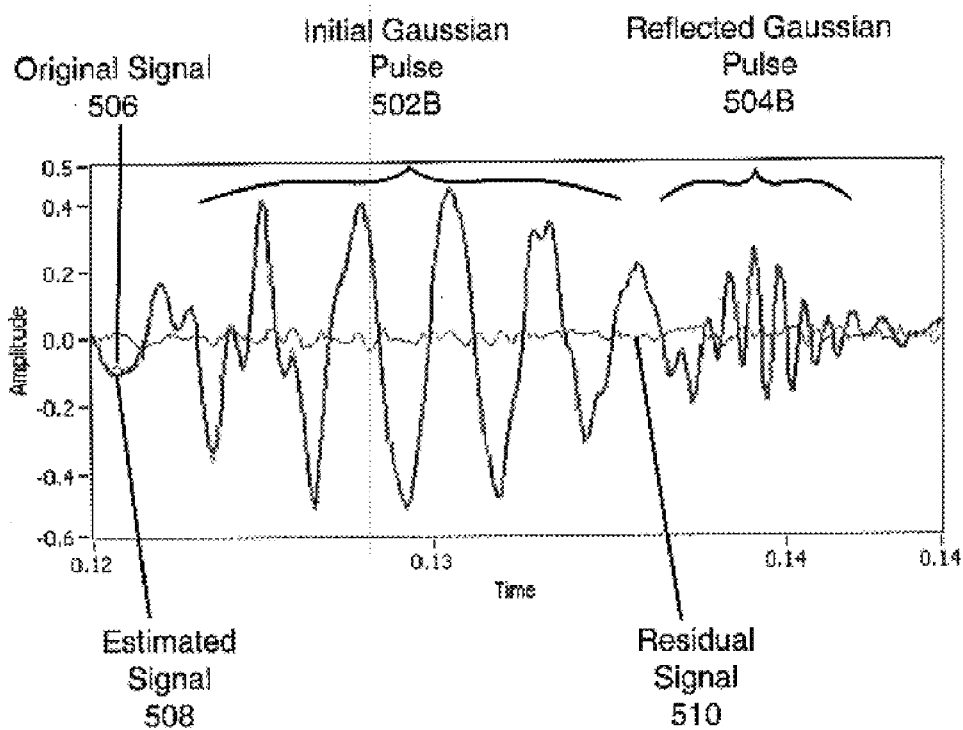

FIG. 5B—Gaussian Pulses with Refined Estimates and Residue

FIG. 5B is an example of a Gaussian pulse and a partially coincident reflected pulse. As FIG. 5B shows, there are three traces overlayed on the chart; an original signal 506, which includes an initial Gaussian pulse 502B shown in the left three fourths of the trace, and a higher frequency reflected pulse 504B shown on the right. As described above, the method has been applied iteratively to the signal, generating a pulse estimation for each of the pulses, which together form an estimated signal 508. The estimated pulses (signal) 508 are subtracted from the original signal 506 to produce the low amplitude waveform, or residual, trace 510 as shown. The amplitude of the residual 510 is a measure of the accuracy of the estimations, in that the greater the coincidence of the estimation pulses 508 with the original pulses 506, the smaller the difference, or residual 510.

Figure 5C:
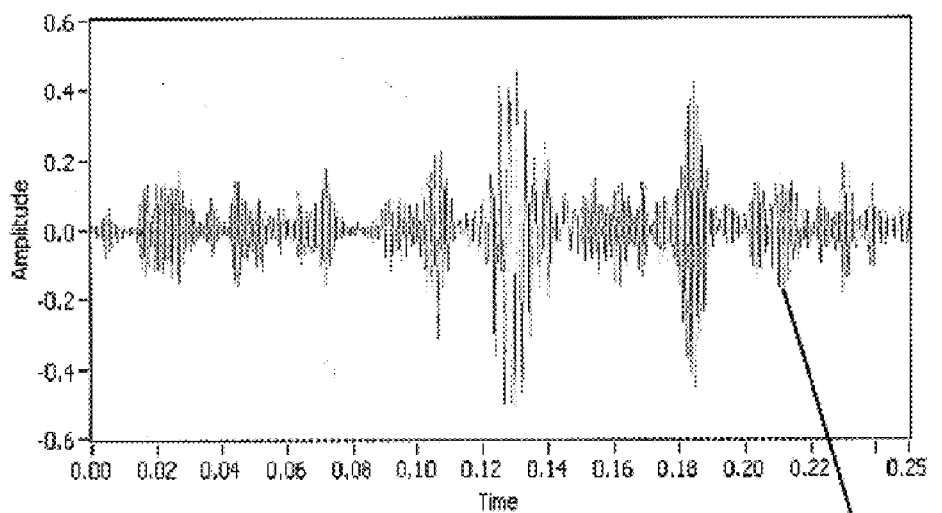

FIG. 5C—Multiple Gaussian Pulses in Noisy Medium

Figure 5D:
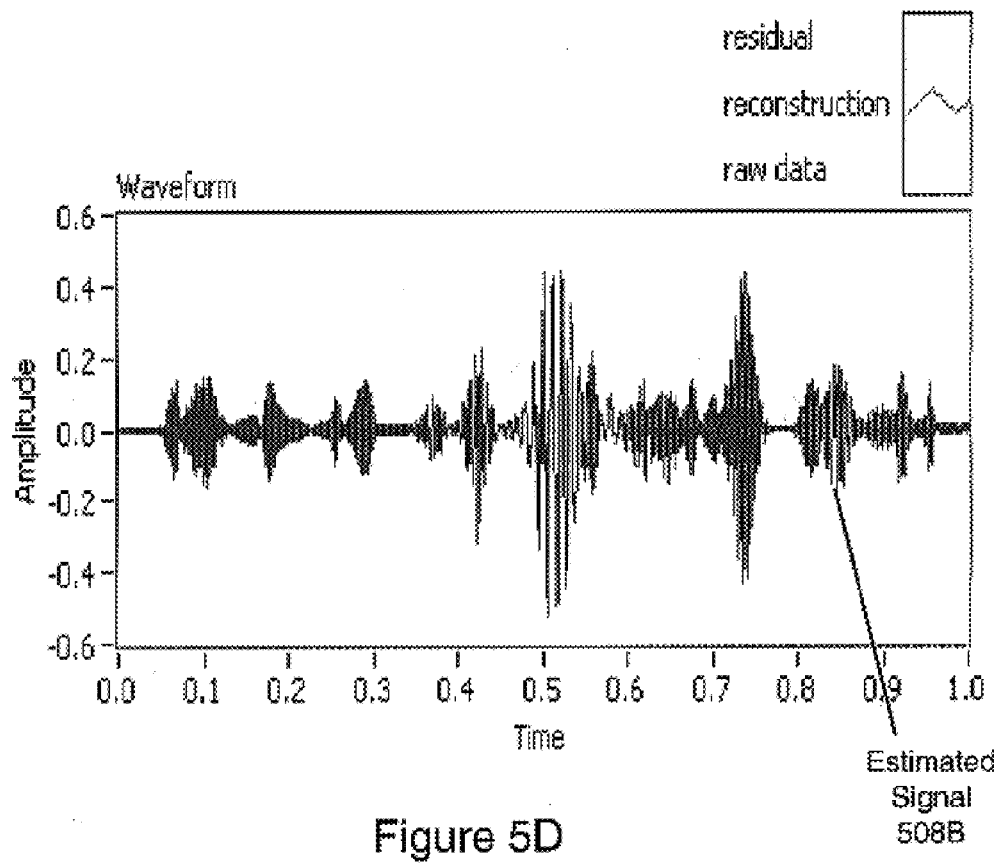

FIG. 5C is an example of a signal 506B which includes many Gaussian pulses and which also includes substantial noise. As FIG. 5C shows, a primary Gaussian pulse of amplitude ~0.4, centered at ~0.13 on the time axis is followed by a similar reflected pulse with approximately the same amplitude, located at ~0.185. Additionally, there are many pulses of unknown origin with amplitudes between 0 and 0.2, as may be seen. FIG. 5D, described below, illustrates the result of applying the present method to such as noisy signal.

FIG. 5D—Refined Estimates of Multiple Gaussian Pulses in Noisy Medium

FIG. 5D shows the results of iterative application of the present method to the signal 506B of FIG. 5C, namely, the estimated or reconstructed signal 508B. FIG. 5D is an exemplary illustration of the utility of the present method for extracting useful information from extremely noisy signals. As FIG. 5D shows, the method has detected and characterized many (~100) Gaussian pulses in the signal. The estimated signal 508B may be subtracted from the original signal 506B of FIG. 5C to produce a residue, as shown below with reference to FIG. 5E.

Figure 5E:
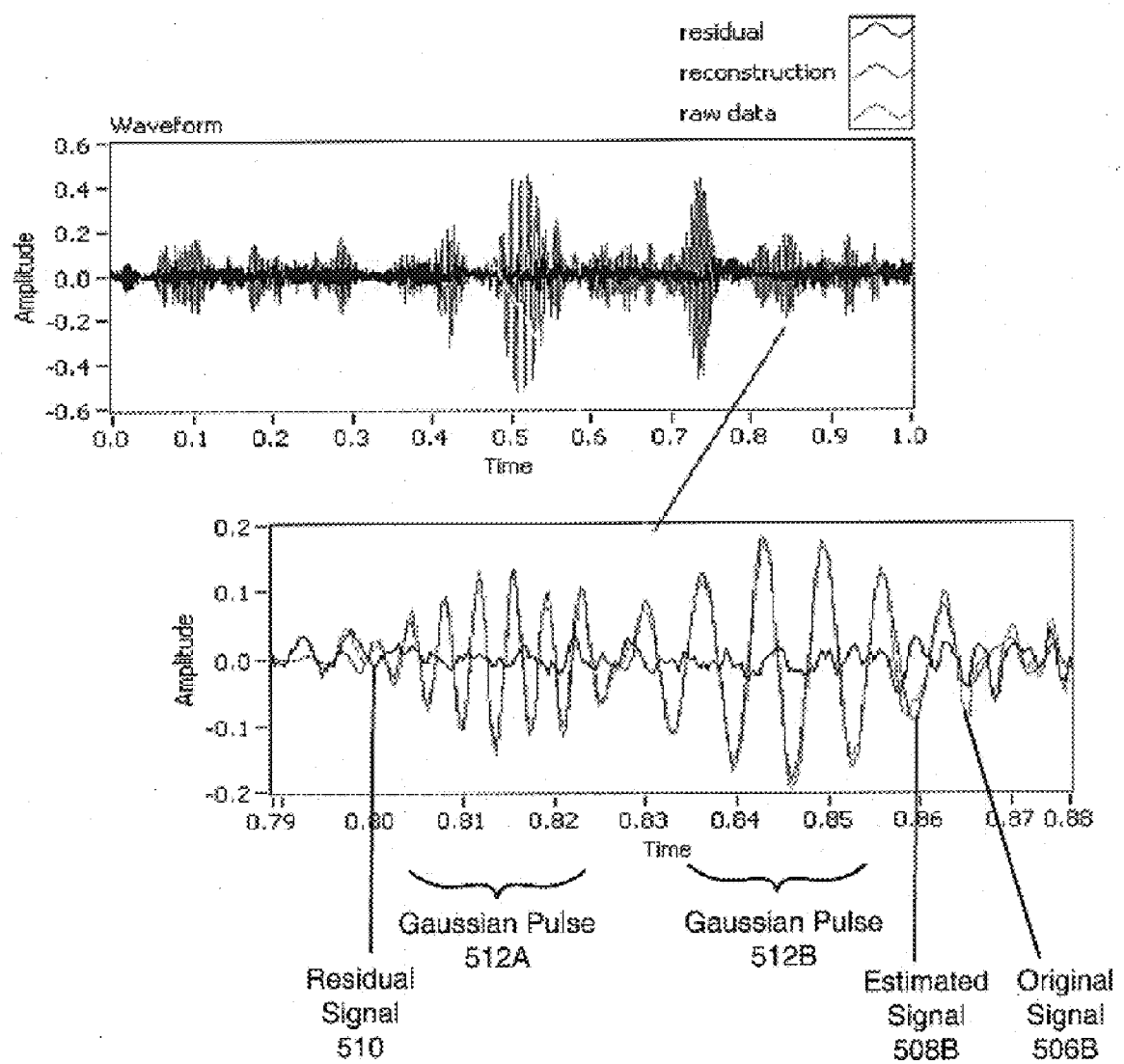

FIG. 5E—Multiple Gaussian Pulses in Noisy Medium with Refined Estimates and Residue FIG. 5E illustrates the original signal trace 506B from FIG. 5C overlayed with the estimated or constructed signal trace 508B from FIG. 5D. To clarify the matter, a portion of the signal trace has been magnified, illustrating two adjacent Gaussian pulses, 512A and 512B. As may be seen, the difference between the original and estimated signals is also shown, in the form of the residual 510. As mentioned above, the accuracy of the estimate is reflected graphically in the residual, with a lower amplitude residual indicating greater accuracy. In this example, measuring the residual as a percentage of the original signal gives a value of ~13%.

As mentioned above, once the method has been applied to the signal, the quantified parameters generated for each detected pulse may be sorted by one or more of the parameters and analyzed. For example, the detected pulses may be sorted by amplitude, wherein the pulse with the highest amplitude may be designated as the primary, or original Gaussian pulse. Typically, the pulse with the second highest amplitude is the first reflected pulse. The parameters of these two pulses may then be compared to deduce characteristics of the reflection event or fault. For example, the time shift $t_p$ of the two pulses may be compared to determine the location of the fault, and so on. The information gleaned from these first two pulses may be useful in determining the relevance of each of the other pulses, allowing secondary reflection pulses to be distinguished from incidental pulses with the same or even greater amplitudes.

Theory

The theoretical basis of the above-described method is based upon the adaptive Gabor expansion, which is a special case of the so-called Matching Pursuit (MP) as is well known in the art. It is assumed that the use of moving Gaussian windows to generate the estimate $h_{p,0}$ of the Gaussian pulse in the signal $s_p(t)$, is well understood, and so the estimate $h_{p,0}$ with parameter set ($\alpha_{p,0}$, the inverse of the Gaussian pulse variance, $t_{p,0}$, the Gaussian pulse time shift, and $\omega_{p,0}$, the carrier or base frequency) is assumed as given. The following describes the method used to refine the estimate.

The signal $s_p(t)$ may be considered to be comprised of two orthogonal components, or basis functions, which are the Gaussian pulse, and an orthogonal noise component, or residue. If the estimate $h_{p,0}$ is assumed to be close to an optimal or ideal Gaussian elementary function, then the following relation holds:

$$|<s_p(t), h_{p,0}(t)>| = |<v_p(t) + s_{p+1}(t), h_{p,0}(t)> + \aleph| \quad (1)$$

where $v_p$ is the component of the signal parallel to the optimal function, $s_{p+1}$ is orthogonal to $v_p$, and $\aleph$ denotes the correlation between $h_{p,0}$ and $s_{p+1}$. The term $s_{p+1}$ is used to denote the orthogonal component because it is the residue left after removal of the parallel component, i.e., the characterized Gaussian pulse. This residue may then be examined for further pulses, and so is considered to be the "next" signal, $s_{p+1}$. Because $h_{p,0}$ is close to $v_p$, $\aleph$ may be considered negligible, thus the inner product between $s_p(t)$ and $h_{p,0}(t)$ may be simplified to $$|<s_p(t), h_{p,0}(t)>| \approx |<v_p(t), h_{p,0}(t)>| \quad (2)$$

$$= Q(\alpha_{p,0}, t_{p,0}, \omega_{p,0}) \quad (3)$$

Note that the inner product $Q(\alpha_{p,0}, t_{p,0}, \omega_{p,0})$ may be written in closed form for a Gaussian function:

$$Q(\alpha_{p,m}, t_{p,m}, \omega_{p,m}) = \frac{|A_p|}{\sqrt[4]{\frac{1}{4\alpha_p \alpha_{p,m}}(\alpha_p + \alpha_{p,m})^2}} e^{\frac{-(\alpha_p \alpha_{p,m})}{2(\alpha_p + \alpha_{p,m})}(t_p - t_{p,m})^2 - \frac{1}{2(\alpha_p + \alpha_{p,m})}(\omega_p - \omega_{p,m})^2} \quad (4)$$

While the set of parameters ($\alpha_p$, $t_p$, $\omega_p$) is unknown and needed to estimate the Gaussian pulse, the set of parameters ($\alpha_{p,m}$, $t_{p,m}$, $\omega_{p,m}$) represents the $m^{th}$ testing point. If it is assumed that $$Q(\alpha_{p,0}, t_{p,0}, \omega_{p,0}) \equiv |<s_p(t), h_{p,0}(t)>| = |<s_p, h_{\alpha_{p,0} t_{p,0} \omega_{p,0}}>| \quad (5)$$

then, in principle, the set of unknown parameters ($\alpha_p$, $t_p$, $\omega_p$) can be solved by a group of equations with testing points ($\alpha_{p,m}$, $t_{p,m}$, $\omega_{p,m}$), for m=0, 1, 2, . . .

Because both sides of equation (4) are positive, the following relation holds:

$$\ln \frac{Q(\alpha_{p,m}, t_{p,m}, \omega_{p,m})}{Q(\alpha_{p,n}, t_{p,n}, \omega_{p,n})} = \ln \frac{|<s_p, h_{\alpha_{p,m} t_{p,m} \omega_{p,m}}>|}{|<s_p, h_{\alpha_{p,n} t_{p,n} \omega_{p,n}}>|} = \\
\frac{\alpha_p \alpha_{p,m}}{\alpha_p + \alpha_{p,m}} t_p (t_{p,m} - t_{p,n}) + \frac{\alpha_p \alpha_{p,m}}{2(\alpha_p + \alpha_{p,m})} (t_{p,m}^2 - t_{p,n}^2) + \\
\frac{1}{\alpha_p + \alpha_{p,m}} \omega_p (\omega_{p,m} - \omega_{p,n}) + \frac{1}{2(\alpha_p + \alpha_{p,m})} (\omega_{p,m}^2 - \omega_{p,n}^2) \quad (6)$$

With elementary mathematical manipulation, equation (4) can be regrouped as $$ax + b\omega_p + c\alpha_p = d \quad (7)$$

where $$x = \alpha_{p,m} \alpha_p t_p$$

and a, b, c, and d are known coefficients given by $$a = t_{p,m} - t_{p,n}, \quad (8)$$

$$b = \omega_{p,m} - \omega_{p,n}, \quad (9)$$

$$c = \frac{\alpha_{p,m}}{2}(t_{p,n}^2 - t_{p,m}^2) - \ln \frac{|<s_p, h_{\alpha_{p,m} t_{p,m} \omega_{p,m}}>|}{|<s_p, h_{\alpha_{p,n} t_{p,n} \omega_{p,n}}>|} \quad (10)$$

and $$d = \alpha_{p,m} \ln \frac{|<s_p, h_{\alpha_{p,m} t_{p,m} \omega_{p,m}}>|}{|<s_p, h_{\alpha_{p,n} t_{p,n} \omega_{p,n}}>|} - \frac{(\omega_{p,n}^2 - \omega_{p,m}^2)}{2} \quad (11)$$

where d derives from the fact that the inner product Q may be approximated by the inner product of the original signal and the elementary Gaussian function, h(t), as expressed in equation (2), above.

By applying the set of following test points, $$(\alpha_{p,0}, t_{p,0}, \omega_{p,0})$$

$$(\alpha_{p,0}, t_{p,1}, \omega_{p,1})$$

$$(\alpha_{p,0}, t_{p,1}, \omega_{p,-1}) \quad (12)$$

$$(\alpha_{p,0}, t_{p,-1}, \omega_{p,1})$$

$$(\alpha_{p,0}, t_{p,-1}, \omega_{p,-1})$$

($\alpha_p$, $t_p$, $\omega_p$) can be solved from the following linear system:

$$A \begin{bmatrix} x \\ \omega_k \\ \alpha_k \end{bmatrix} = \begin{bmatrix} \alpha_{k,0} - \ln \frac{|<s_p, h_{\alpha_{p,0} t_{p,0} \omega_{p,0}}>|}{|<s_p, h_{\alpha_{p,0} t_{p,1} \omega_{p,1}}>|} - \frac{(\omega_{p,1}^2 - \omega_{p,0}^2)}{2} \\ \alpha_{p,0} - \ln \frac{|<s_p, h_{\alpha_{p,0} t_{p,0} \omega_{p,0}}>|}{|<s_p, h_{\alpha_{p,0} t_{p,1} \omega_{p,-1}}>|} - \frac{(\omega_{p,-1}^2 - \omega_{p,0}^2)}{2} \\ \alpha_{p,0} - \ln \frac{|<s_p, h_{\alpha_{p,0} t_{p,0} \omega_{p,0}}>|}{|<s_p, h_{\alpha_{p,0} t_{p,-1} \omega_{p,1}}>|} - \frac{(\omega_{p,1}^2 - \omega_{p,0}^2)}{2} \\ \alpha_{p,0} - \ln \frac{|<s_p, h_{\alpha_{p,0} t_{p,0} \omega_{p,0}}>|}{|<s_p, h_{\alpha_{p,0} t_{p,-1} \omega_{p,-1}}>|} - \frac{(\omega_{p,-1}^2 - \omega_{p,0}^2)}{2} \end{bmatrix} \quad (13)$$

where the matrix A is given by $$A = \begin{bmatrix} t_{p,0}-t_{p,1} & \omega_{p,0}-\omega_{p,1} & \frac{\alpha_{p,0}}{2}(t_{p,1}^2-t_{p,0}^2)-\ln\frac{|\langle s_p, h_{\alpha_{p,0}t_{p,0}\omega_{p,0}}\rangle|}{|\langle s_p, h_{\alpha_{p,0}t_{p,1}\omega_{p,1}}\rangle|} \\ t_{p,0}-t_{p,1} & \omega_{p,0}-\omega_{p,-1} & \frac{\alpha_{p,0}}{2}(t_{p,1}^2-t_{p,0}^2)-\ln\frac{|\langle s_p, h_{\alpha_{p,0}t_{p,0}\omega_{p,0}}\rangle|}{|\langle s_p, h_{\alpha_{p,0}t_{p,1}\omega_{p,-1}}\rangle|} \\ t_{p,0}-t_{p,-1} & \omega_{p,0}-\omega_{p,1} & \frac{\alpha_{p,0}}{2}(t_{p,-1}^2-t_{p,0}^2)-\ln\frac{|\langle s_p, h_{\alpha_{p,0}t_{p,0}\omega_{p,0}}\rangle|}{|\langle s_p, h_{\alpha_{p,0}t_{p,-1}\omega_{p,1}}\rangle|} \\ t_{p,0}-t_{p,-1} & \omega_{p,0}-\omega_{p,-1} & \frac{\alpha_{p,0}}{2}(t_{p,-1}^2-t_{p,0}^2)-\ln\frac{|\langle s_p, h_{\alpha_{p,0}t_{p,0}\omega_{p,0}}\rangle|}{|\langle s_p, h_{\alpha_{p,0}t_{p,-1}\omega_{p,-1}}\rangle|} \end{bmatrix}$$

The set of parameters ($\alpha_{p,0}$, $t_{p,0}$, $\omega_{p,0}$) denotes initial values which may be estimated by the "zoom-in" approach described above with reference to FIG. 3. The remainder of the testing points may be determined by:

$$t_{p,n}=t_{p,0}+n\Delta_t, n=\pm 1 \quad (15)$$

and $$\omega_{p,n}=\omega_{p,0}+n\Delta_\omega, n=\pm 1 \quad (16)$$

The time increment $\Delta_t$ is inversely proportional to the initial variance $\alpha_{p,0}$. The larger the variance $\alpha_{p,0}$, the smaller the time increment $\Delta_t$, and vise versa. On the other hand, the frequency increment $\Delta_\omega$ is proportional to the variance $\alpha_{p,0}$. In other words, the larger the variance $\alpha_{p,0}$, the larger the frequency increment $\Delta_\omega$, and vice versa. And so, by permuting the values of the coarse estimate parameters, multiple sets of variable values may be generated. These additional variable sets may each be used in the linear equation derived from the closed form inner product equation (4), thereby generating corresponding additional linear equations which may be used to solve for the refined variable set, e.g., ($\alpha_p$, $t_p$, $\omega_p$).

Although in principle, any optimization algorithm may be used to refine the estimate, such as the Newton-Raphson method, the approach described herein has been found to be far better in terms of speed and stability. The generic optimization algorithms often have convergence problems in multi-dimensional optimization applications. The success and efficiency of the method presented herein hinges largely on the validity of equation (5). The method fails when different Gaussian components of the signal are too close to be separated.

As mentioned above, once the best match Gaussian window or elementary function has been determined, i.e., $h_p(t)$, the residual may be computed by $$s_{p+1}(t)=s_p(t)-B_p h_p(t)$$

where $B_p$ is the coefficient of the component corresponding to the selected best match Gaussian window. The method described herein may then be repeated to compute the next elementary function $h_{p+1}(t)[i]$. The process may be repeated iteratively until $\|s_{p+n}(t)\| > \epsilon$, where $\epsilon$ is a predetermined error threshold.

FIGS. 6A–31B—LabVIEW Virtual Instrument Set to Perform Gaussian Detection and Characterization FIGS. 6A–31B illustrate Virtual Instruments (VIs) which implement one embodiment of the present invention. The VIs comprise an example high-level implementation of one embodiment of the system and method described above. This embodiment was implemented in the National Instruments LabVIEW development environment, and comprises a LabVIEW Virtual Instrument (VI). Each VI has been implemented using the National Instruments LabVIEW graphical programming language. Each VI is presented in two parts—a configuration panel (Figure nA), and a block diagram (Figure nB).

Figure 6A:
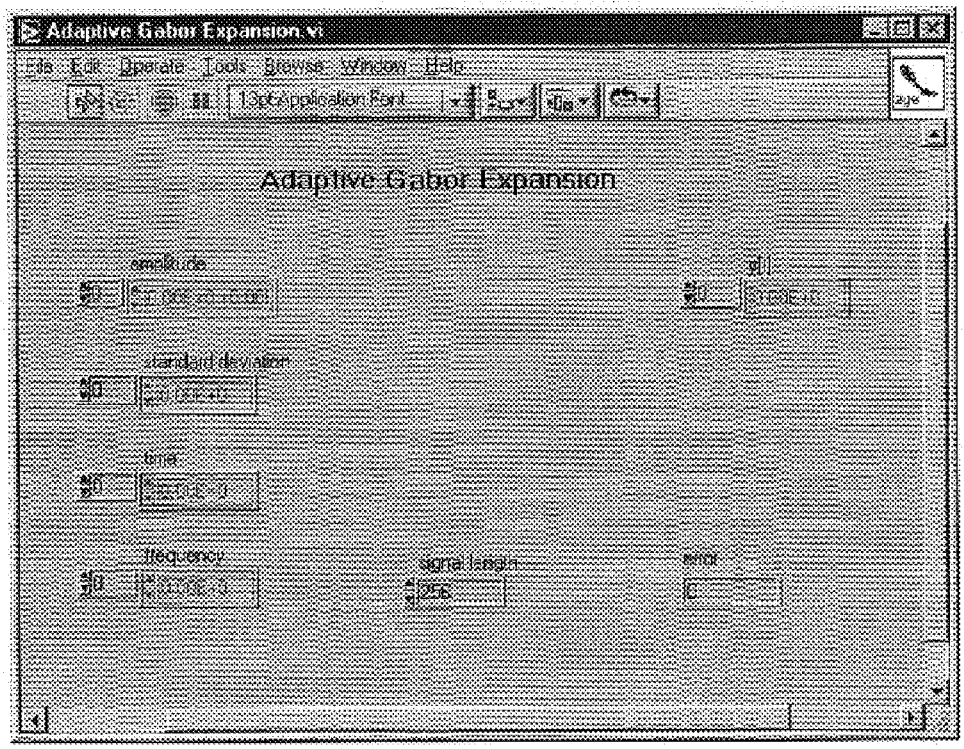
FIGS. 6A–31B illustrate an example implementation of a system for detecting and characterizing Gaussian pulses in a received signal, according to one embodiment.
Figure 6B:
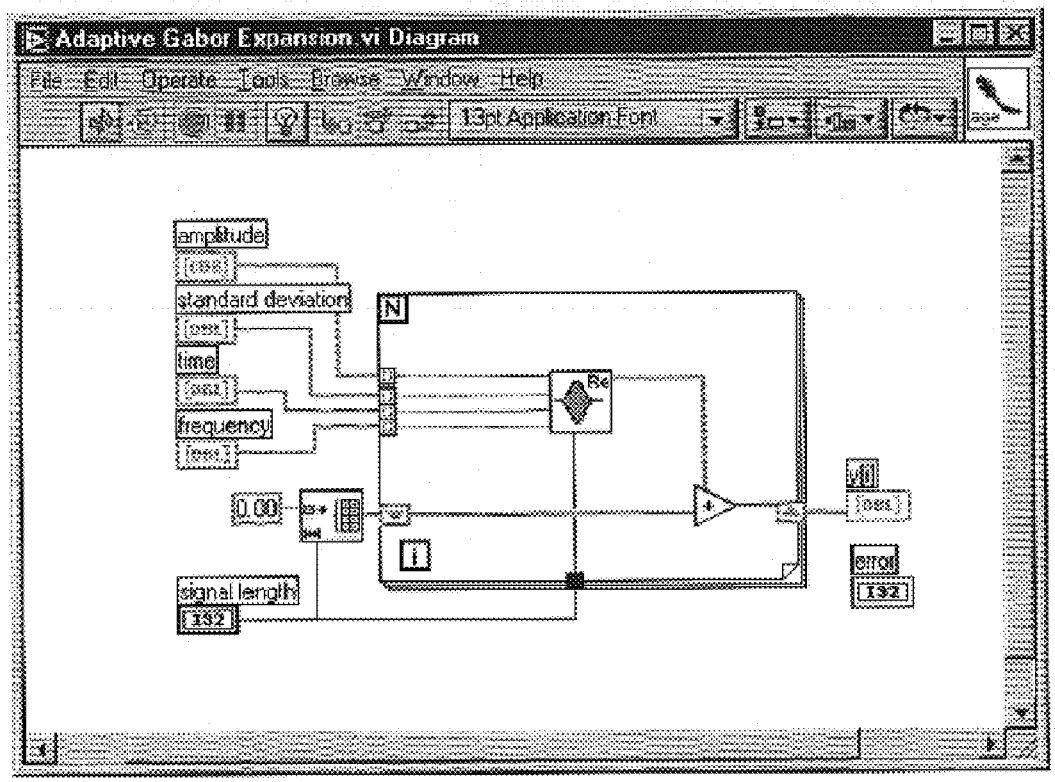

FIGS. 6A and 6B—Adaptive Gabor Expansion VI

FIGS. 6A and 6B illustrate a configuration panel and block diagram, respectively, for an Adaptive Gabor Expansion VI. The Adaptive Gabor Expansion VI uses weighted adaptive Gaussian functions to reconstruct the time waveform. The information of weights and Gaussian functions are computed by the Adaptive Gabor Transform VI.

Figure 7A:
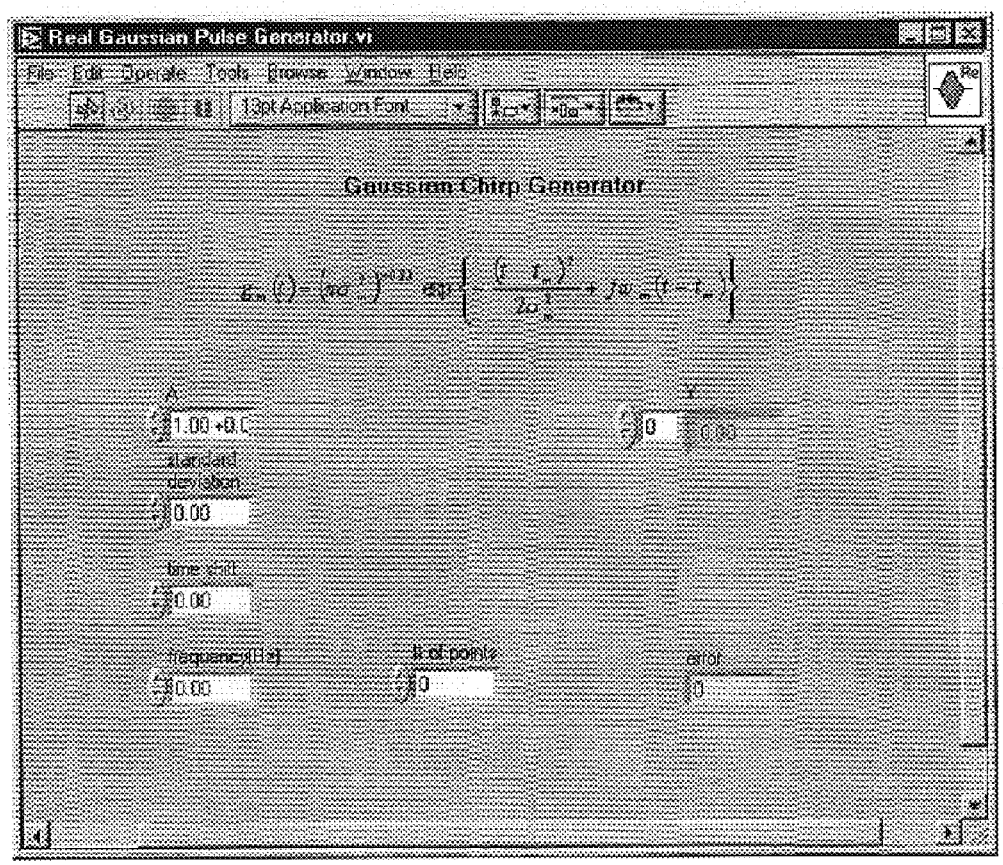
Figure 7B:
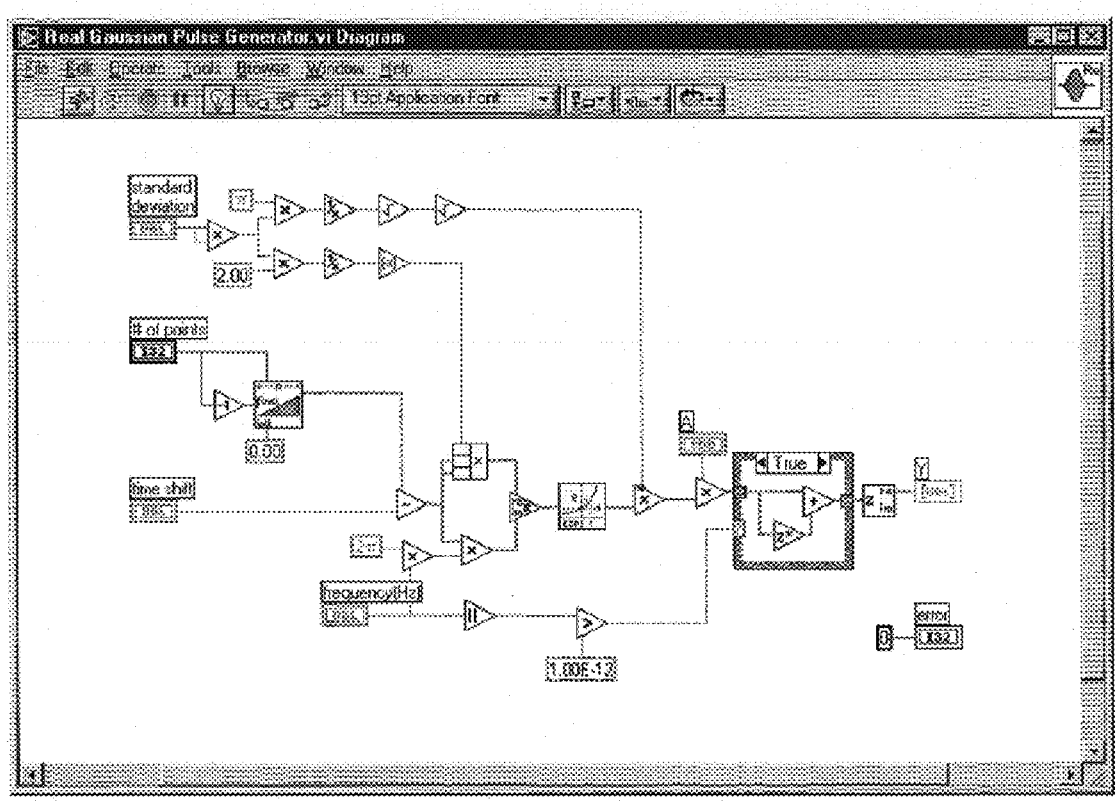

FIGS. 7A and 7B—Real Gaussian Pulse Generator VI

FIGS. A and B illustrate a configuration panel and block diagram, respectively, for a Real Gaussian Pulse Generator VI. The Real Gaussian Pulse Generator VI accepts characteristic parameters for a specified Gaussian pulse and generates the real-valued Gaussian pulse.

Figure 8A:
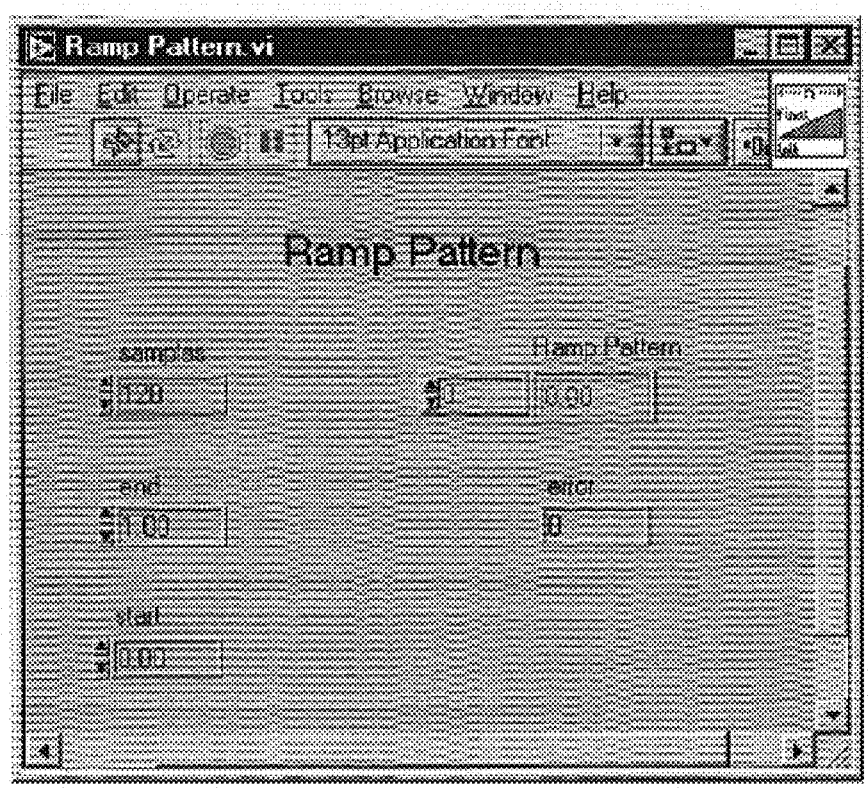
Figure 8B:
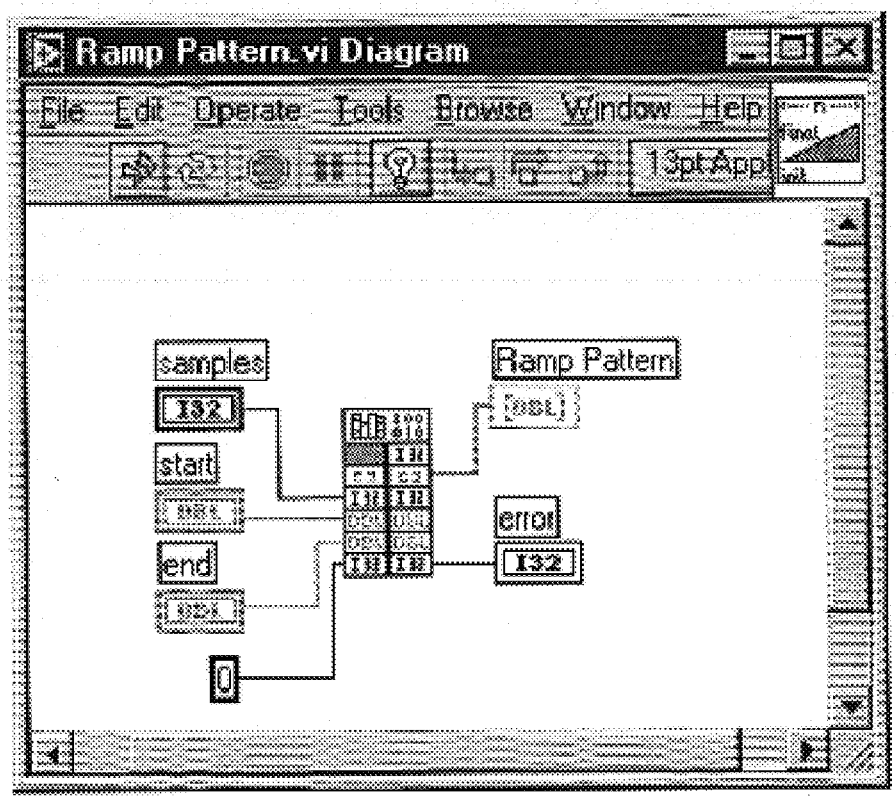

FIGS. 8A and 8B—Ramp Pattern VI

FIGS. A and B illustrate a configuration panel and block diagram, respectively, for a Ramp Pattern VI. The Ramp Pattern VI generates an array containing a ramp pattern.

Figure 9A:
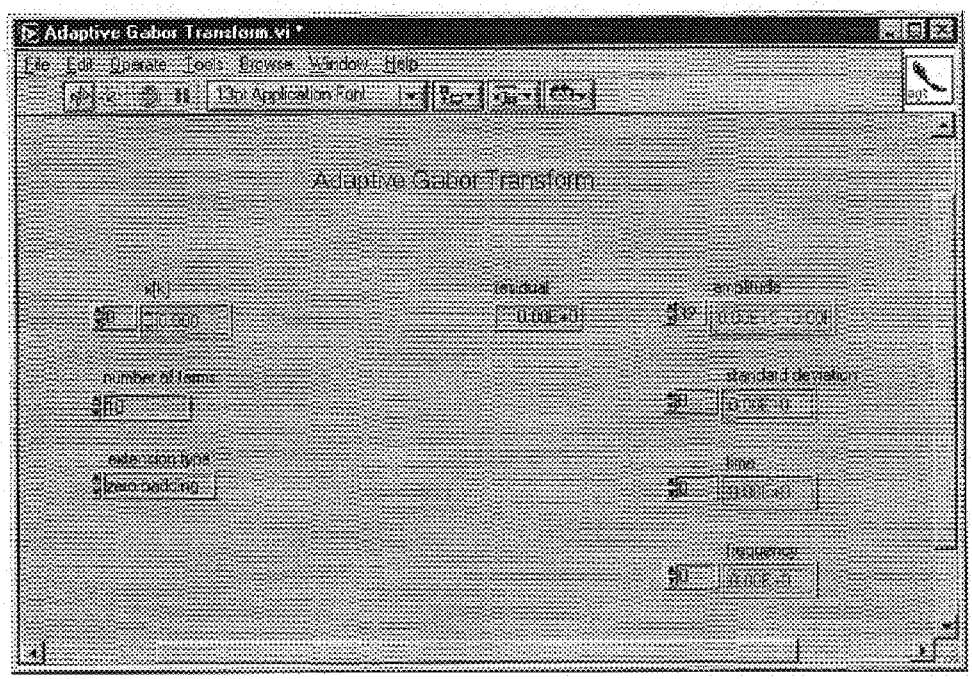
Figure 9B:
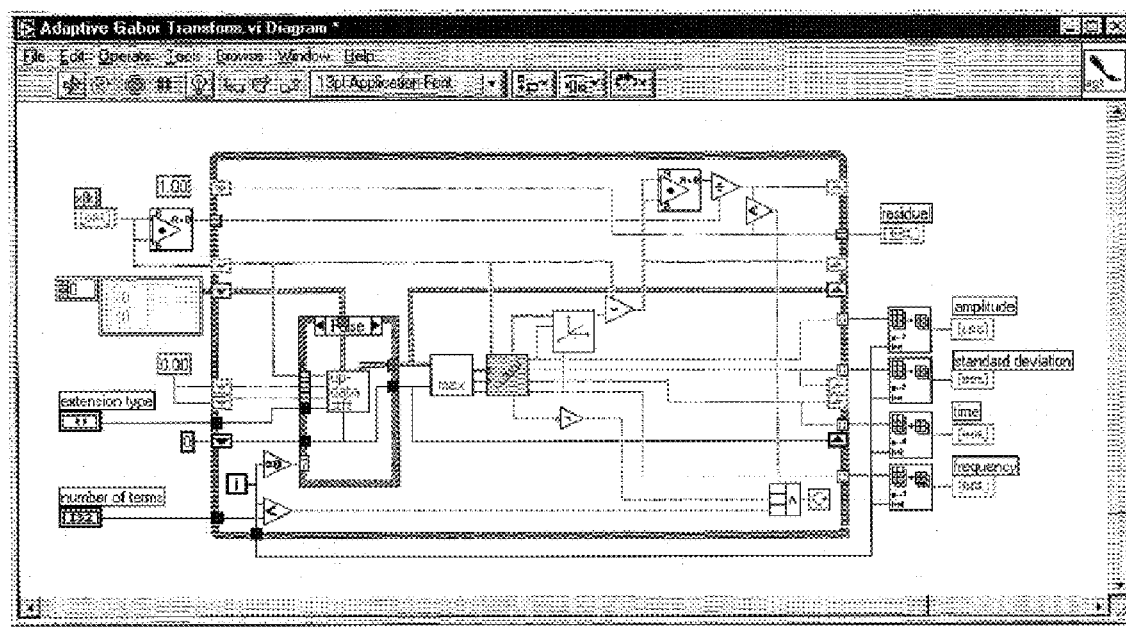

FIGS. 9A and 9B—Adaptive Gabor Transform VI

FIGS. 9A and 9B illustrate a configuration panel and block diagram, respectively, for an Adaptive Gabor Transform VI. The Adaptive Gabor Transform VI performs an Adaptive Gabor Transform of an input sequence.

Figure 10A:
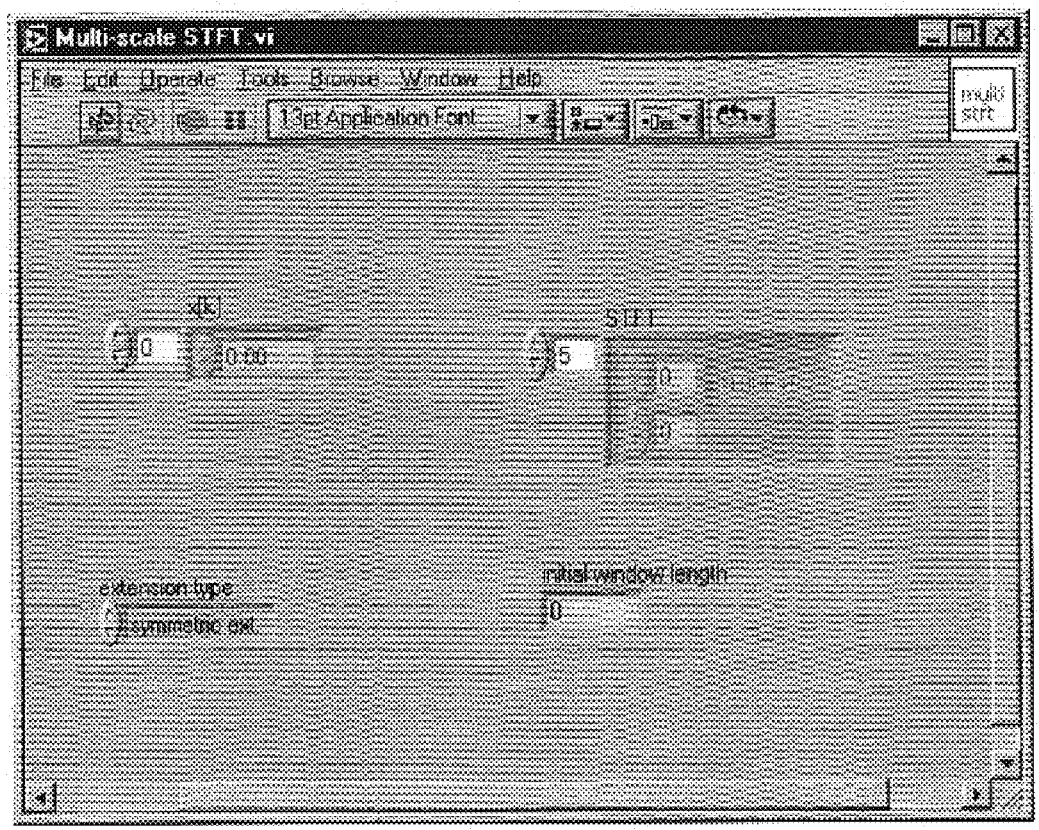
Figure 10B:
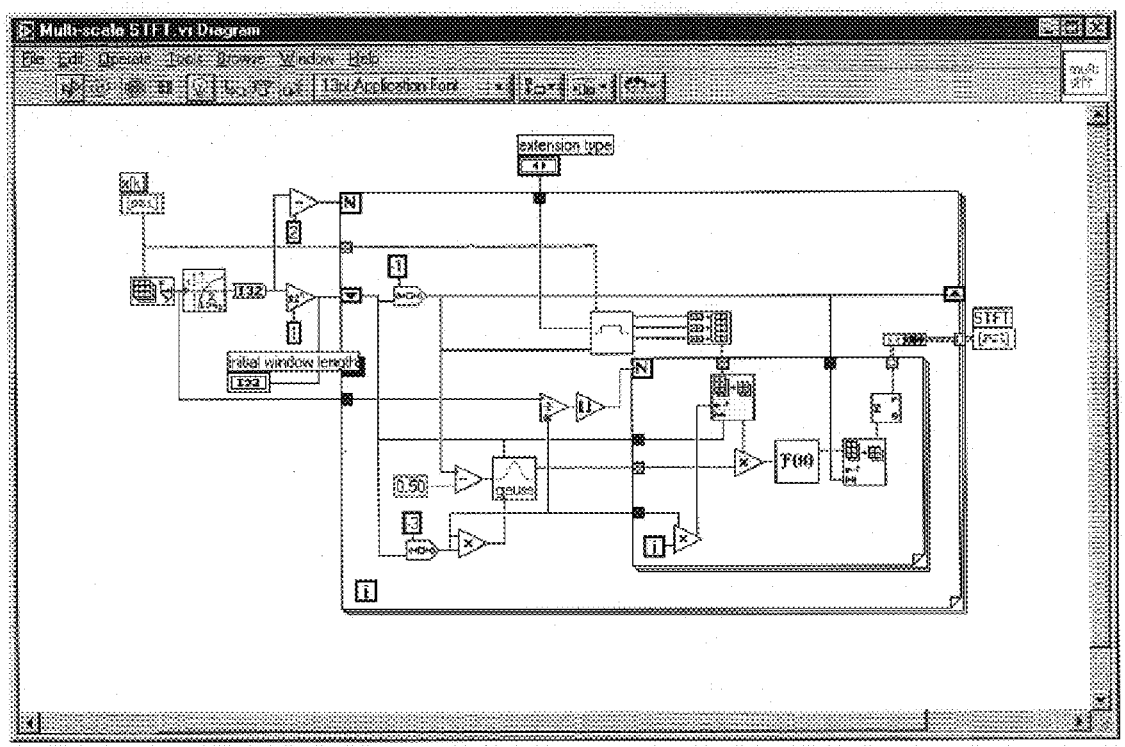

FIGS. 10A and 10B—Multi-Scale STFT VI

FIGS. 10A and 10B illustrate a configuration panel and block diagram, respectively, for a Multi-Scale STFT VI. The Multi-Scale STFT VI performs a multi-scale windowed Fourier Transform of an input sequence.

Figure 11A:
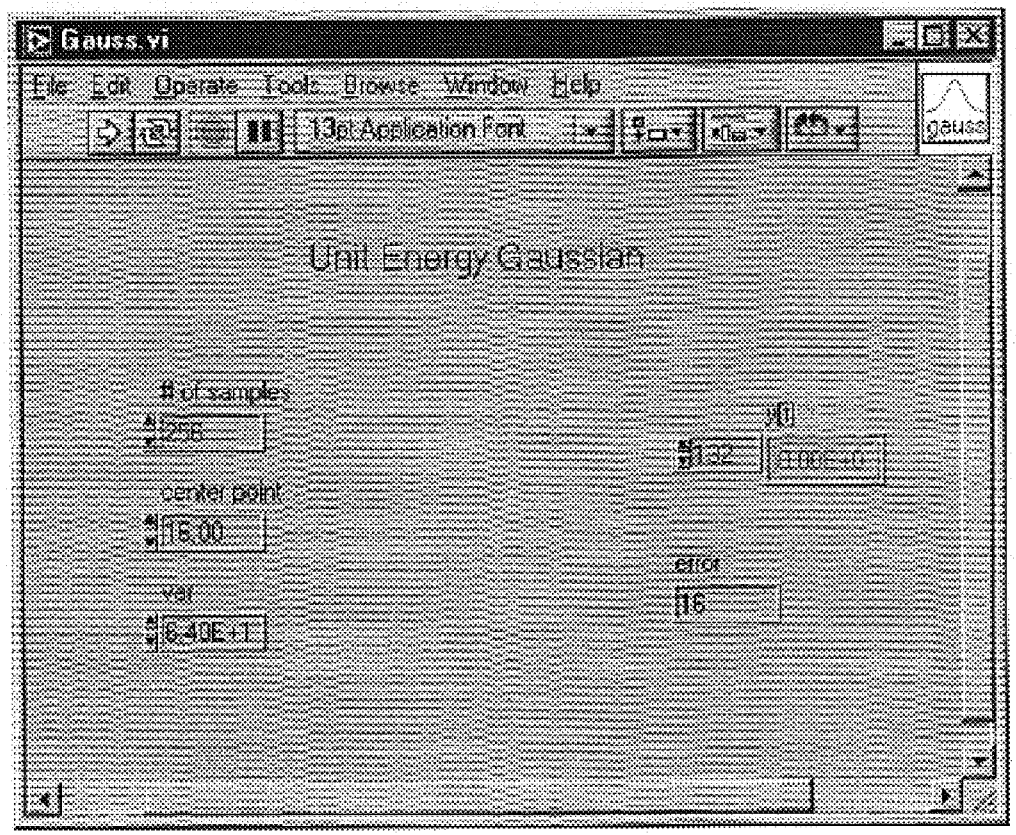
Figure 11B:
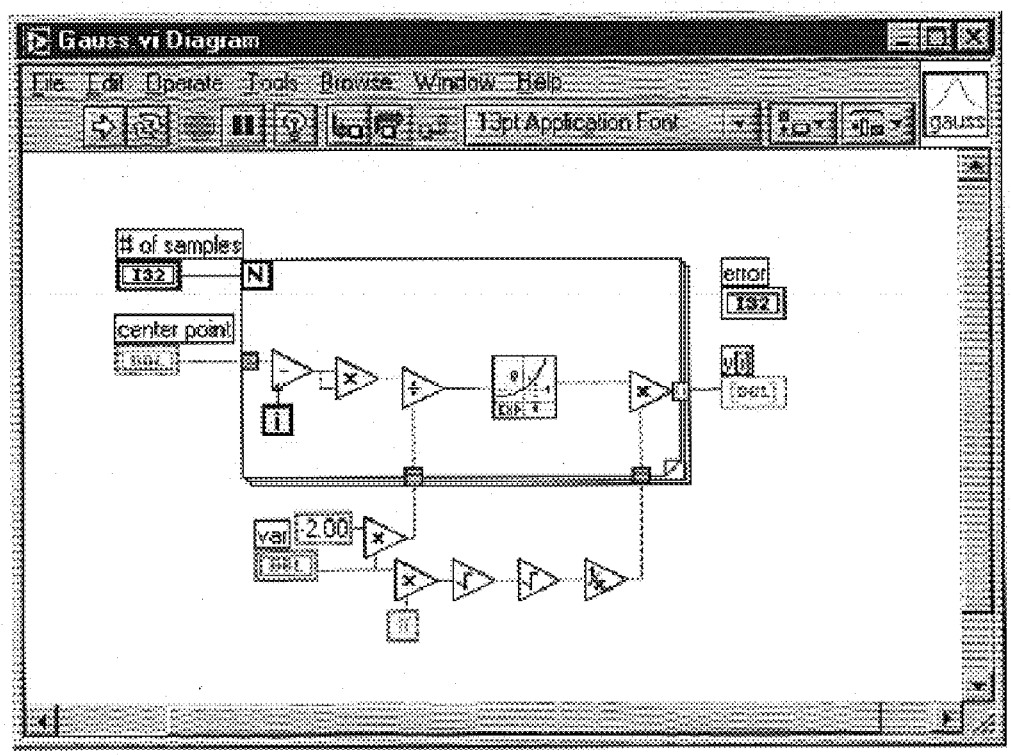

FIGS. 11A and 11B—Unit Energy Gaussian VI

FIGS. 11A and 11B illustrate a configuration panel and block diagram, respectively, for a Unit Energy Gaussian VI.

Figure 12A:
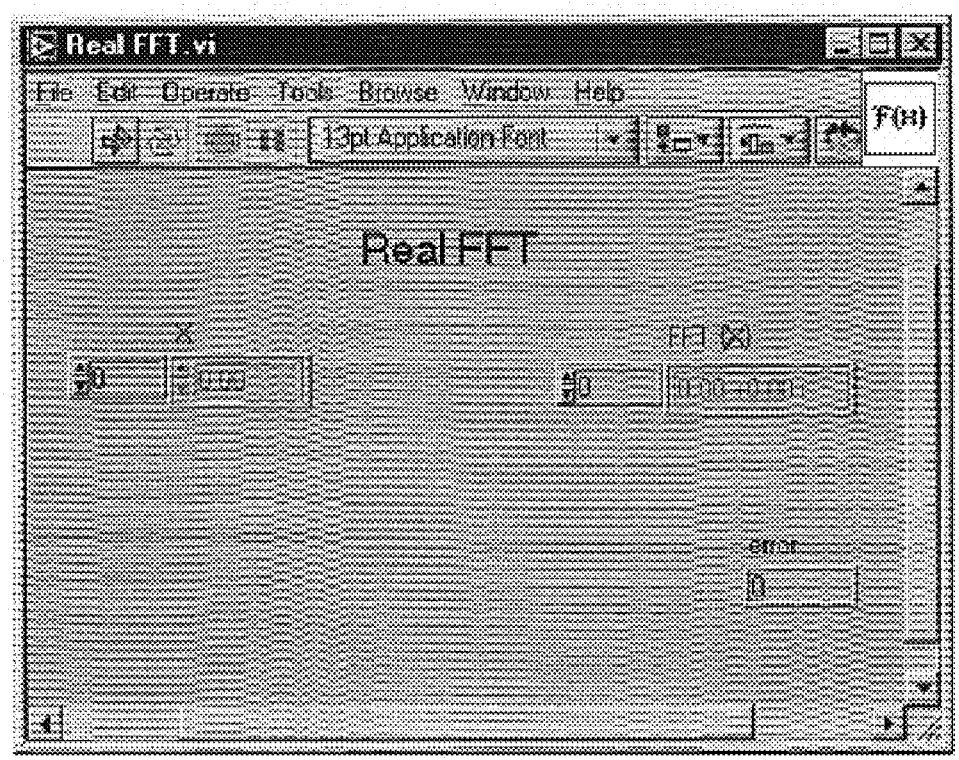
Figure 12B:
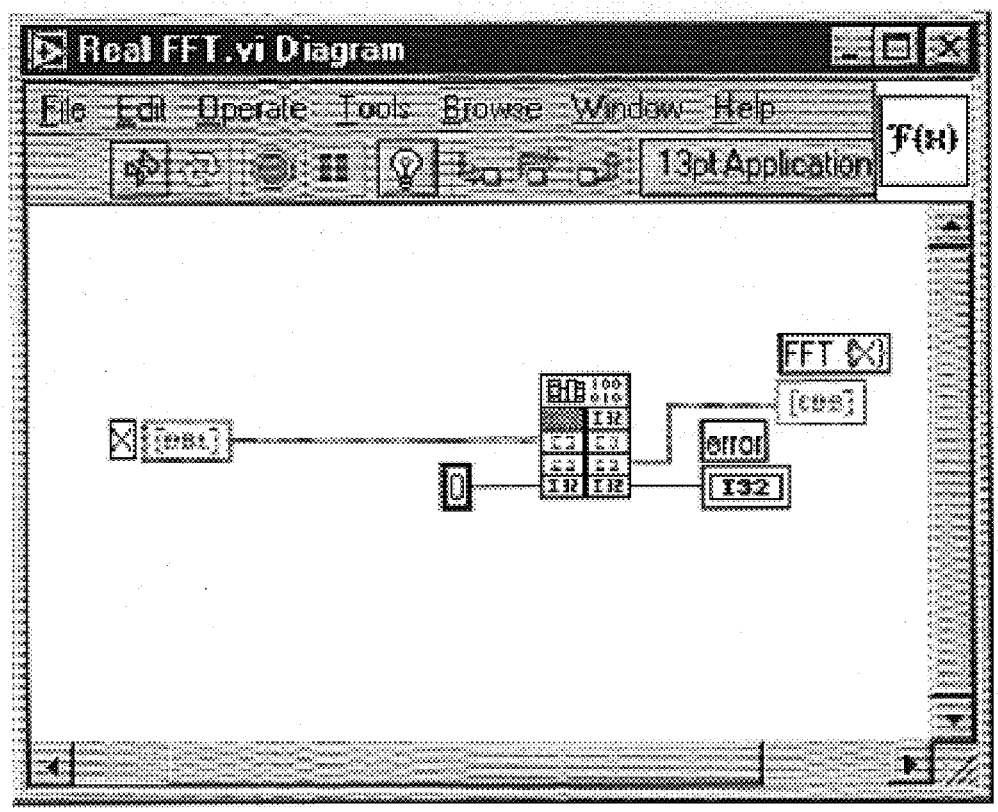

FIGS. 12A and 12B—Real FFT VI

FIGS. 12A and 12B illustrate a VI configuration panel and block diagram, respectively, for a Real FFT VI. The Real FFT VI computes a Real Fast Fourier Transform or a Real Discrete Fourier Transform of an input sequence.

Figure 13A:
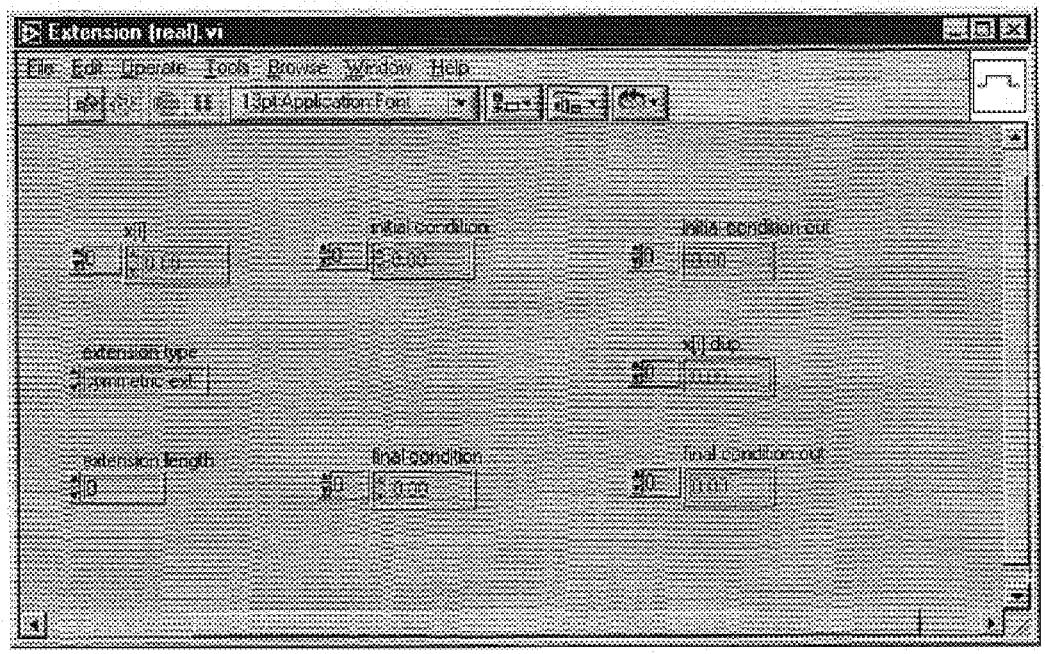
Figure 13B:
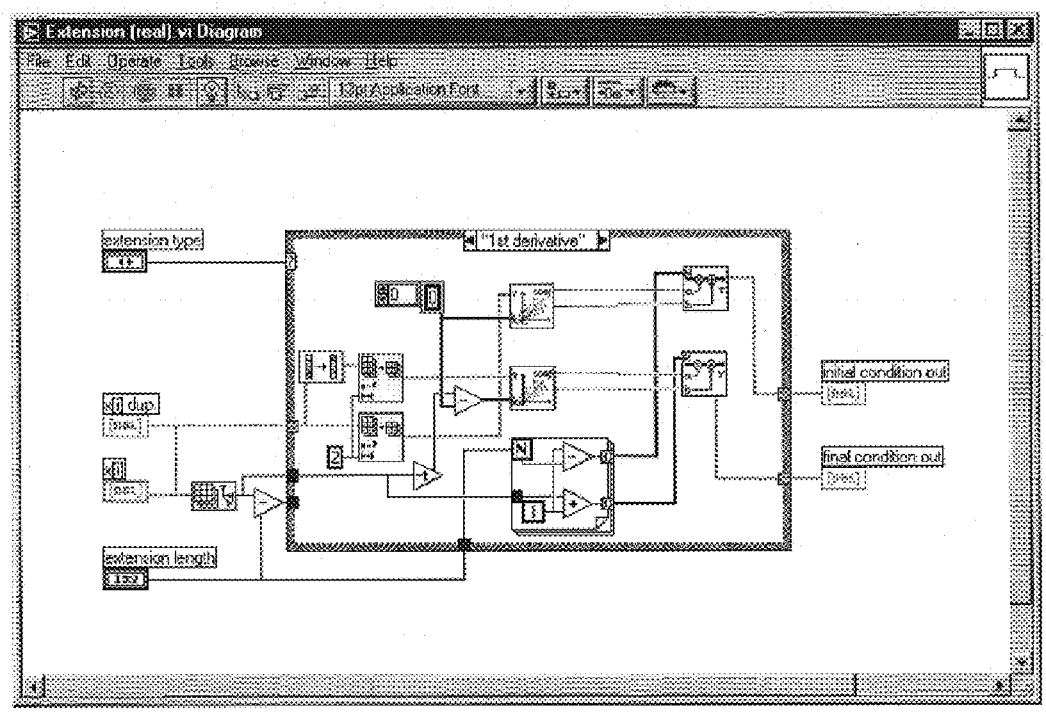

FIGS. 13A and 13B—Extension (real) VI

FIGS. 13A and 13B illustrate a configuration panel and block diagram, respectively, for an Extension (real) VI. The Extension (real) VI generates extended data for an input sequence subject to specified constraints.

Figure 14A:
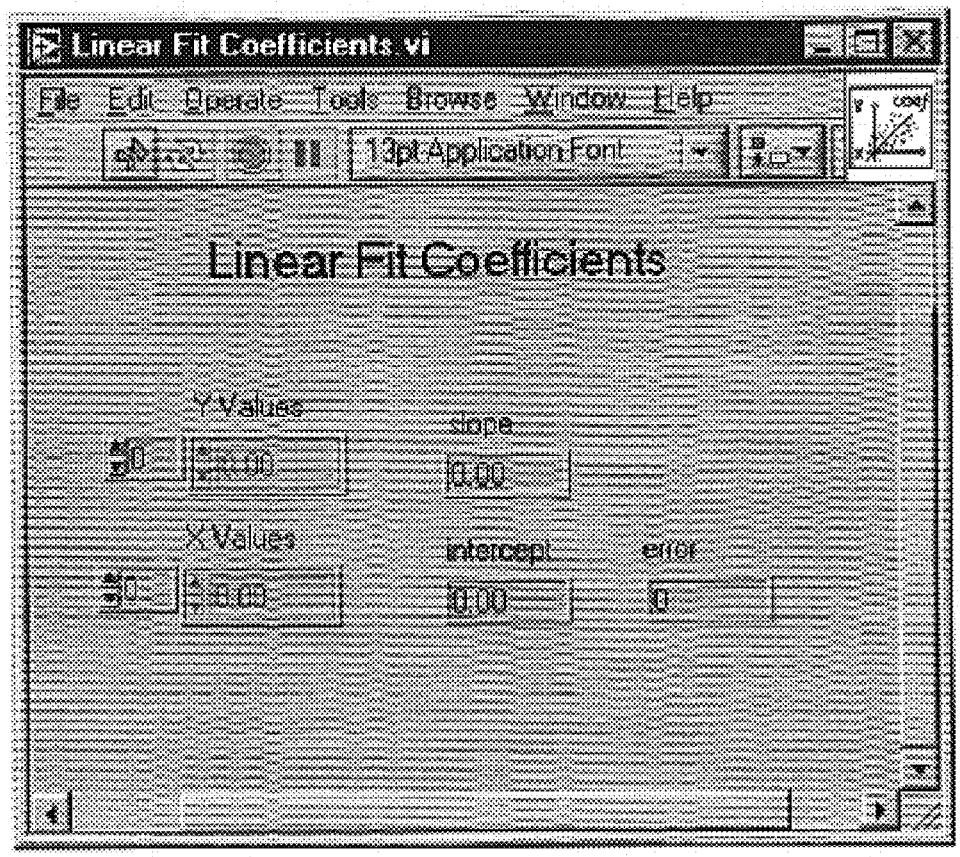
Figure 14B:
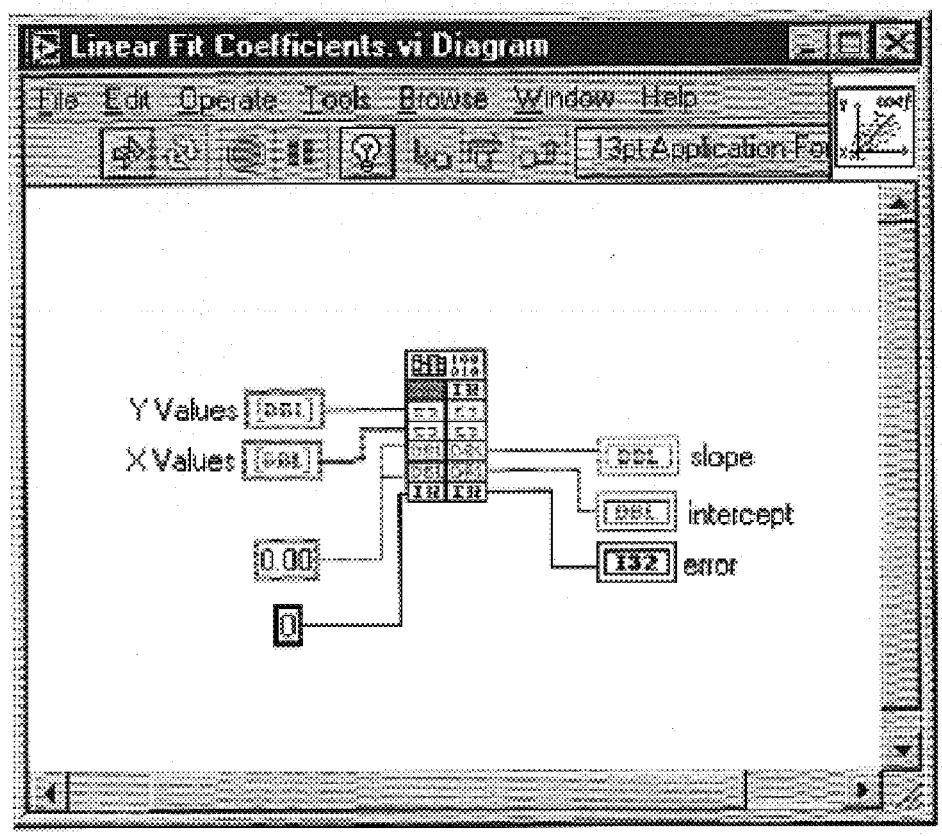

FIGS. 14A and 14B—Linear Fit Coefficients VI

FIGS. 14A and 14B illustrate a configuration panel and block diagram, respectively, for a Linear Fit Coefficients VI. The Linear Fit Coefficients VI finds the set of linear coefficients, i.e., slope and intercept, which describe the line that best represents an input data set.

Figure 15A:
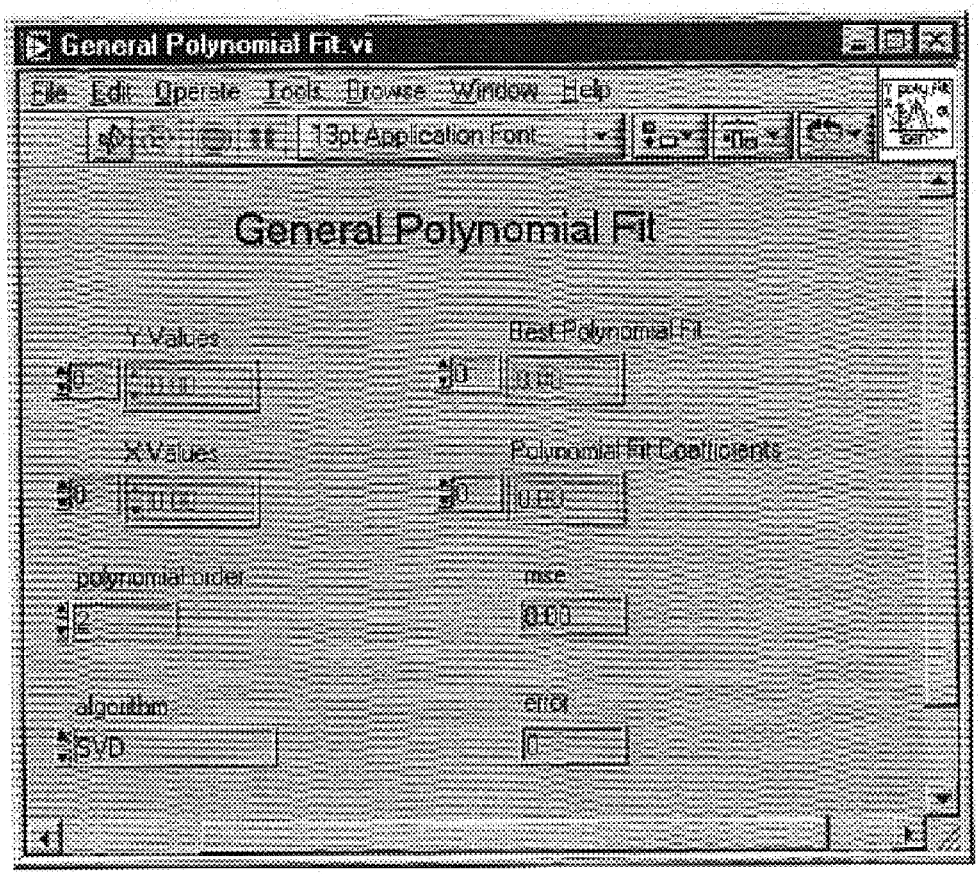
Figure 15B:
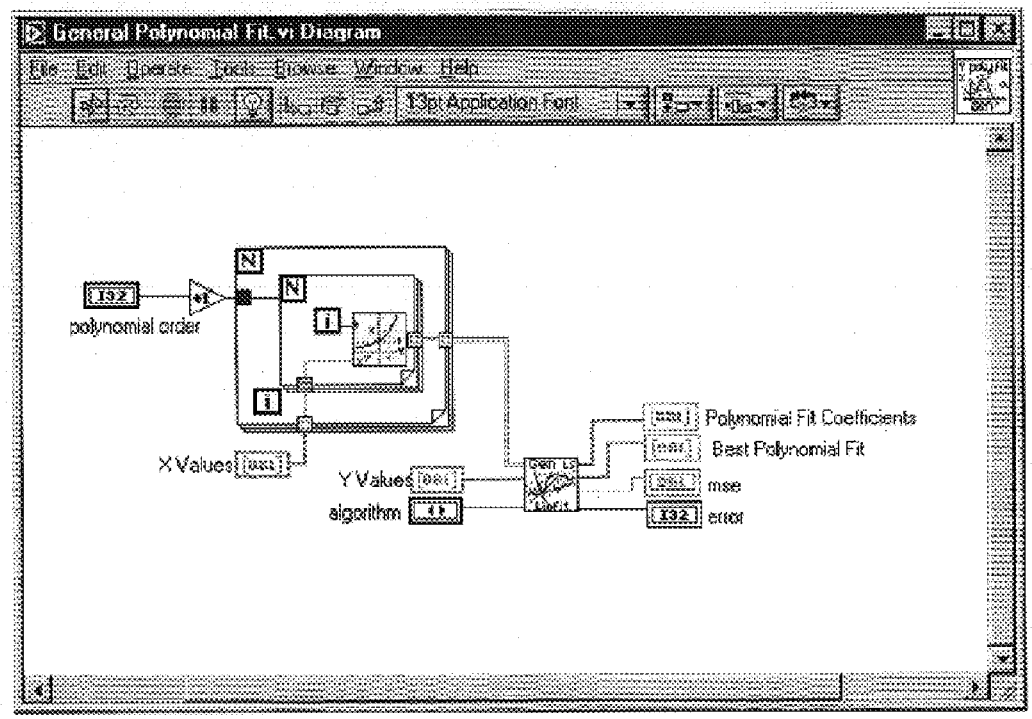

FIGS. 15A and 15B—General Polynomial Fit VI

FIGS. 15A and 15B illustrate a configuration panel and block diagram, respectively, for a General Polynomial Fit VI. The General Polynomial Fit VI finds the polynomial curve values and the set of Polynomial Fit Coefficients which describe the polynomial curve that best represents an input data set.

Figure 16A:
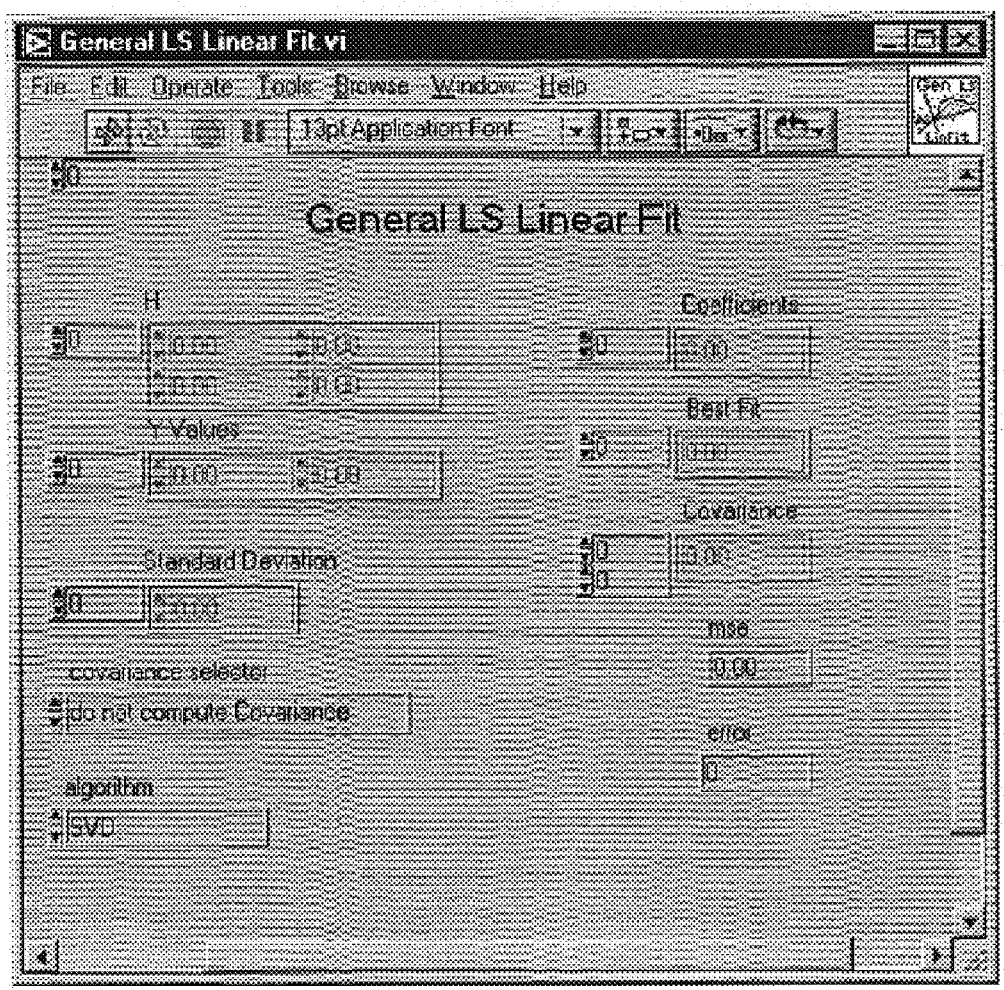
Figure 16B:
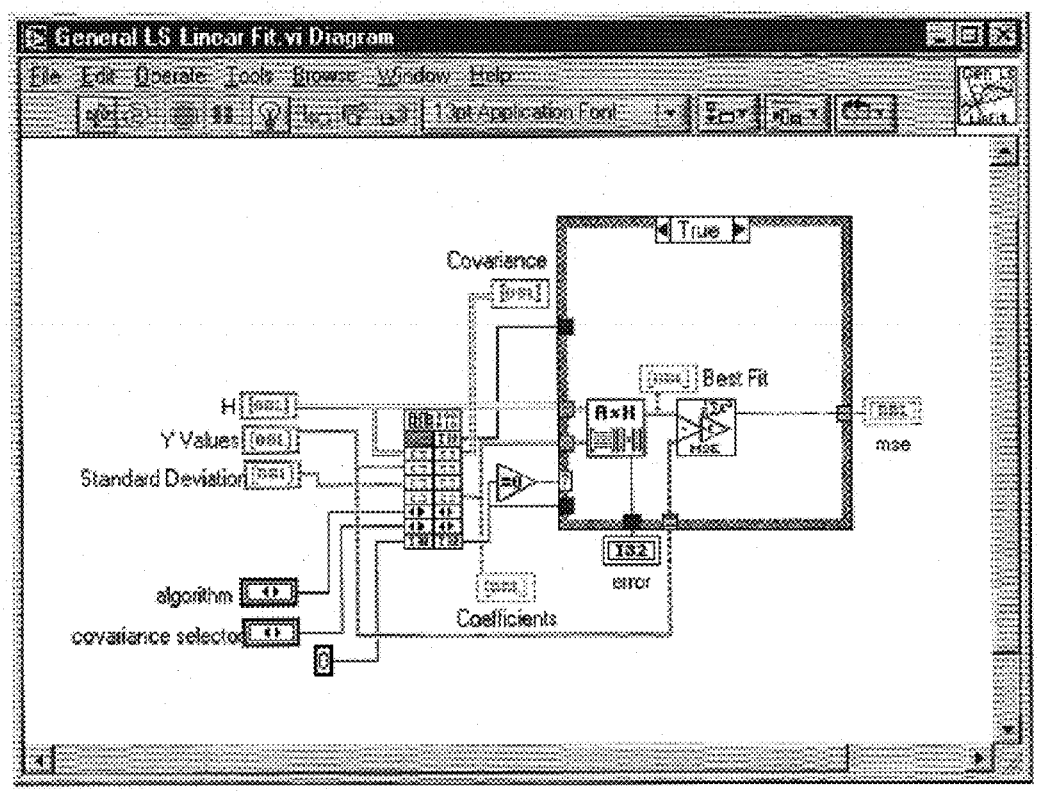

FIGS. 16A and 16B—General LS Linear Fit VI

FIGS. 16A and 16B illustrate a configuration panel and block diagram, respectively, for a General LS Linear Fit VI. The General LS Linear Fit VI finds the k-dimension linear curve values and the set of k-dimension linear fit coefficients which describe the k-dimension linear curve that best represents an input data set using the least-squares method.

Figure 17A:
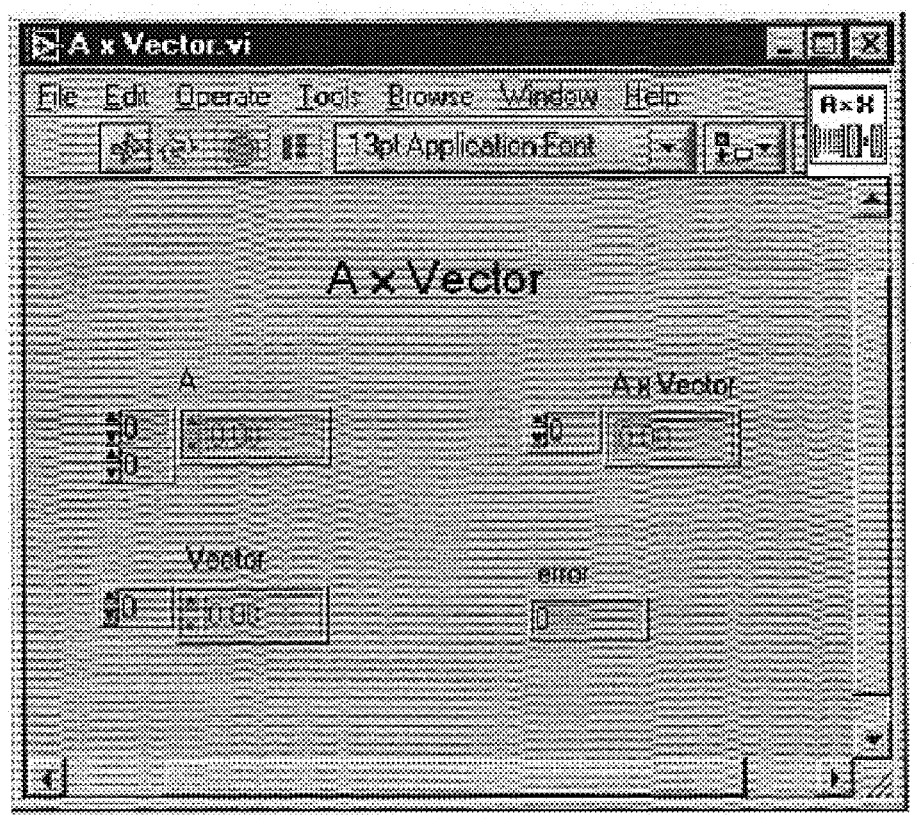
Figure 17B:
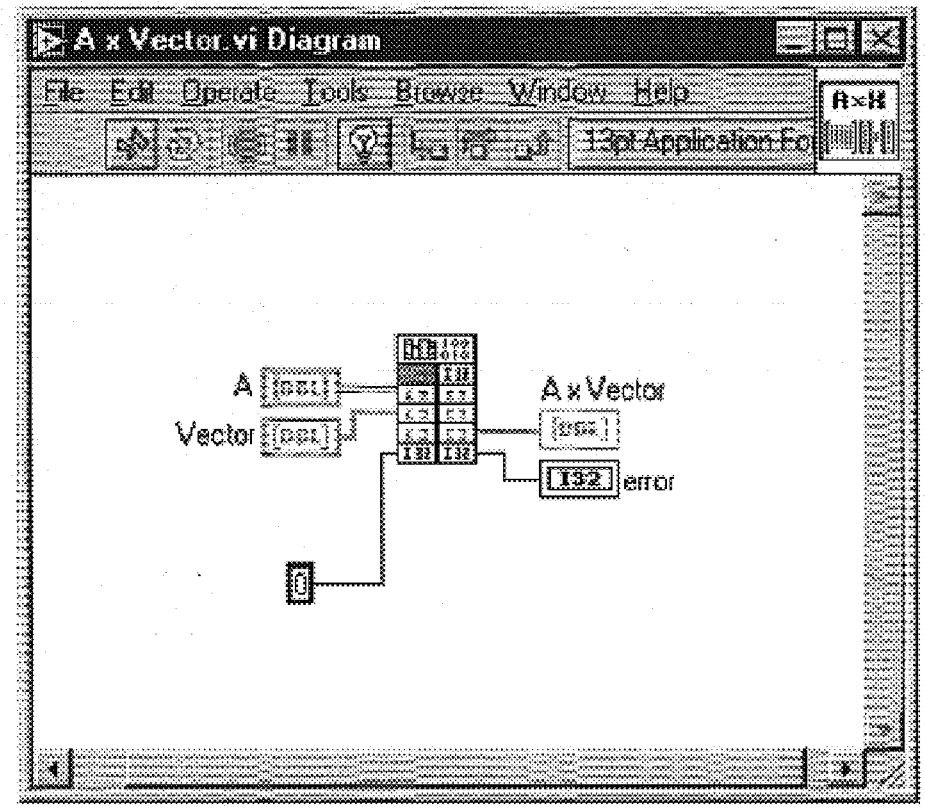

FIGS. 17A and 17B—A×Vector VI

FIGS. 17A and 17B illustrate a configuration panel and block diagram, respectively, for an A×Vector VI. The A×Vector VI performs a multiplication of an input matrix and an input vector.

Figure 18A:
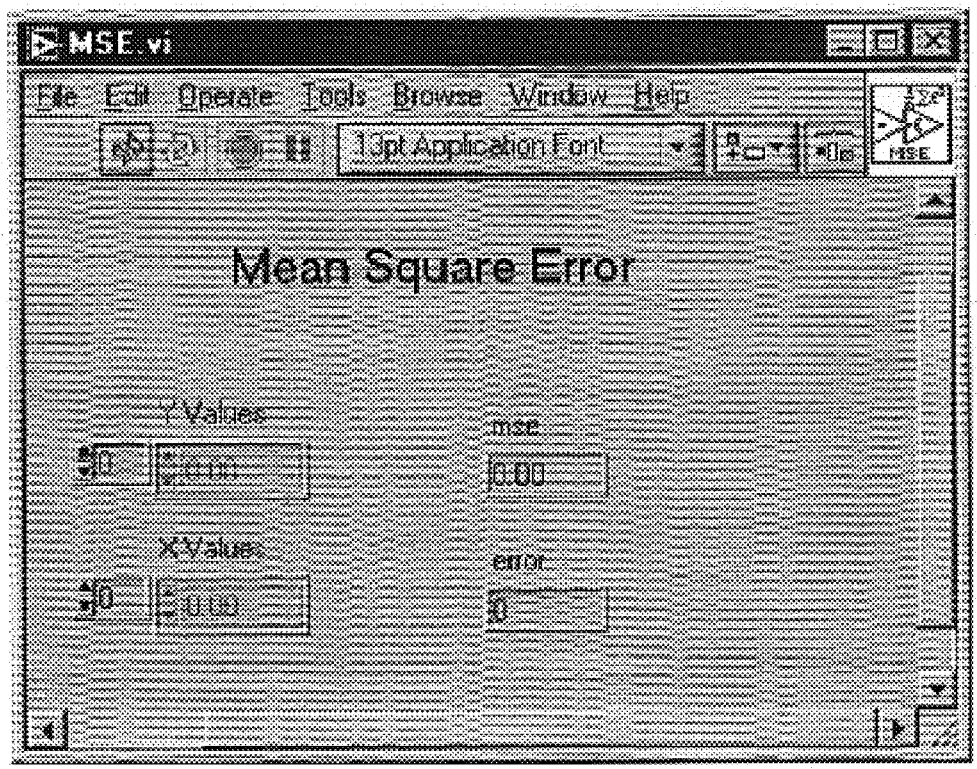
Figure 18B:
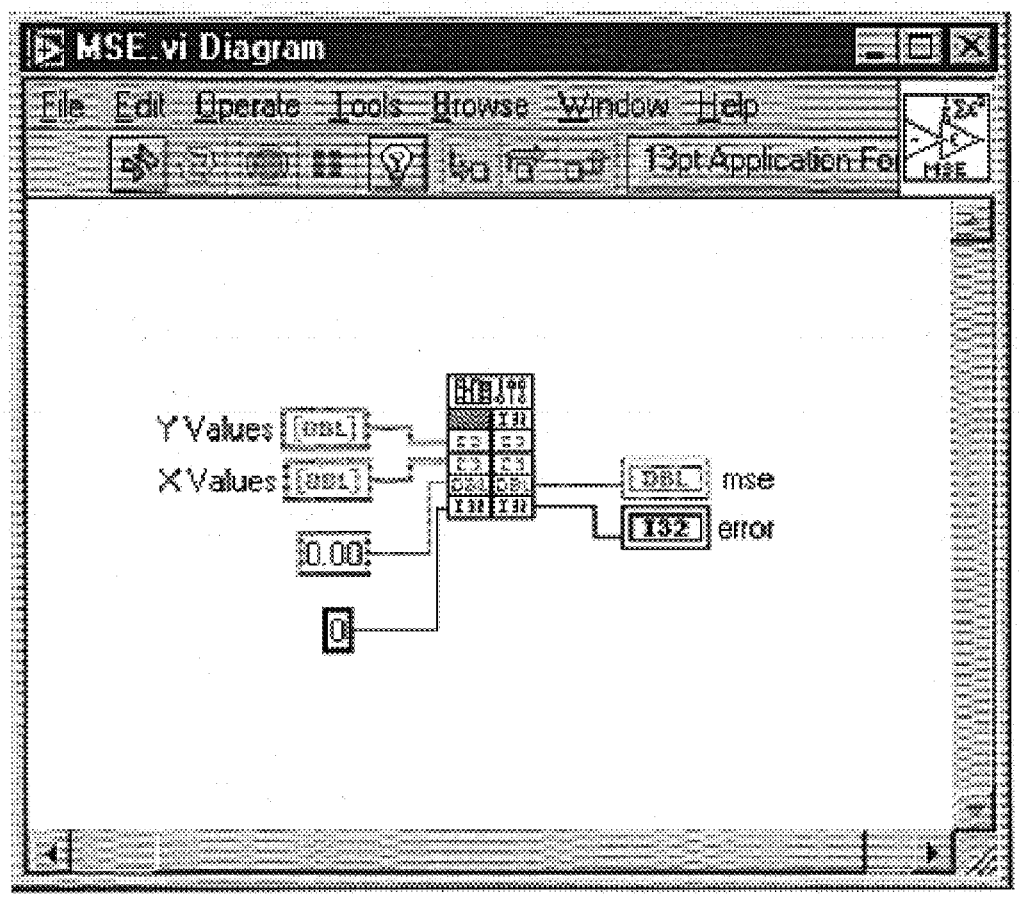

FIGS. 18A and 18B—Mean Square Error VI

FIGS. 18A and 18B illustrate a configuration panel and block diagram, respectively, for a Mean Square Error VI. The Mean Square Error VI computes the mean squared error of input sequences X and Y.

Figure 19A:
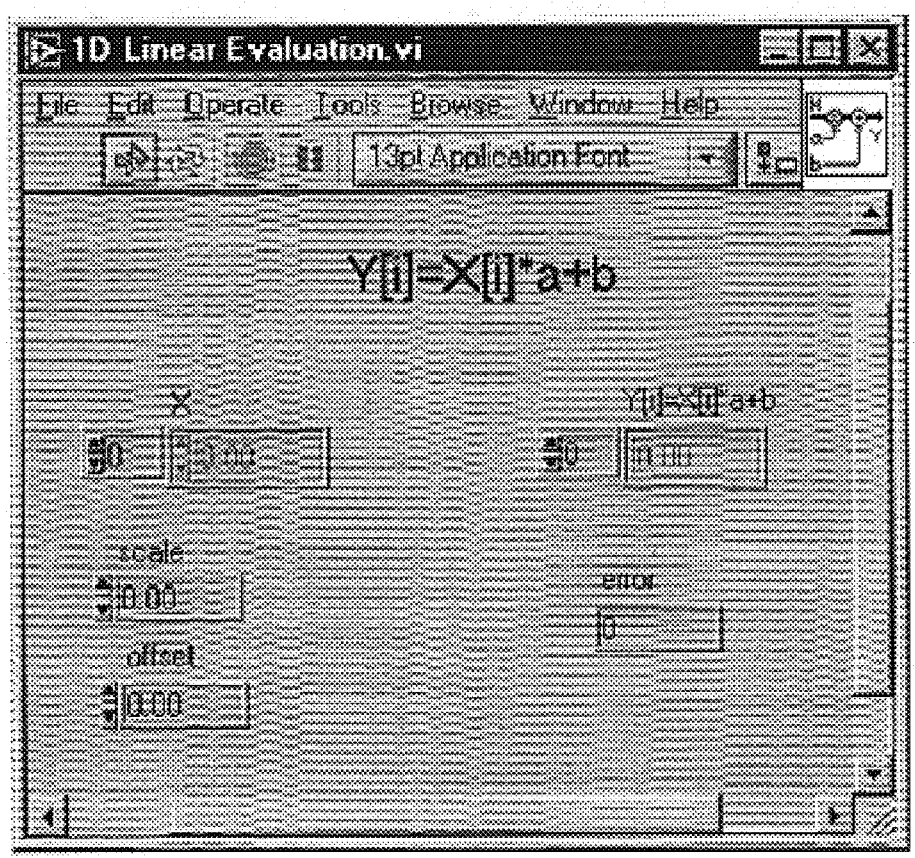
Figure 19B:
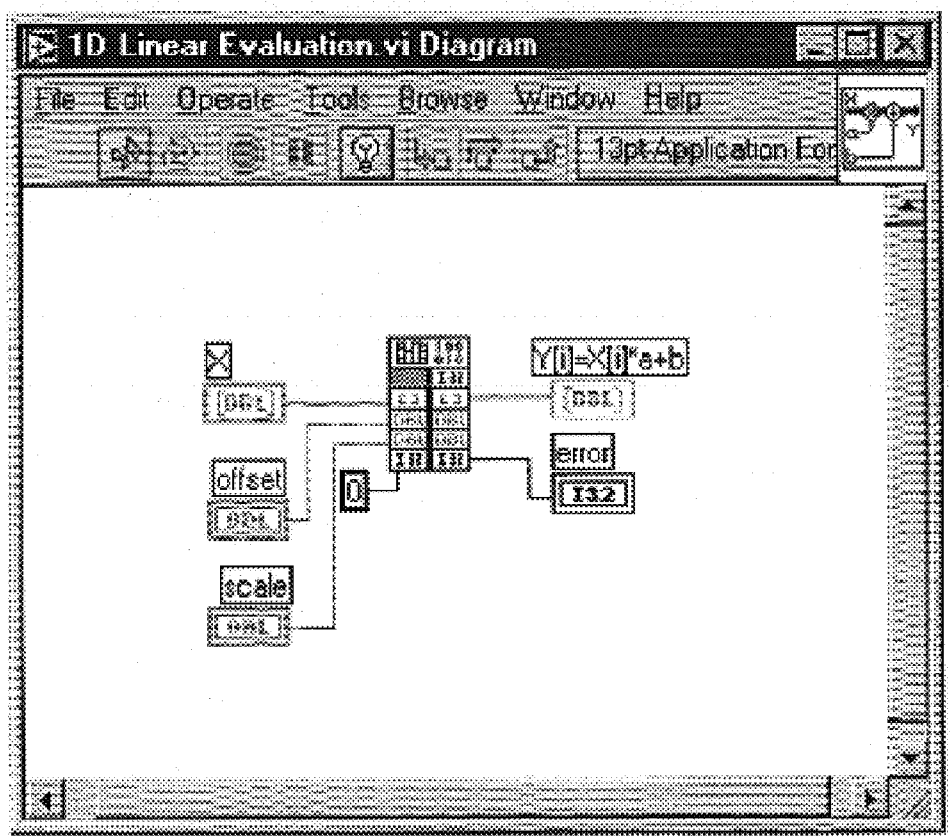

FIGS. 19A and 19B—1D Linear Evaluation VI

FIGS. 19A and 19B illustrate a configuration panel and block diagram, respectively, for a 1D Linear Evaluation VI. The 1D Linear Evaluation VI performs a linear evaluation of an input array.

Figure 20A:
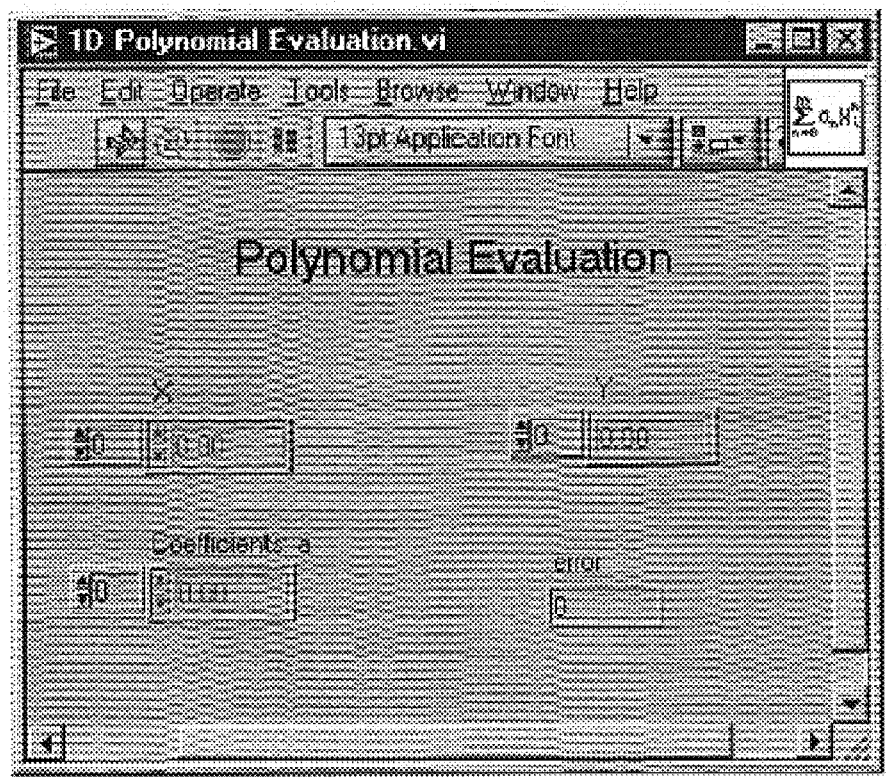
Figure 20B:
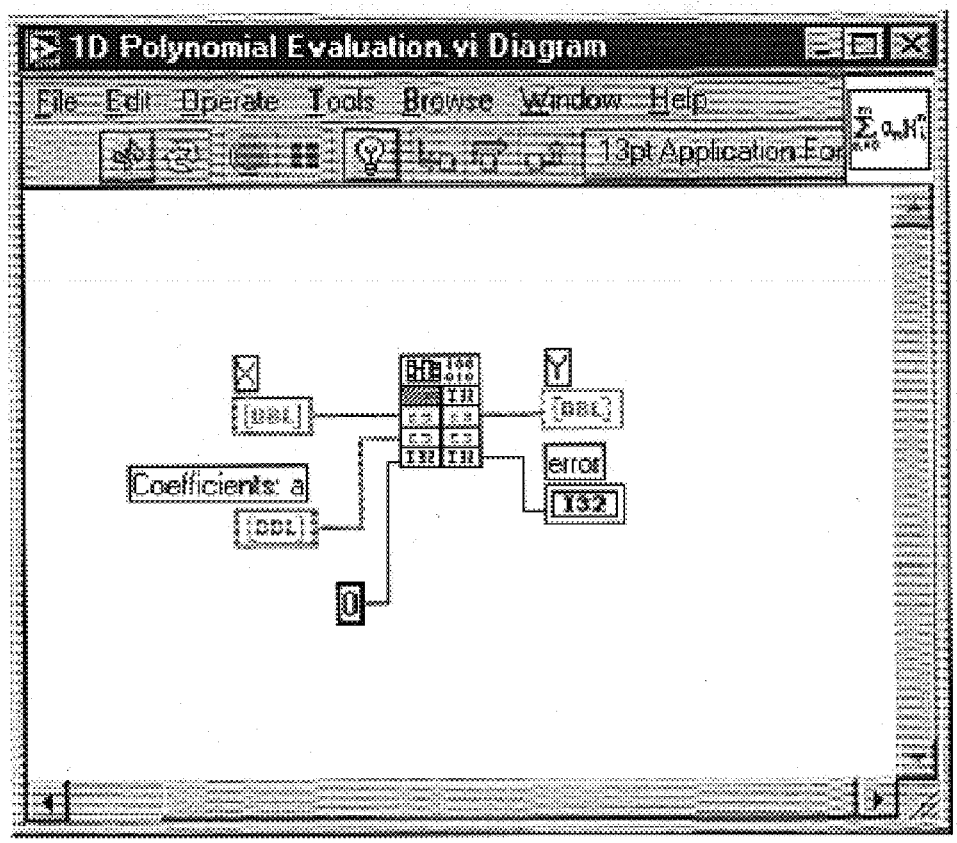

FIGS. 20A and 20B—1D Polynomial Evaluation VI

FIGS. 20A and 20B illustrate a configuration panel and block diagram, respectively, for a 1D Polynomial Evaluation VI. The 1D Polynomial Evaluation VI performs a polynomial evaluation of an input data set X using coefficients a.

Figure 21A:
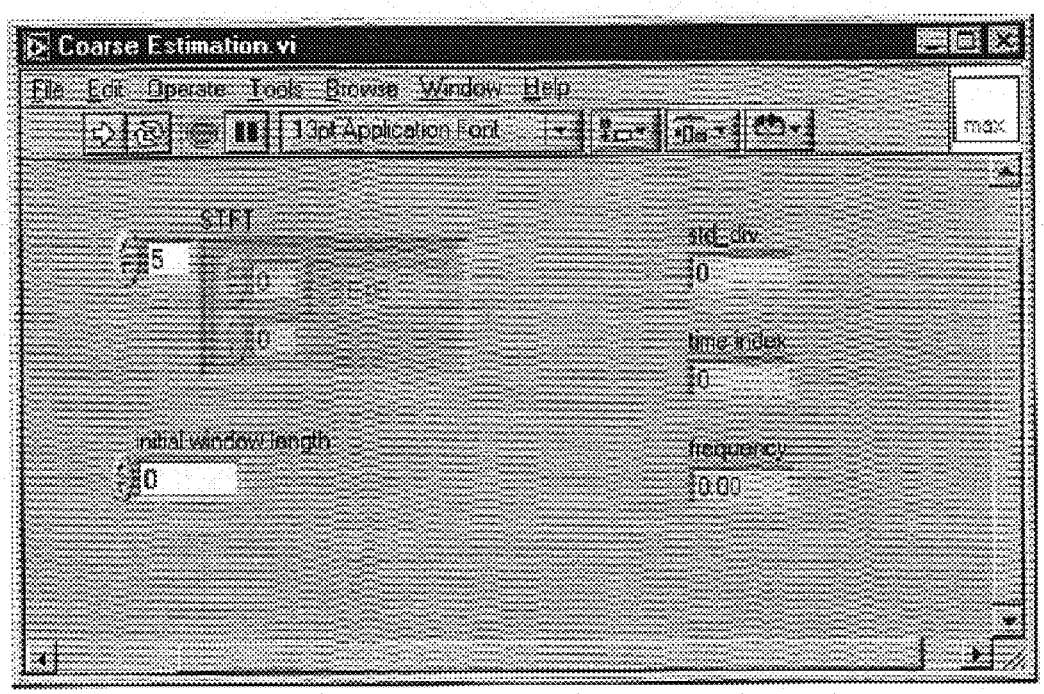
Figure 21B:
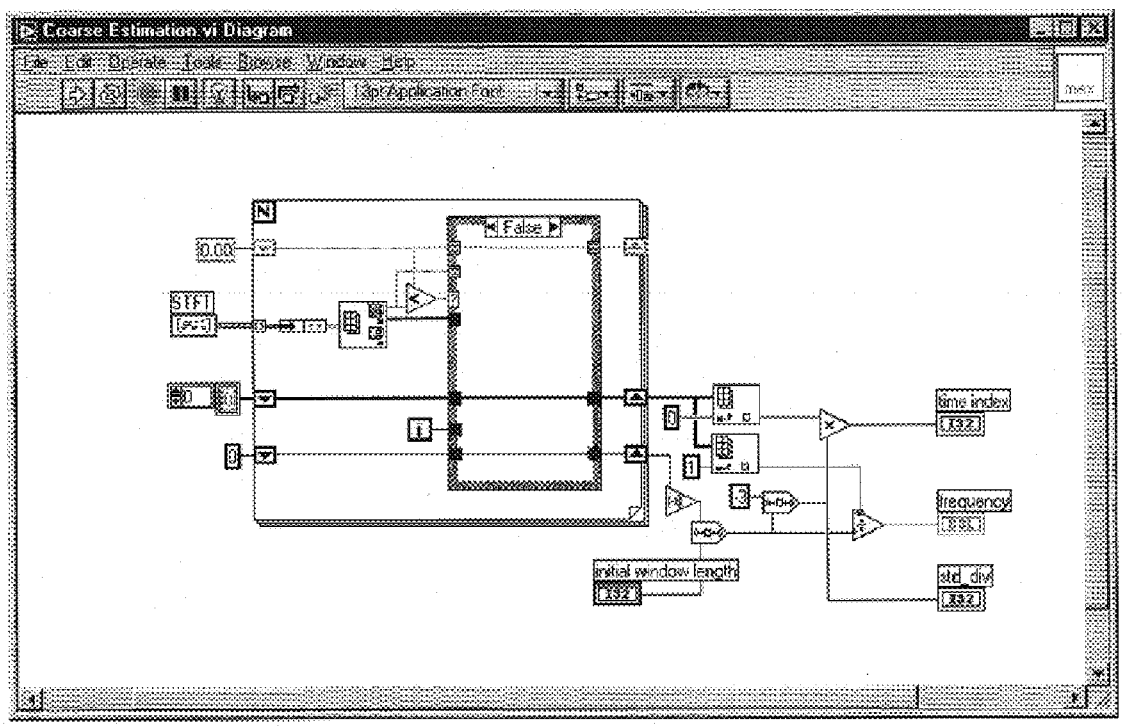

FIGS. 21A and 21B—Coarse Estimation VI

FIGS. 21A and 21B illustrate a configuration panel and block diagram, respectively, for a Coarse Estimation VI. The Coarse Estimation VI generates a coarse estimation for an input sequence. The coarse estimation comprises a set of characteristic parameters which specify a Gaussian pulse.

Figure 22A:
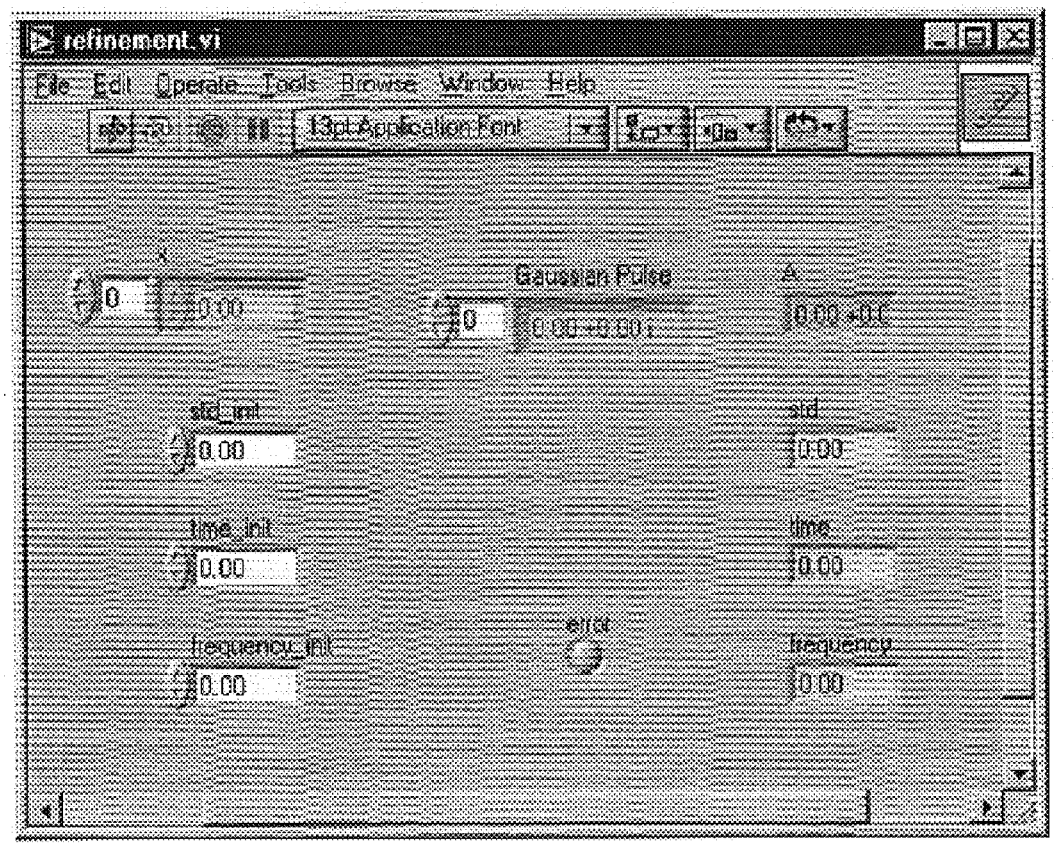
Figure 22B:
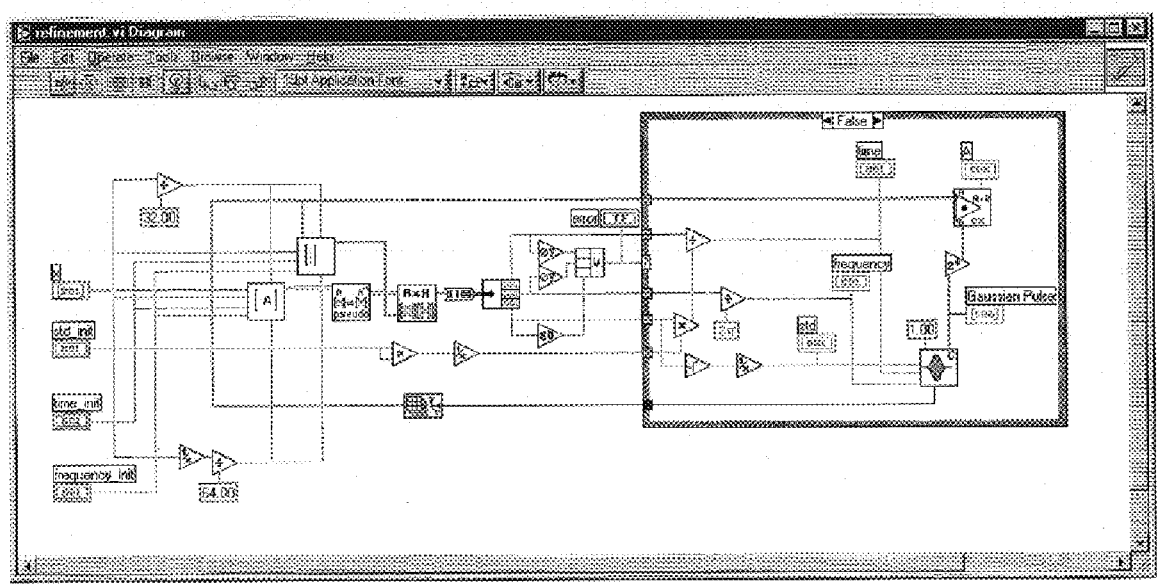

FIGS. 22A and 22B—Refinement VI

FIGS. 22A and 22B illustrate a configuration panel and block diagram, respectively, for a Refinement VI. The Refinement VI generates a refined Gaussian pulse estimation from a received coarse estimation.

Figure 23A:
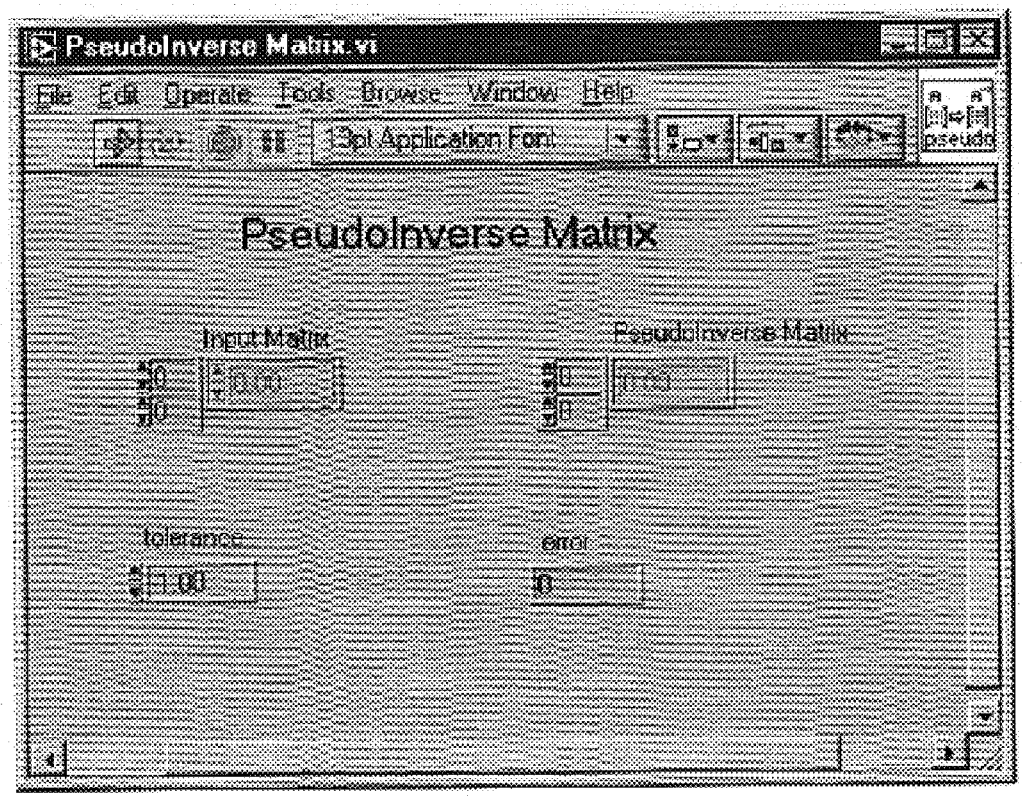
Figure 23B:
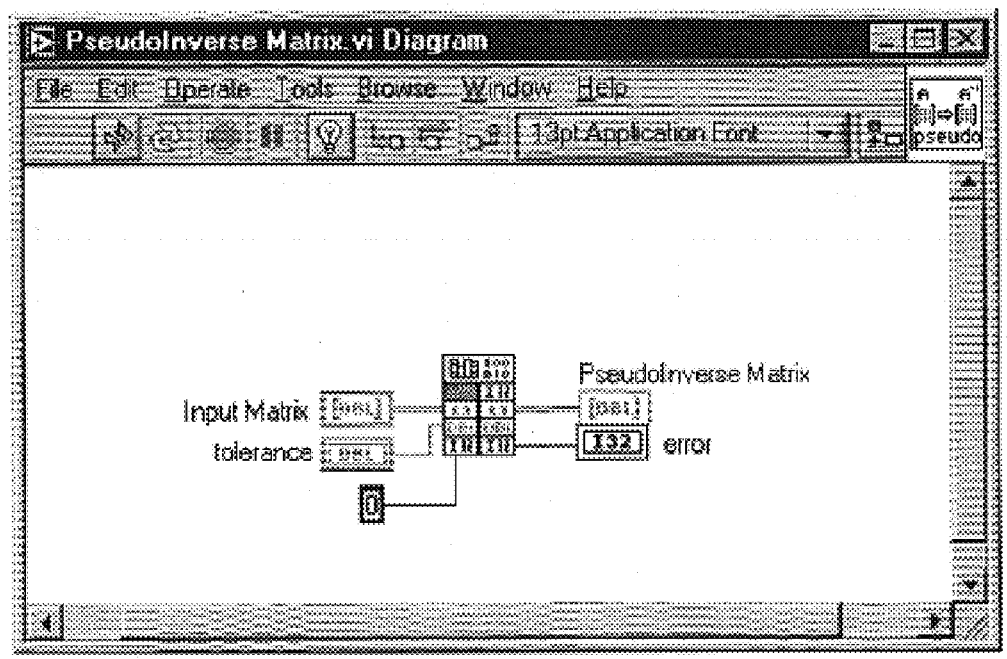

FIGS. 23A and 23B—PseudoInverse VI

FIGS. 23A and 23B illustrate a configuration panel and block diagram, respectively, for a PseudoInverse VI. The PseudoInverse VI finds a pseudo-inverse matrix of a rectangular real matrix.

Figure 24A:
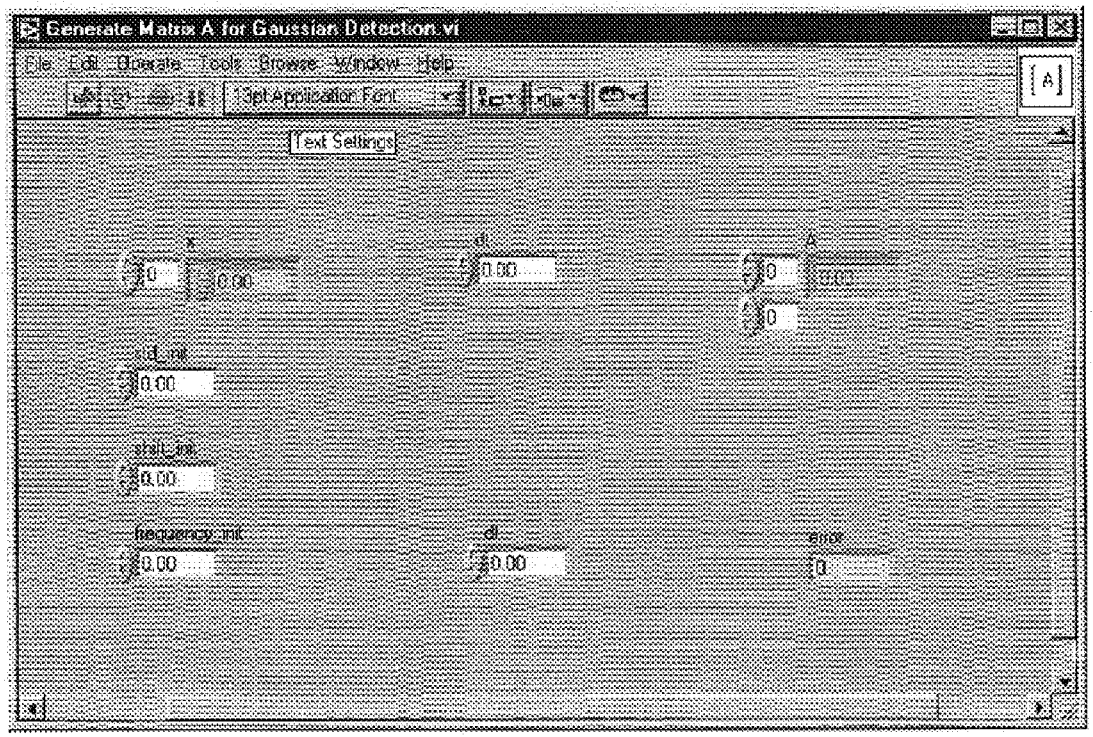
Figure 24B:
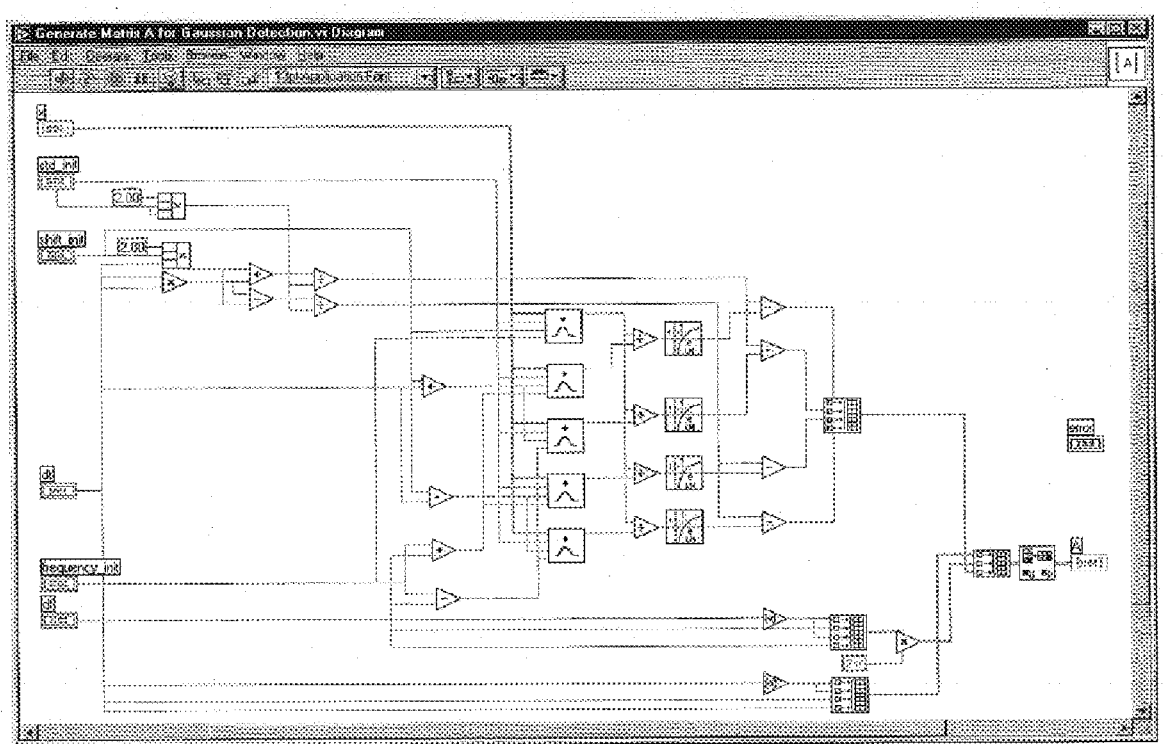

FIGS. 24A and 24B—Generate Matrix A for Gaussian Detection VI

FIGS. 24A and 24B illustrate a configuration panel and block diagram, respectively, for a Generate Matrix A for Gaussian Detection VI.

Figure 25A:
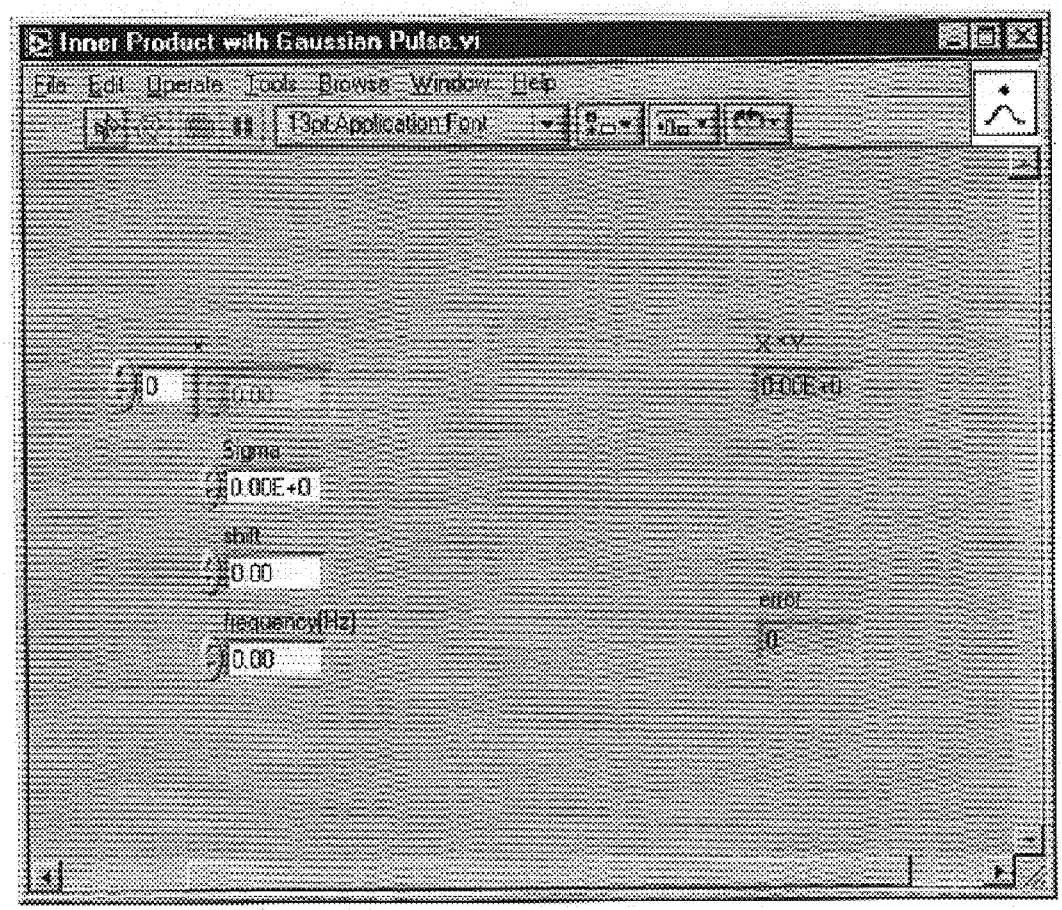
Figure 25B:
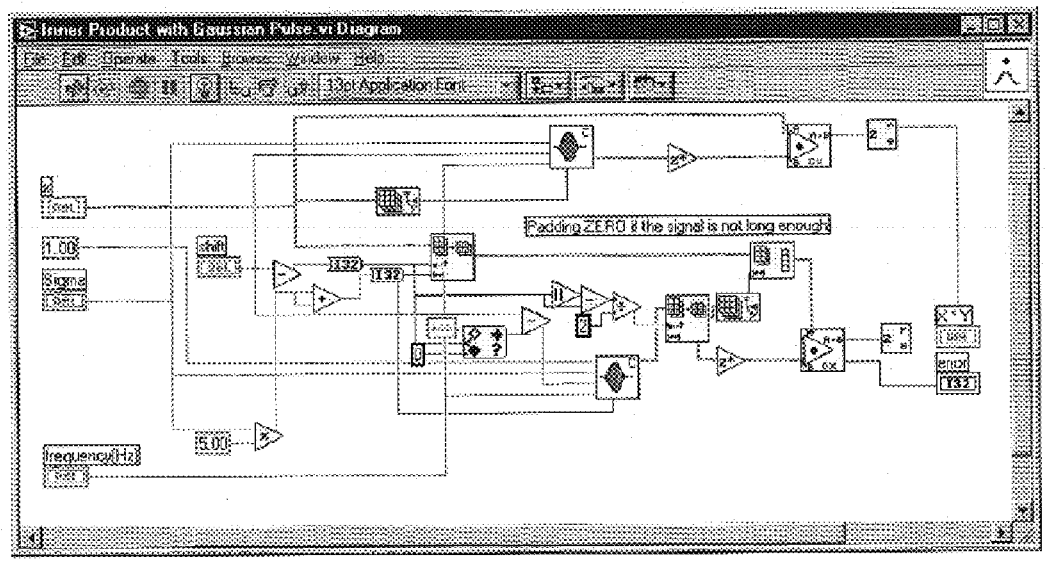

FIGS. 25A and 25B—Inner Product with Gaussian Pulse VI

FIGS. 25A and 25B illustrate a configuration panel and block diagram, respectively, for an Inner Product with Gaussian Pulse VI. The Inner Product with Gaussian Pulse VI computes an inner product between an input sequence and a specified Gaussian pulse.

Figure 26A:
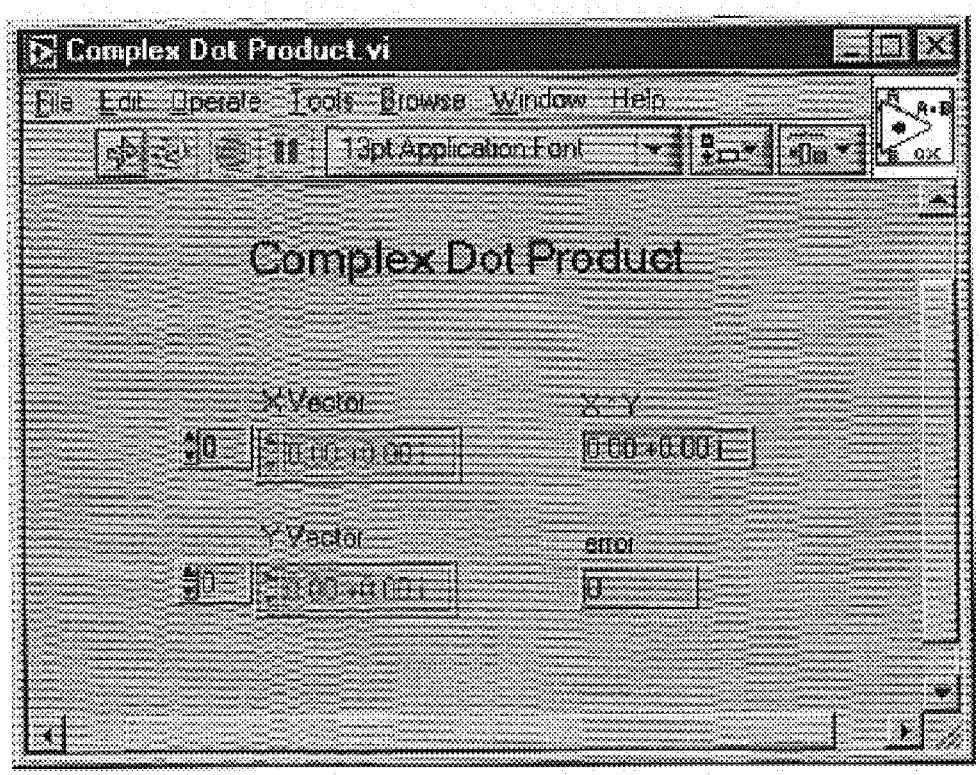
Figure 26B:
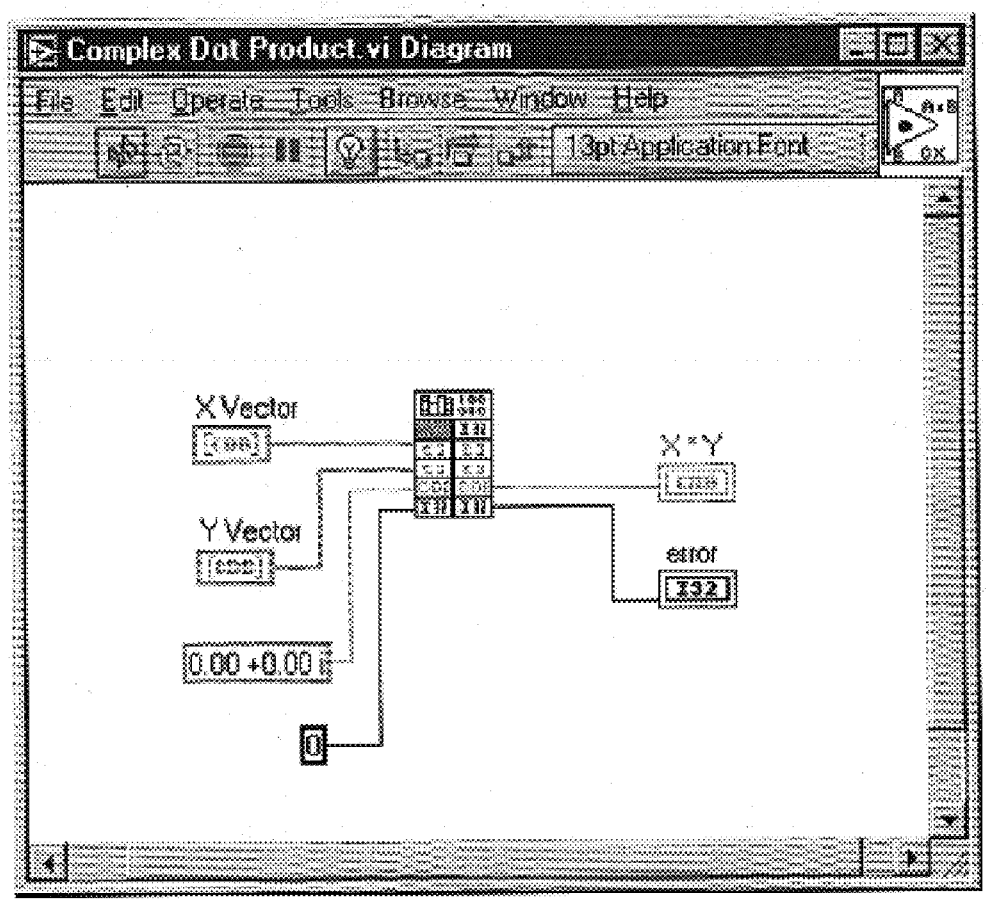

FIGS. 26A and 26B—Complex Dot Product VI

FIGS. 26A and 26B illustrate a configuration panel and block diagram, respectively, for a Complex Dot Product VI. The Complex Dot Product VI computes a complex dot product of complex vectors X and Y.

Figure 27A:
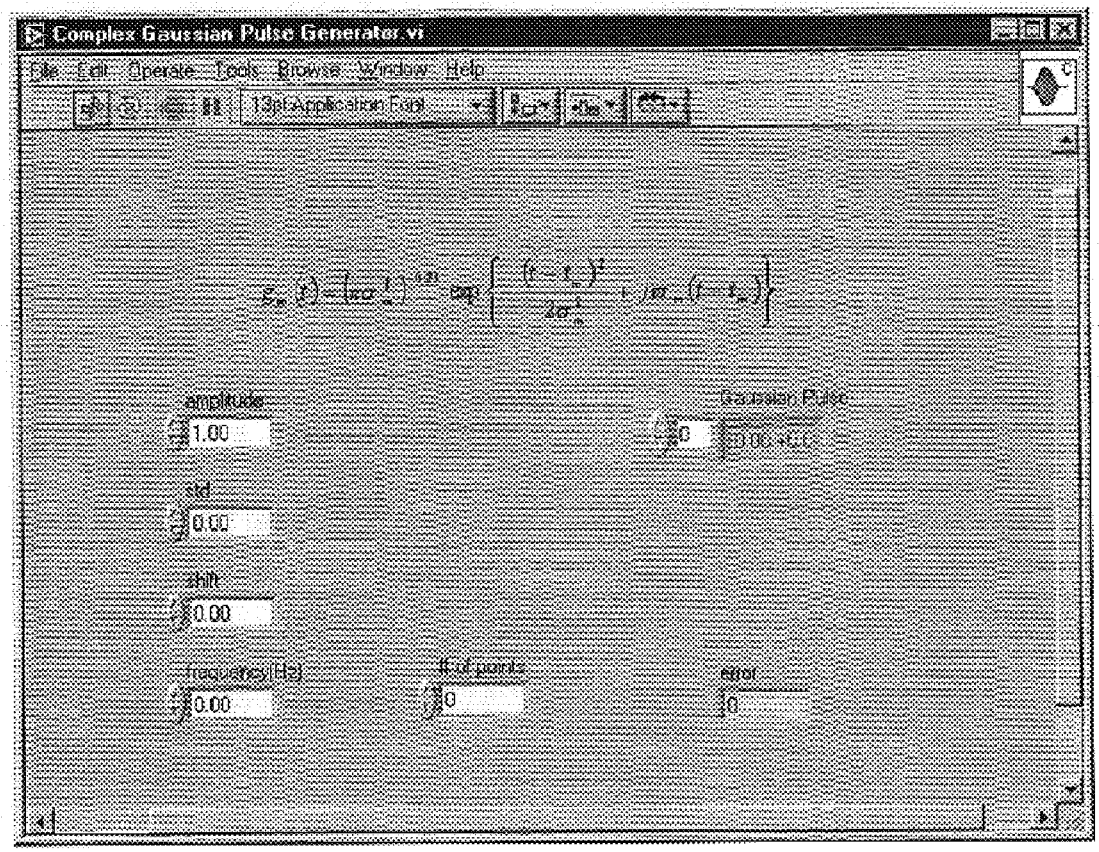
Figure 27B:
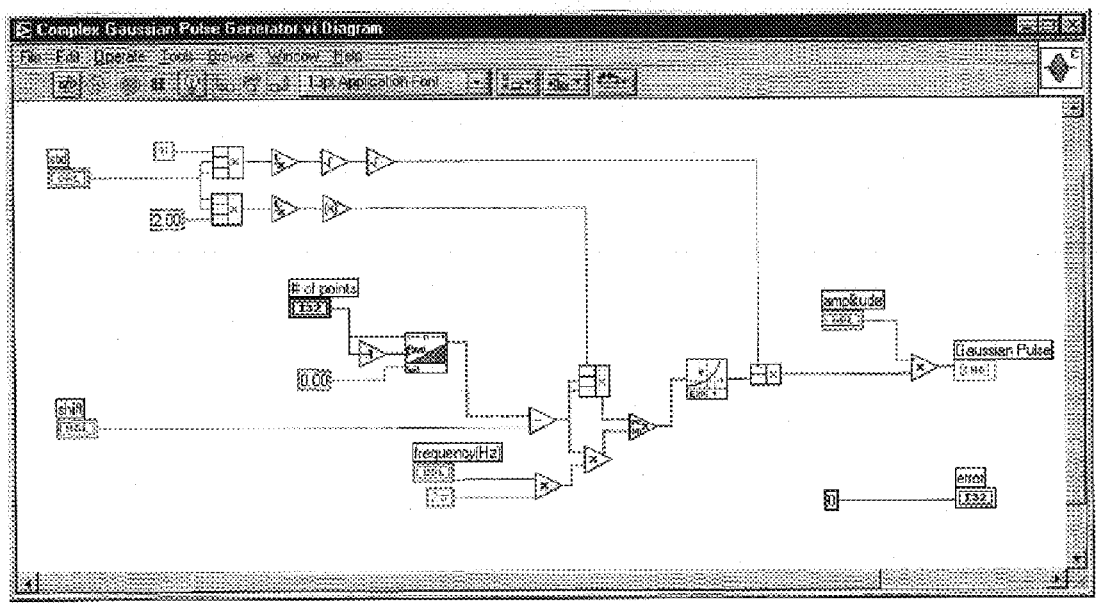

FIGS. 27A and 27B—Complex Gaussian Pulse Generator VI

FIGS. 27A and 27B illustrate a configuration panel and block diagram, respectively, for a Complex Gaussian Pulse Generator VI. The Complex Gaussian Pulse Generator VI generates a complex Gaussian pulse from specified characteristic parameters.

Figure 28A:
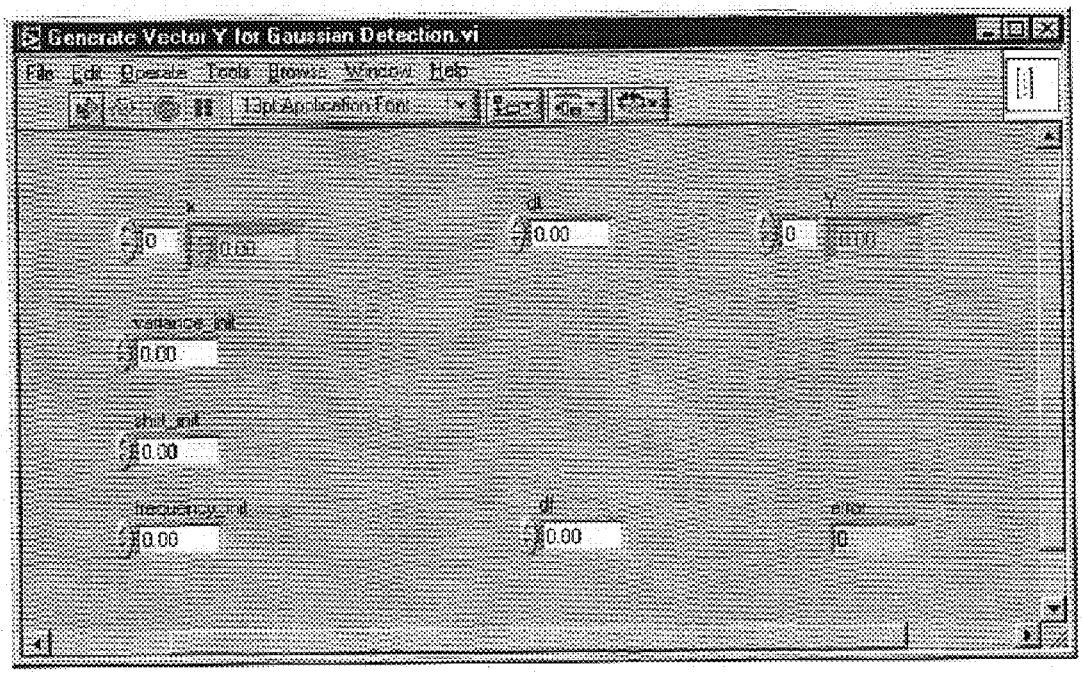
Figure 28B:
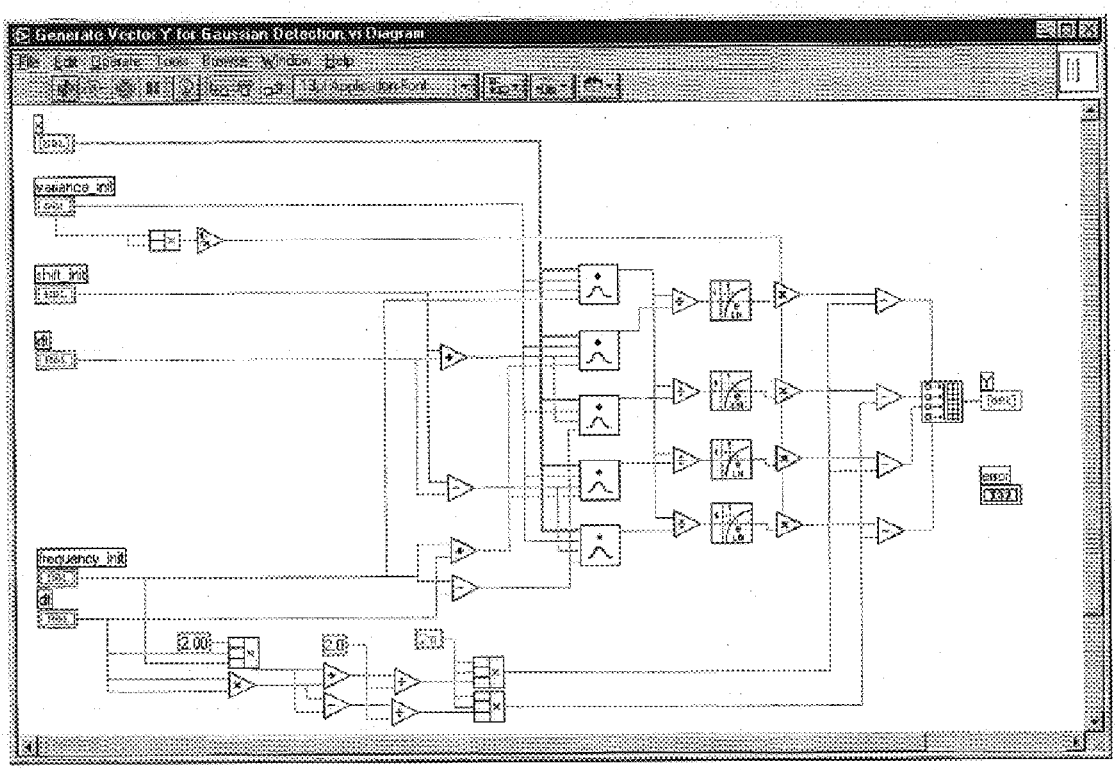

FIGS. 28A and 28B—Generate Vector Y for Gaussian Detection VI

FIGS. 27A and 27B illustrate a configuration panel and block diagram, respectively, for a Generate Vector Y for Gaussian Detection VI.

Figure 29A:
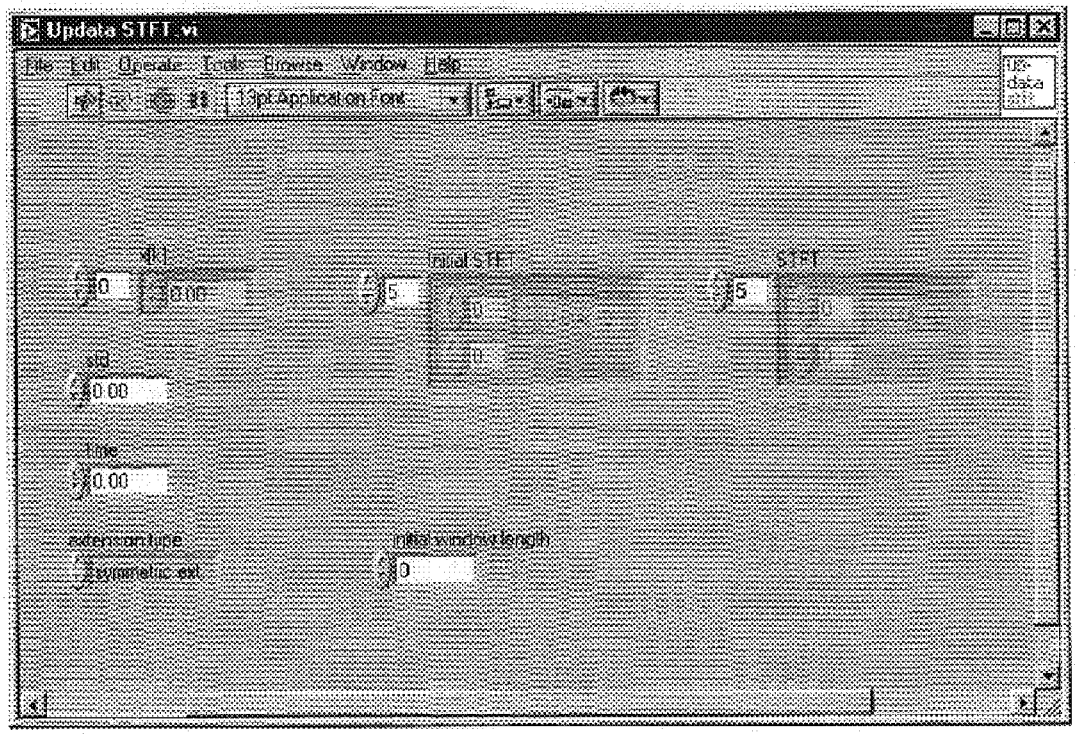
Figure 29B:
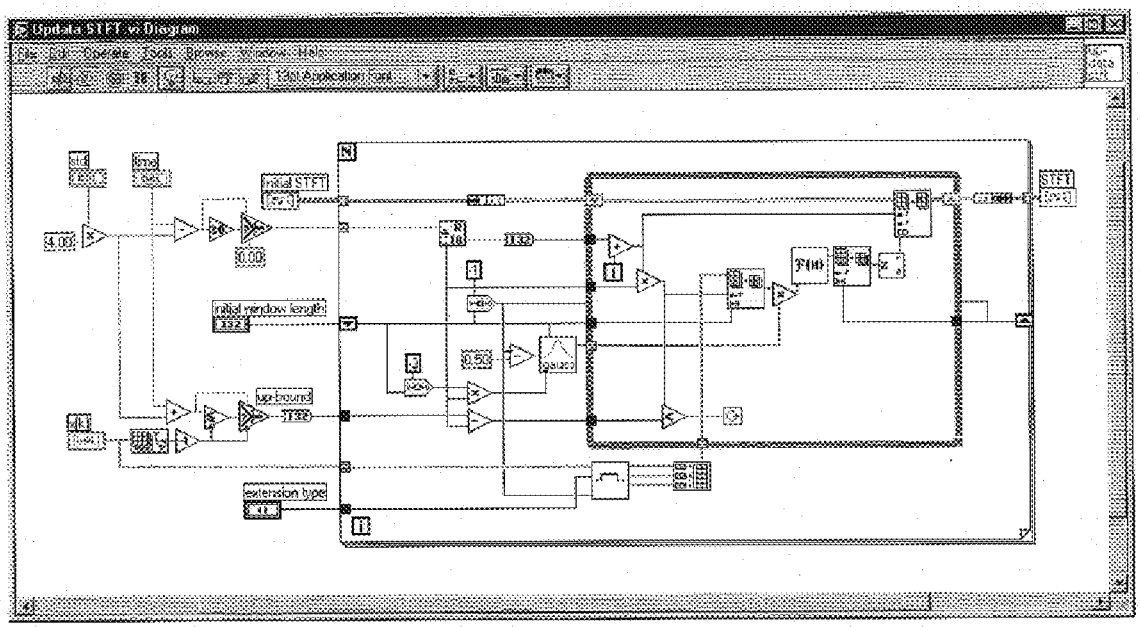

FIGS. 29A and 29B—Updata STFT VI

FIGS. 29A and 29B illustrate a configuration panel and block diagram, respectively, for an Updata STFT VI.

Figure 30A:
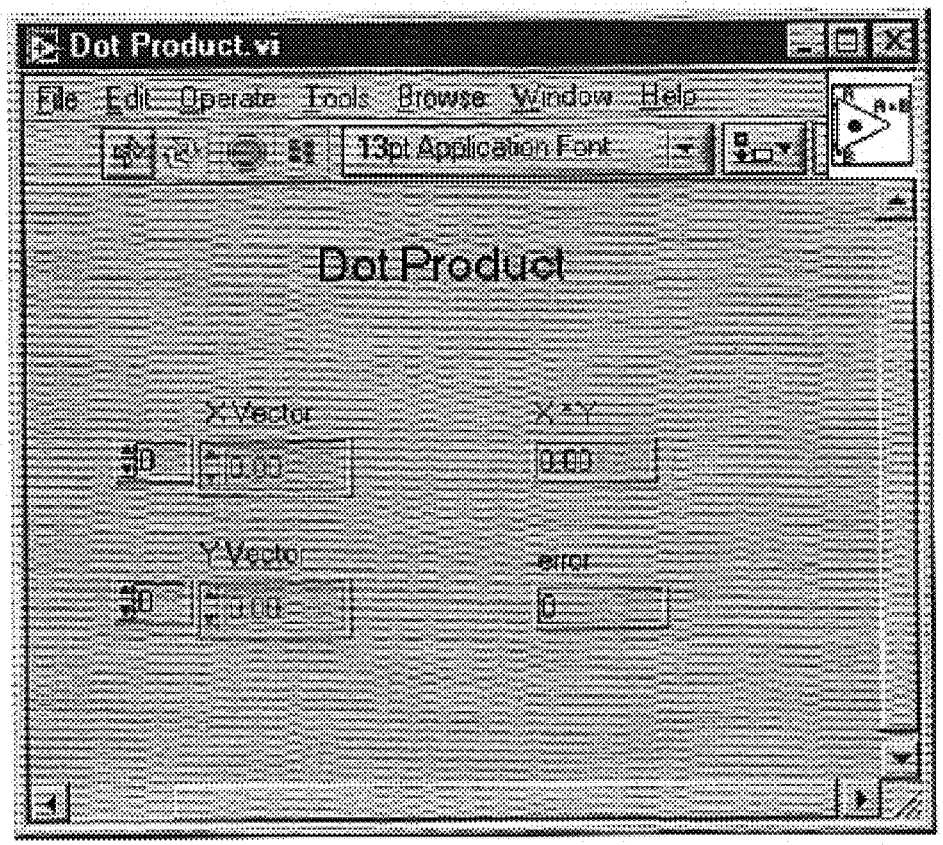
Figure 30B:
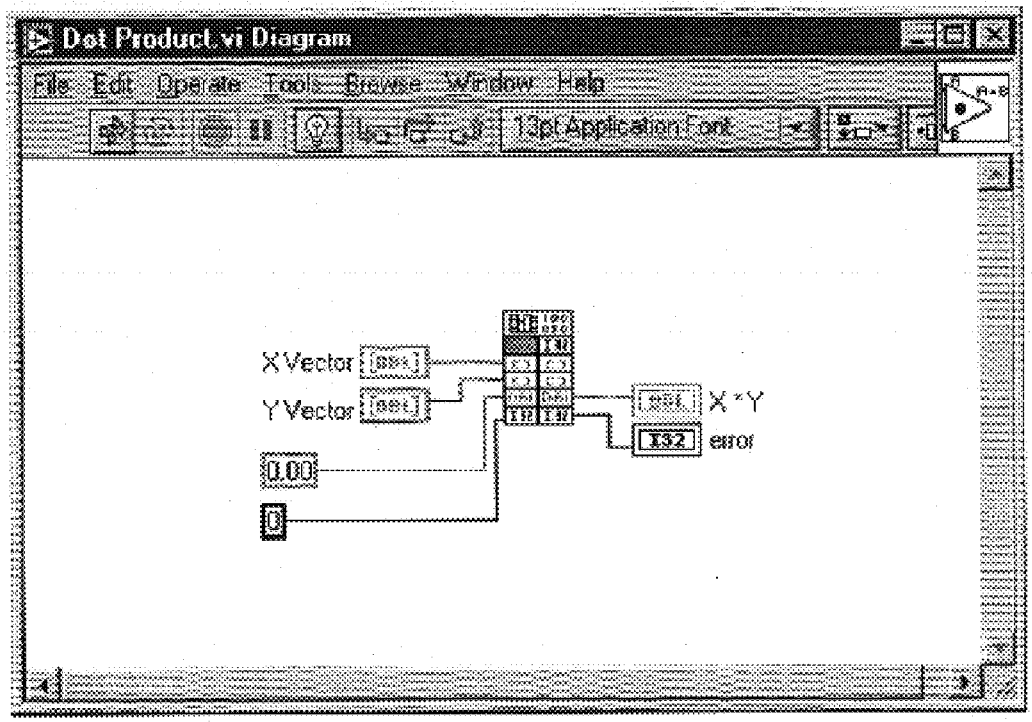

FIGS. 30A and 30B—Dot Product VI

FIGS. 30A and 30B illustrate a configuration panel and block diagram, respectively, for a Dot Product VI. The Dot Product VI computes the dot product of input vectors X and Y.

Figure 31A:
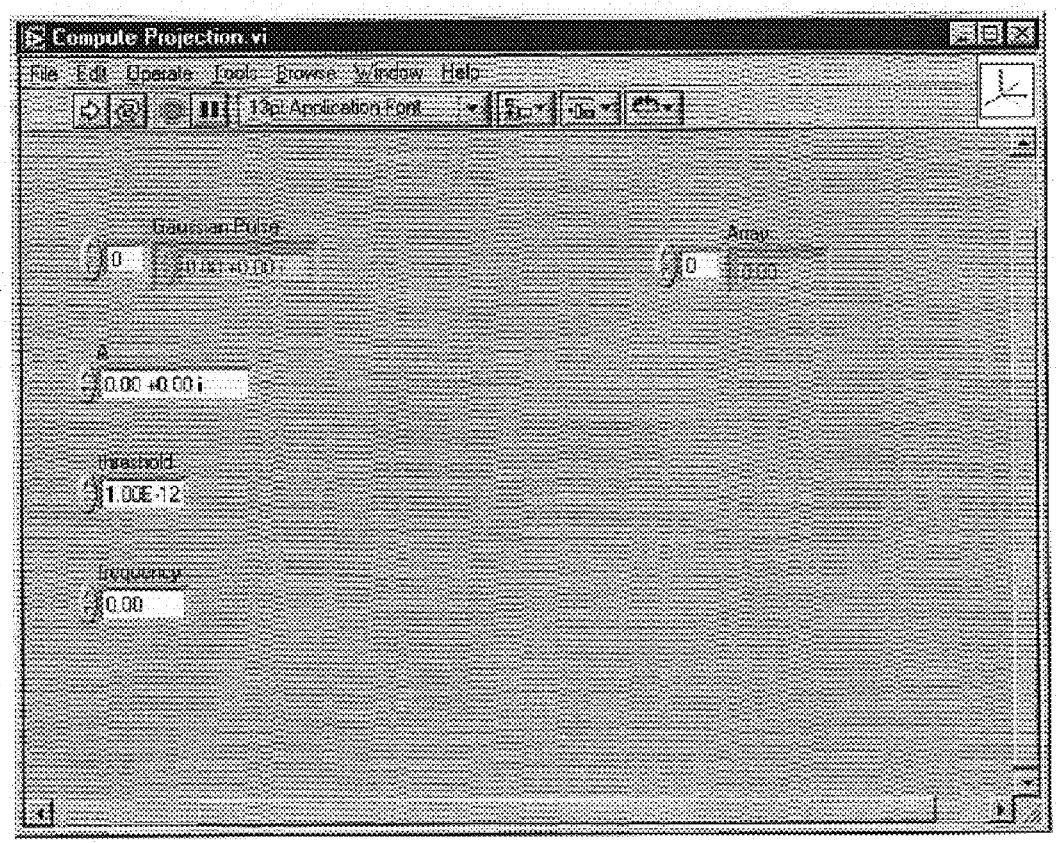
Figure 31B:
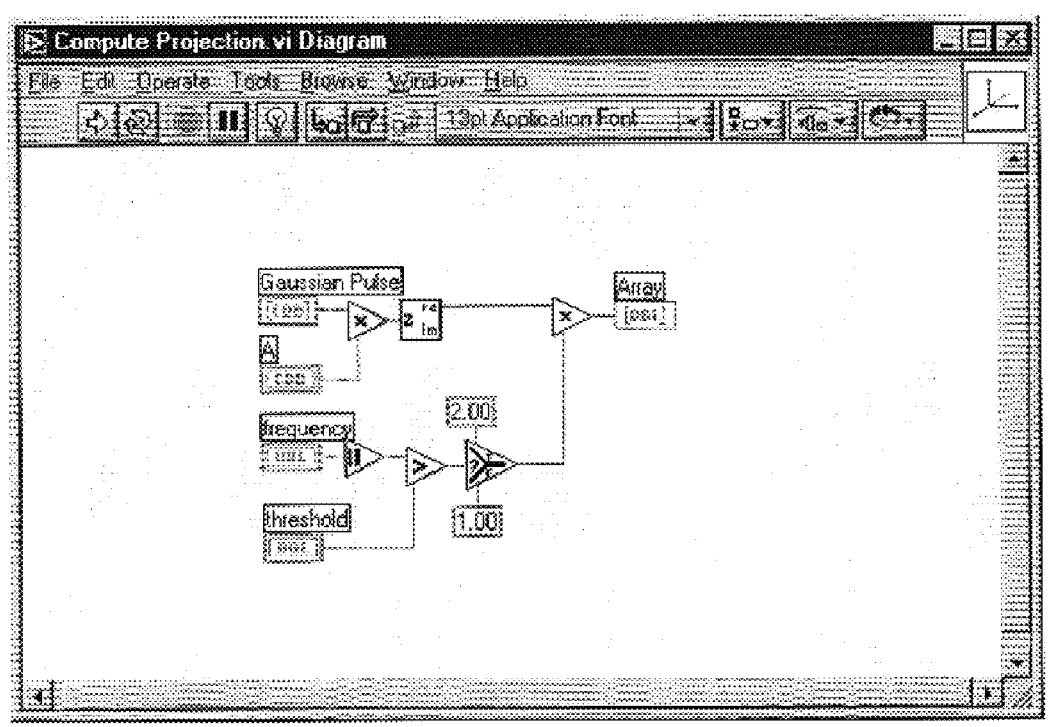

FIGS. 31A and 31B—Compute Projection VI

FIGS. 31A and 31B illustrate a configuration panel and block diagram, respectively, for a Compute Projection VI. The Compute Projection VI computes a projection of an input Gaussian pulse on a Gaussian Waveform basis vector.

Figure 32:
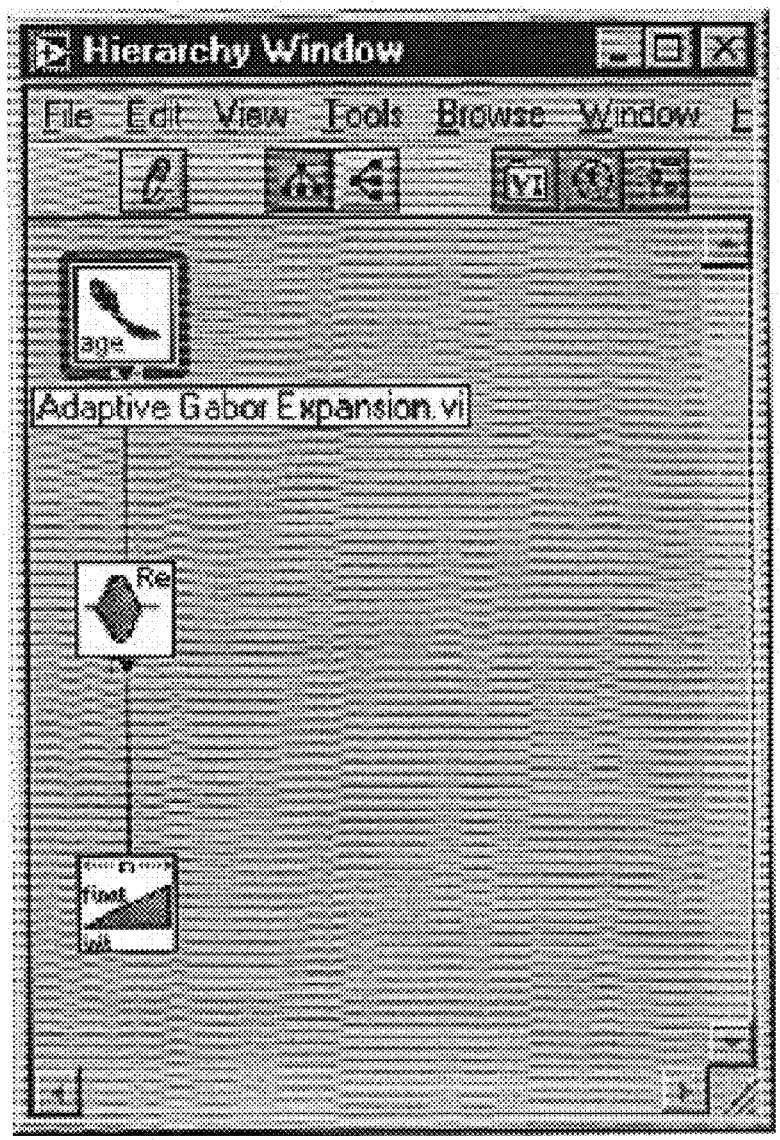
FIG. 32 illustrates a hierarchy of Virtual Instruments (VIs) included in an Adaptive Gabor Expansion VI of the system implementation of FIGS. 6A–31B.

FIG. 32—VI Hierarchy of the Adaptive Gabor Expansion VI

FIG. 32 illustrates the hierarchy of component VIs comprised in the Adaptive Gabor Expansion VI, described with reference to FIGS. 6A and 6B. As FIG. 32 shows, the Real Gaussian Pulse Generator VI described with reference to FIGS. 7A and 7B, and the Ramp Pattern VI described with reference to FIGS. 8A and 8B are component VIs of the Adaptive Gabor Expansion VI.

Figure 33:
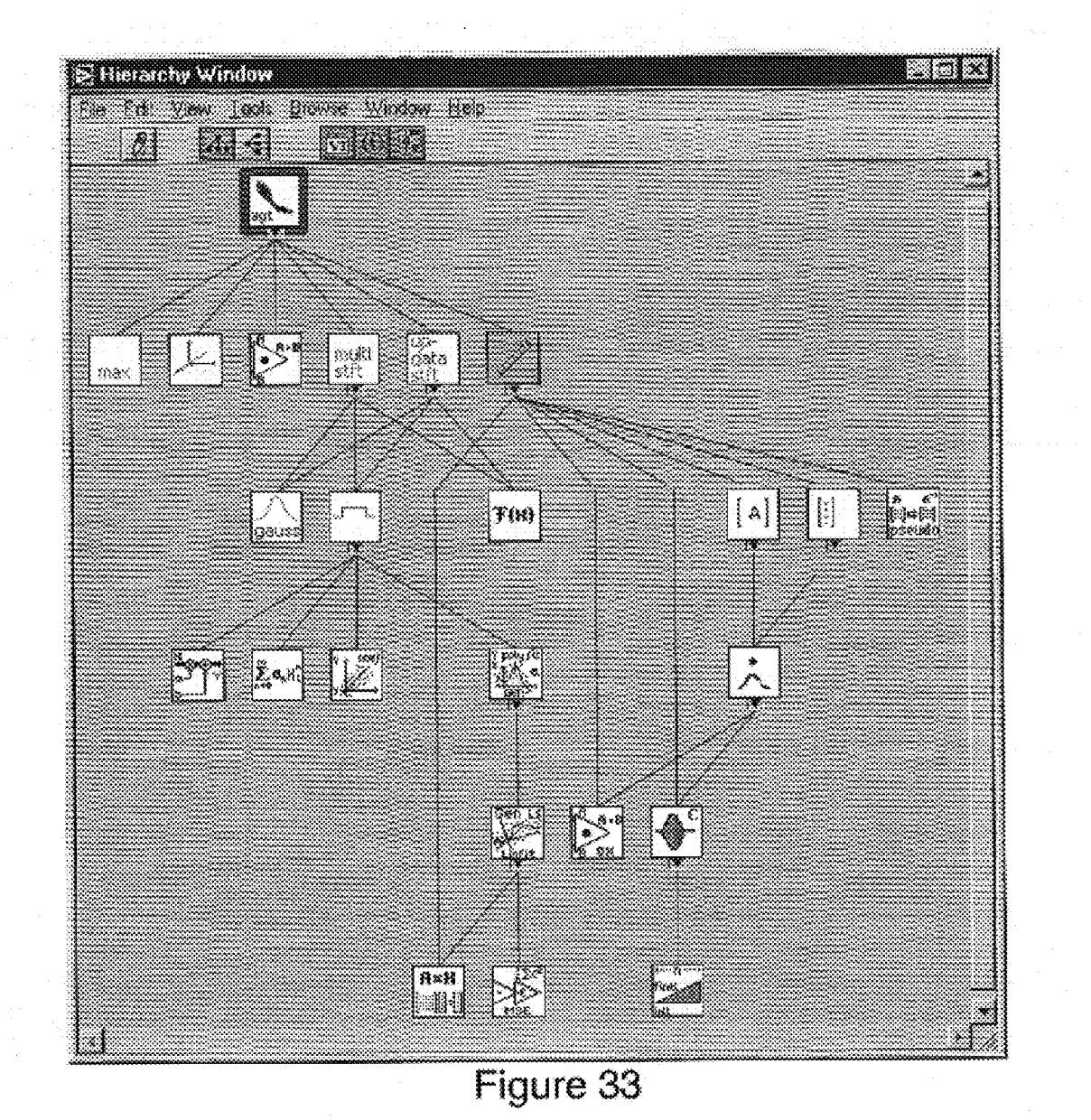

FIG. 33—VI Hierarchy of the Adaptive Gabor Transform VI

FIG. 32 illustrates the hierarchy of component VIs comprised in the Adaptive Gabor Transform VI, described with reference to FIGS. 9A and 9B. As FIG. 33 shows, the Adaptive Gabor Transform VI comprises a plurality of component VIs, specifically, the VIs described above with reference to FIGS. 10A–31B. It should be noted that some of the component VIs are sub-components, in that they are component VIs of a VI which is itself a component VI of the Adaptive Gabor Transform VI, and so on. In other words, the VI hierarchy has a depth greater than two.

EXAMPLE APPLICATIONS

In addition to the above-mentioned uses in the field of Time Domain Reflectometry, various embodiments of the above described system and method may be useful in analyzing an electroencephalogram (EEG), which is a record of the electrical activity of the brain made from electrodes placed on the scalp. The signal is extremely complex and reveals both rhythmical and transient features. One such feature is referred to as a "sleep spindle". The definition given in a classical reference states the following: "The presence of sleep spindle should not be defined unless it is at least 0.5s duration, i.e., one should be able to count six or seven distinct waves within the half-second period. ( . . . )The term should be used only to describe activity between 12 and 14 cps (cycles per second)."

Although intended for standardization of visual detection, the above definition is almost directly translatable into the time-frequency parameters of adaptive Gaussian functions. The shape of sleep spindles is so similar to Gaussian functions that one can assume a one-to-one relationship between sleep spindles and adaptive Gaussian functions fitted to EEG. Thus, embodiments of the present method may be used to detect and characterize sleep spindles in an EEG signal. Compared to other time-frequency representation schemes, embodiments of the present invention offer extra advantages: high resolution, fast computation, local adaptability to transient structures, and compatibility of its time-frequency parameters with definitions of EEG structures used in the traditional, visual analysis. The detection of sleep spindles is but one example of the use of the present method to analyze EEG signals.

Dr. Durka of the Laboratory of Medical Physics, Warsaw University, has said, "The computer revolution in EEG analysis still consists mainly of the fact that what was on paper now is watched at the monitor screen, mainly because the new signal processing methods were incompatible with knowledge about visual EEG analysis. Matching Pursuit (more specifically, the adaptive Gabor expansion) corresponds directly to the traditional way of analyzing EEG, namely visual analysis. For over 40 years of clinical practice, structures present in EEG being described in terms like 'cycles per second' or 'time width,' are directly interpretable in terms of time-frequency parameters. Matching Pursuit is one of the first methods that allow for direct utilization of huge amounts of knowledge collected over years of clinical EEG."

Thus, the above-described method may be used to detect, characterize, and analyze EEG data in a manner which is substantially more efficient and quantitatively more accurate than prior methods based on subjective visual inspection. It should be noted that the above applications are merely illustrative, and are not meant to limit the domains of use of various embodiments of the present invention.

Other applications of the described systems and methods include financial, stocks and bonds, and currency analysis, as well as medical and scientific data characterization and analysis. In other words, various embodiments of the present invention may be used to analyze any data sets or signals which include Gaussian waveforms, or approximations thereof.

Thus, the systems and methods presented above provide a fast and efficient approach to detecting and characterizing modulated Gaussian pulses in a noisy signal. Additionally, the systems and methods described provide an improved approach for performing Time Domain Reflectometry to analyze a Device Under Test using Gaussian pulses. Finally, the use of Gaussian pulses allows the above systems and methods to be implemented with a personal computer and relatively inexpensive components, granting substantial savings over prior systems (as much as 90%).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for characterizing a modulated Gaussian pulse in a signal, the method comprising:

receiving the signal, wherein the signal comprises a first sequence of values, and wherein the signal comprises the Gaussian pulse;

determining an estimation of N parameters of the Gaussian pulse, where N is greater than or equal to one, and wherein the estimation corresponds to an estimation waveform of the Gaussian pulse;

generating a plurality of permutations of the estimation of the N parameters, wherein the plurality of permutations comprise a corresponding plurality of parameter sets corresponding to a plurality of estimation waveforms;

generating a plurality of linear equations from the plurality of parameter sets, wherein each linear equation is a function of a respective one of the parameter sets and at least a subset of the N parameter variables of the Gaussian pulse; and determining the N parameter variables of the Gaussian pulse by solving the plurality of linear equations, wherein the determined parameters characterize the Gaussian pulse.

2. The method of claim 1, wherein said generating the plurality of linear equations from the plurality of parameter sets comprises:

generating a plurality of closed form inner products, wherein each closed form inner product is generated between the received signal and each estimation waveform; and generating the plurality of linear equations from the plurality of inner products, wherein each linear equation is a function of a respective one of the plurality of parameter sets and corresponding N parameter variables of the Gaussian pulse.

3. The method of claim 1, wherein said generating a plurality of permutations comprises generating M permutations of the estimation of the N parameters, and wherein the M permutations comprise M parameter sets corresponding to M estimation waveforms;

wherein said generating the plurality of linear equations comprises generating the plurality of linear equations from at least a subset of the M parameter sets, wherein each linear equation is a function of a respective one of the parameter sets and corresponding N parameter variables of the Gaussian pulse;

wherein said determining the N parameter variables of the Gaussian pulse comprises solving the plurality of linear equations, wherein the determined parameters characterize the Gaussian pulse.

4. The method of claim 3, wherein said generating the plurality of linear equations comprises generating at least M linear equations from the M parameter sets.

5. The method of claim 1, wherein said generating a plurality of permutations comprises generating M permutations of the estimation of the N parameters, and wherein the M permutations and the estimation comprise M+1 parameter sets corresponding to M+1 estimation waveforms;
wherein said generating a plurality of linear equations comprises generating M+1 linear equations from the M+1 parameter sets, wherein each linear equation is a function of a respective one of the parameter sets and corresponding N parameter variables of the Gaussian pulse;
wherein said determining the N parameter variables of the Gaussian pulse comprises solving the M+1 linear equations, wherein the determined parameters characterize the Gaussian pulse.

6. The method of claim 5, wherein said generating M+1 linear equations from the M+1 parameter sets comprises:
generating M+1 closed form inner products, wherein each closed form inner product is generated between the received signal and each estimation waveform; and
generating M+1 linear equations from the M+1 inner products, wherein each linear equation is a function of a respective one of the M+1 parameter sets and corresponding N parameter variables of the Gaussian pulse.

7. The method of claim 6, wherein M=N−1.

8. The method of claim 6, wherein M is greater than or equal to N, wherein said determining the N parameter variables comprises overdetermining the N parameter variables of the Gaussian pulse by solving the M+1 linear equations, and wherein the overdetermined parameters characterize the Gaussian pulse.

9. The method of claim 1, wherein said determining the estimation of N parameters of the Gaussian pulse comprises:
a) determining a current area of interest of the received signal, wherein the current area of interest comprises a second sequence of values which includes at least a portion of the first sequence of values, and wherein the current area of interest comprises a start position and an end position;
b) selecting a current Gaussian window from a plurality of Gaussian windows, wherein the current Gaussian window comprises a third sequence of values representing a Gaussian waveform;
c) performing a windowed Fast Fourier Transform (FFT) using the selected Gaussian window and the determined area of interest to generate a power spectrum;
d) identifying a peak frequency amplitude from the power spectrum;
e) repeating a) through d) in an iterative manner until each of the plurality of Gaussian windows has been selected, generating a plurality of peak frequency amplitudes;
f) identifying a maximum peak frequency amplitude from said plurality of peak frequency amplitudes; and
g) selecting an estimation Gaussian window from the plurality of Gaussian windows corresponding to said identified maximum peak frequency amplitude, wherein said estimation of N parameters of the Gaussian pulse are determined from the estimation Gaussian window.

10. The method of claim 9, wherein said performing a windowed Fast Fourier Transform (FFT) using the selected Gaussian window and the determined area of interest comprises:
logically aligning the Gaussian window at the start position of the area of interest, wherein a sub-sequence of the values comprised in the area of interest aligns with the third sequence of values comprised in the Gaussian window;
performing an element-wise multiplication of the third sequence of values and the sub-sequence of values to generate a product waveform; and
applying a Discrete Fourier Transform to the product waveform to generate the power spectrum.

11. The method of claim 9, wherein the respective lengths of the second sequence of values and the third sequence of values are each a power of two.

12. The method of claim 9, wherein the length of the second sequence of values is twice the length of the third sequence of values.

13. The method of claim 1, wherein N=3, and wherein the N parameters of the Gaussian pulse comprise inverse variance $\alpha_p$, time shift $t_p$, and carrier frequency $\omega_r$.

14. The method of claim 1, wherein the signal further comprises one or more additional Gaussian pulses, the method further comprising:
performing said receiving the signal, said determining an estimation of N parameters, said generating M permutations of the estimation of the N parameters, said generating M+1 closed form inner products, said generating M+1 linear equations from the M+1 inner products, and said overdetermining the N parameter variables, to characterize each of said one or more additional Gaussian pulses.

15. The method of claim 14, further comprising:
wherein said one or more additional Gaussian pulses comprise one or more reflected pulses generated by a Device Under Test (DUT) reflecting at least a portion of the modulated Gaussian pulse; and
wherein said determined parameters characterizing the Gaussian pulse and the one or more reflected Gaussian pulses are useable to characterize a connection discontinuity in the DUT.

16. The method of claim 15, further comprising:
analyzing said DUT to characterize one or more connection discontinuities using said characterized Gaussian pulse and said characterized one or more reflected Gaussian pulses.

17. A method for characterizing a modulated Gaussian pulse in a signal, the method comprising:
receiving the signal, wherein the signal comprises a first sequence of values, and wherein the signal comprises the Gaussian pulse;
determining an estimation of N parameters of the Gaussian pulse, where N is greater than or equal to one, and wherein the estimation corresponds to an estimation waveform of the Gaussian pulse;
generating M permutations of the estimation of the N parameters, wherein the M permutations and the estimation comprises M+1 parameter sets corresponding to M+1 estimation waveforms;
generating M+1 linear equations from the M+1 parameter sets, wherein each linear equation is a function of a respective one of the parameter sets and corresponding N parameter variables of the Gaussian pulse; and determining the N parameter variables of the Gaussian pulse by solving the M+1 linear equations, wherein the determined parameters characterize the Gaussian pulse.

18. The method of claim 17, wherein said generating M+1 linear equations from the M+1 parameter sets comprises:

generating M+1 closed form inner products, wherein each closed form inner product is generated between the received signal and each estimation waveform; and generating M+1 linear equations from the M+1 inner products, wherein each linear equation is a function of a respective one of the M+1 parameter sets and corresponding N parameter variables of the Gaussian pulse.

19. A system for characterizing a modulated Gaussian pulse in a signal, the system comprising:

a computer, wherein the computer comprises a CPU and a memory, wherein the memory is operable to store one or more software programs, and wherein the CPU is operable to execute the one or more software programs; and an input for receiving the signal, wherein the signal comprises a first sequence of values;

wherein said one or more software programs are executable to perform:

determining an estimation of N parameters of the Gaussian pulse in the signal, where N is greater than or equal to one, and wherein the estimation corresponds to an estimation waveform of the Gaussian pulse;

generating a plurality of permutations of the estimation of the N parameters, wherein the plurality of permutations comprises a corresponding plurality of parameter sets corresponding to a plurality of estimation waveforms;

generating a plurality of linear equations from the plurality of parameter sets, wherein each linear equation is a function of a respective one of the parameter sets and at least a subset of the N parameter variables of the Gaussian pulse; and determining the N parameter variables of the Gaussian pulse by solving the plurality of linear equations, wherein the determined parameters characterize the Gaussian pulse.

20. The system of claim 19, wherein said generating the plurality of linear equations from the plurality of parameter sets comprises:

generating a plurality of closed form inner products, wherein each closed form inner product is generated between the received signal and each estimation waveform; and generating the plurality of linear equations from the plurality of inner products, wherein each linear equation is a function of a respective one of the plurality of parameter sets and corresponding N parameter variables of the Gaussian pulse.

21. The system of claim 19, wherein said generating a plurality of permutations comprises generating M permutations of the estimation of the N parameters, and wherein the M permutations comprise M parameter sets corresponding to M estimation waveforms;

wherein said generating the plurality of linear equations comprises generating the plurality of linear equations from at least a subset of the M parameter sets, wherein each linear equation is a function of a respective one of the parameter sets and corresponding N parameter variables of the Gaussian pulse;

wherein said determining the N parameter variables of the Gaussian pulse comprises solving the plurality of linear equations, wherein the determined parameters characterize the Gaussian pulse.

22. The system of claim 21, wherein said generating the plurality of linear equations comprises generating at least M linear equations from the M parameter sets.

23. The system of claim 19, wherein said generating a plurality of permutations comprises generating M permutations of the estimation of the N parameters, and wherein the M permutations and the estimation comprises M+1 parameter sets corresponding to M+1 estimation waveforms;

wherein said generating a plurality of linear equations comprises generating M+1 linear equations from the M+1 parameter sets, wherein each linear equation is a function of a respective one of the parameter sets and corresponding N parameter variables of the Gaussian pulse;

wherein said determining the N parameter variables of the Gaussian pulse comprises solving the M+1 linear equations, wherein the determined parameters characterize the Gaussian pulse.

24. The system of claim 19, wherein said generating M+1 linear equations from the M+1 parameter sets comprises:

generating M+1 closed form inner products, wherein each closed form inner product is generated between the received signal and each estimation waveform; and generating M+1 linear equations from the M+1 inner products, wherein each linear equation is a function of a respective one of the M+1 parameter sets and corresponding N parameter variables of the Gaussian pulse.

25. The system of claim 19, wherein M is greater than or equal to N, wherein said determining the N parameter variables comprises overdetermining the N parameter variables of the Gaussian pulse by solving the M+1 linear equations, and wherein the respective overdetermined parameters characterize the Gaussian pulse.

26. The system of claim 19, wherein said determining the estimation of N parameters of the Gaussian pulse comprises:

a) determining a current area of interest of the received signal, wherein the current area of interest comprises a second sequence of values which includes at least a portion of the first sequence of values, and wherein the current area of interest comprises a start position and an end position;

b) selecting a current Gaussian window from a plurality of Gaussian windows, wherein the current Gaussian window comprises a third sequence of values representing a Gaussian waveform;

c) performing a windowed Fast Fourier Transform (FFT) using the selected Gaussian window and the determined area of interest to generate a power spectrum;

d) identifying a peak frequency amplitude from the power spectrum;

e) repeating a) through d) in an iterative manner until each of the plurality of Gaussian windows has been selected, generating a plurality of peak frequency amplitudes;

f) identifying a maximum peak frequency amplitude from said plurality of peak frequency amplitudes; and g) selecting an estimation Gaussian window from the plurality of Gaussian windows corresponding to said identified maximum peak frequency amplitude, wherein said estimation of N parameters of the Gaussian pulse are determined from the estimation Gaussian window.

27. The system of claim 26, wherein said performing a windowed Fast Fourier Transform (FFT) using the selected Gaussian window and the determined area of interest comprises:
  logically aligning the Gaussian window at the start position of the area of interest, wherein a sub-sequence of the values comprised in the area of interest aligns with the third sequence of values comprised in the Gaussian window;
  performing an element-wise multiplication of the third sequence of values and the sub-sequence of values to generate a product waveform; and
  applying a Discrete Fourier Transform to the product waveform to generate the power spectrum.

28. The system of claim 19, wherein the system further comprises a display coupled to the computer, wherein the display is operable to present visual information to a user related to said Gaussian pulse.

29. The system of claim 19, wherein the signal comprises additional Gaussian pulses, and wherein said receiving the signal, said determining an estimation, said generating M permutations of the estimation, said generating M+1 linear equations, and said determining the N parameter variables are applied to each of the addition Gaussian pulses to characterize said additional Gaussian pulses.

30. The system of claim 29, wherein the system comprises a Time Domain Reflectometry system, wherein said additional Gaussian pulses comprise one or more reflected pulses from a Device Under Test (DUT); and
  wherein said determined parameters characterizing the Gaussian pulse and the one or more reflected Gaussian pulses are useable to characterize a connection discontinuity in the DUT.

31. A system for characterizing a modulated Gaussian pulse in a signal, the system comprising:
  a computer, wherein the computer comprises a CPU and a memory, wherein the memory is operable to store one or more software programs, and wherein the CPU is operable to execute the one or more software programs; and
  an input for receiving the signal, wherein the signal comprises a first sequence of values;
  wherein said one or more software programs are executable to perform:
    determining an estimation of N parameters for the Gaussian pulse in the signal, wherein N is greater than or equal to one;
    generating M permutations of the estimation of the N parameters, wherein the M permutations and the estimation comprise M+1 parameter sets corresponding to M+1 estimation waveforms;
    generating M+1 linear equations from the M+1 parameter sets, wherein each linear equation is a function of a respective one of the parameter sets and corresponding N parameter variables for the Gaussian pulse; and
    determining the N parameter variables of the Gaussian pulse by solving the M+1 linear equations, wherein the determined parameters characterize the Gaussian pulse.

32. The system of claim 31, wherein said generating M+1 linear equations from the M+1 parameter sets comprises:
  generating M+1 closed form inner products, wherein each closed form inner product is generated between the received signal and each estimation waveform; and
  generating M+1 linear equations from the M+1 inner products, wherein each linear equation is a function of a respective one of the M+1 parameter sets and corresponding N parameter variables of the Gaussian pulse.

33. The system of claim 31, wherein M is greater than or equal to N, wherein said determining the N parameter variables comprises overdetermining the N parameter variables of the Gaussian pulse by solving the M+1 linear equations, and wherein the respective overdetermined parameters characterize the Gaussian pulse.

34. A memory medium operable to store program instructions to analyze a signal, wherein the signal comprises a first sequence of values, and wherein the signal comprises the Gaussian pulse, wherein the program instructions are executable to perform:
  determining an estimation of N parameters of the Gaussian pulse, where N is greater than or equal to one, and wherein the estimation corresponds to an estimation waveform of the Gaussian pulse;
  generating a plurality of permutations of the estimation of the N parameters, wherein the plurality of permutations comprises a corresponding plurality of parameter sets corresponding to a plurality of estimation waveforms;
  generating a plurality of linear equations from the plurality of parameter sets, wherein each linear equation is a function of a respective one of the parameter sets and at least a subset of the N parameter variables of the Gaussian pulse; and
  determining the N parameter variables of the Gaussian pulse by solving the plurality of linear equations, wherein the determined parameters characterize the Gaussian pulse.

35. The memory medium of claim 34, wherein said generating the plurality of linear equations from the plurality of parameter sets comprises:
  generating a plurality of closed form inner products, wherein each closed form inner product is generated between the received signal and each estimation waveform; and
  generating the plurality of linear equations from the plurality of inner products, wherein each linear equation is a function of a respective one of the plurality of parameter sets and corresponding N parameter variables of the Gaussian pulse.

36. The memory medium of claim 34,
  wherein said generating a plurality of permutations comprises generating M permutations of the estimation of the N parameters, and wherein the M permutations comprise M parameter sets corresponding to M estimation waveforms;
  wherein said generating the plurality of linear equations comprises generating the plurality of linear equations from at least a subset of the M parameter sets, wherein each linear equation is a function of a respective one of the parameter sets and corresponding N parameter variables of the Gaussian pulse;
  wherein said determining the N parameter variables of the Gaussian pulse comprises solving the plurality of linear equations, wherein the determined parameters characterize the Gaussian pulse.

37. The memory medium of claim 36,
  wherein said generating the plurality of linear equations comprises generating at least M linear equations from the M parameter sets.

38. The memory medium of claim 34,
  wherein said generating a plurality of permutations comprises generating M permutations of the estimation of the N parameters, and wherein the M permutations and the estimation comprises M+1 parameter sets corresponding to M+1 estimation waveforms;

wherein said generating a plurality of linear equations comprises generating M+1 linear equations from the M+1 parameter sets, wherein each linear equation is a function of a respective one of the parameter sets and corresponding N parameter variables of the Gaussian pulse;

wherein said determining the N parameter variables of the Gaussian pulse comprises solving the M+1 linear equations, wherein the determined parameters characterize the Gaussian pulse.

39. The memory medium of claim 34, wherein said generating M+1 linear equations from the M+1 parameter sets comprises:

generating M+1 closed form inner products, wherein each closed form inner product is generated between the received signal and each estimation waveform; and generating M+1 linear equations from the M+1 inner products, wherein each linear equation is a function of a respective one of the M+1 parameter sets and corresponding N parameter variables of the Gaussian pulse.

40. The memory medium of claim 34, wherein M is greater than or equal to N, wherein said determining the N parameter variables comprises overdetermining the N parameter variables of the Gaussian pulse by solving the M+1 linear equations, and wherein the overdetermined parameters characterize the Gaussian pulse.

41. The memory medium of claim 34, wherein said determining the estimation of N parameters of the Gaussian pulse comprises:

a) determining a current area of interest of the received signal, wherein the current area of interest comprises a second sequence of values which includes at least a portion of the first sequence of values, and wherein the current area of interest comprises a start position and an end position;

b) selecting a current Gaussian window from a plurality of Gaussian windows, wherein the current Gaussian window comprises a third sequence of values representing a Gaussian waveform;

c) performing a windowed Fast Fourier Transform (FFT) using the selected Gaussian window and the determined area of interest to generate a power spectrum;

d) identifying a peak frequency amplitude from the power spectrum;

e) repeating a) through d) in an iterative manner until each of the plurality of Gaussian windows has been selected, generating a plurality of peak frequency amplitudes;

f) identifying a maximum peak frequency amplitude from said plurality of peak frequency amplitudes; and g) selecting an estimation Gaussian window from the plurality of Gaussian windows corresponding to said identified maximum peak frequency amplitude, wherein said estimation of N parameters of the Gaussian pulse are determined from the estimation Gaussian window.

42. The memory medium of claim 41, wherein said performing a windowed Fast Fourier Transform (FFT) using the selected Gaussian window and the determined area of interest comprises:

logically aligning the Gaussian window at the start position of the area of interest, wherein a sub-sequence of the values comprised in the area of interest aligns with the third sequence of values comprised in the Gaussian window;

performing an element-wise multiplication of the third sequence of values and the sub-sequence of values to generate a product waveform; and applying a Discrete Fourier Transform to the product waveform to generate the power spectrum.

43. The memory medium of claim 41, wherein the respective lengths of the second sequence of values and the third sequence of values are each a power of two.

44. The memory medium of claim 41, wherein the length of the second sequence of values is twice the length of the third sequence of values.

45. The memory medium of claim 34, wherein N=3, and wherein the N parameters of the Gaussian pulse comprise inverse variance $\alpha_p$, time shift $t_p$, and carrier frequency $\omega_r$.

46. A memory medium operable to store program instructions to analyze a signal, wherein the signal comprises a first sequence of values, wherein the signal comprises a modulated Gaussian pulse, wherein the program instructions are executable to perform:

determining an estimation of N parameters of the Gaussian pulse in the signal, where N is greater than or equal to one, and wherein the estimation corresponds to an estimation waveform of the Gaussian pulse;

generating M permutations of the estimation of the N parameters, wherein the M permutations and the estimation comprise M+1 parameter sets corresponding to M+1 estimation waveforms;

generating M+1 linear equations from the M+1 parameter sets, wherein each linear equation is a function of a respective one of the parameter sets and corresponding N parameter variables of the Gaussian pulse; and determining the N parameter variables of the Gaussian pulse by solving the M+1 linear equations, wherein the determined parameters characterize the Gaussian pulse.

47. The memory medium of claim 46, wherein said generating M+1 linear equations from the M+1 parameter sets comprises:

generating M+1 closed form inner products, wherein each closed form inner product is generated between the received signal and each estimation waveform; and generating M+1 linear equations from the M+1 inner products, wherein each linear equation is a function of a respective one of the M+1 parameter sets and corresponding N parameter variables of the Gaussian pulse.

48. The memory medium of claim 46, wherein M is greater than or equal to N, wherein said determining the N parameter variables comprises overdetermining the N parameter variables of the Gaussian pulse by solving the M+1 linear equations, and wherein the overdetermined parameters characterize the Gaussian pulse.

* * * * *